United States Patent
Fan

(10) Patent No.: US 8,773,562 B1
(45) Date of Patent: Jul. 8, 2014

(54) VERTICALLY STACKED IMAGE SENSOR

(71) Applicant: Apple Inc., Cupertino, CA (US)

(72) Inventor: Xiaofeng Fan, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/756,459

(22) Filed: Jan. 31, 2013

(51) Int. Cl.
- *H04N 5/335* (2011.01)
- *H04N 3/14* (2006.01)
- *H01L 27/00* (2006.01)

(52) U.S. Cl.
USPC ............ 348/308; 257/E27.135; 257/E25.006; 250/208.1

(58) Field of Classification Search
USPC ................... 348/308; 257/E27.135, E25.006; 250/208.1
See application file for complete search history.

(56) References Cited

U.S. PATENT DOCUMENTS

| | | | |
|---|---|---|---|
| 5,506,429 | A | 4/1996 | Tanaka et al. |
| 7,561,390 | B2 * | 7/2009 | Furuta ............................. 361/56 |
| 7,671,435 | B2 | 3/2010 | Ahn |
| 7,858,915 | B2 | 12/2010 | McCarten |
| 8,049,256 | B2 | 11/2011 | Guidash |
| 8,310,003 | B2 | 11/2012 | Kohyama |
| 8,478,123 | B2 | 7/2013 | Cao et al. |
| 8,531,567 | B2 | 9/2013 | Roy et al. |
| 2003/0049925 | A1 * | 3/2003 | Layman et al. ................ 438/614 |
| 2009/0159944 | A1 * | 6/2009 | Oh ................................ 257/292 |
| 2010/0019130 | A1 * | 1/2010 | Lee ............................. 250/208.1 |
| 2010/0258890 | A1 * | 10/2010 | Ahn ............................... 257/432 |
| 2010/0276572 | A1 * | 11/2010 | Iwabuchi et al. ........... 250/208.1 |
| 2011/0042552 | A1 | 2/2011 | Furuya et al. |
| 2011/0157445 | A1 * | 6/2011 | Itonaga et al. ................ 348/308 |
| 2011/0315854 | A1 * | 12/2011 | Janesick ..................... 250/208.1 |
| 2012/0086845 | A1 | 4/2012 | Enomoto et al. |
| 2012/0217374 | A1 * | 8/2012 | Nishizawa .................. 250/208.1 |
| 2013/0062504 | A1 * | 3/2013 | Sukegawa et al. .......... 250/208.1 |

FOREIGN PATENT DOCUMENTS

| | | |
|---|---|---|
| EP | 1562233 | 8/2005 |
| WO | WO 2013/118646 | 8/2013 |

OTHER PUBLICATIONS

Invitation to Pay Additional Fees dated Apr. 1, 2014, PCT/US2014/011682, 5 pages.

* cited by examiner

*Primary Examiner* — Sinh Tran
*Assistant Examiner* — Shahbaz Nazrul
(74) *Attorney, Agent, or Firm* — Brownstein Hyatt Farber Schreck, LLP

(57) ABSTRACT

A vertically stacked image sensor having a photodiode chip and a transistor array chip. The photodiode chip includes at least one photodiode and a transfer gate extends vertically from a top surface of the photodiode chip. The image sensor further includes a transistor array chip stacked on top of the photodiode chip. The transistor array chip includes the control circuitry and storage nodes. The image sensor further includes a logic chip vertically stacked on the transistor array chip. The transfer gate communicates data from the at least one photodiode to the transistor array chip and the logic chip selectively activates the vertical transfer gate, the reset gate, the source follower gate, and the row select gate.

14 Claims, 35 Drawing Sheets

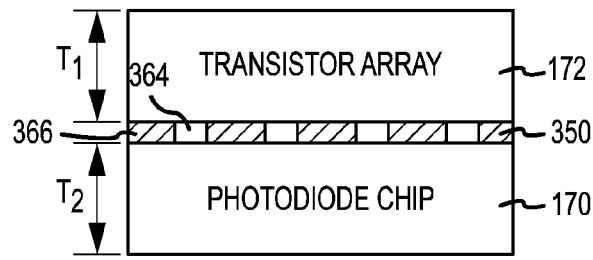
FIG.19A
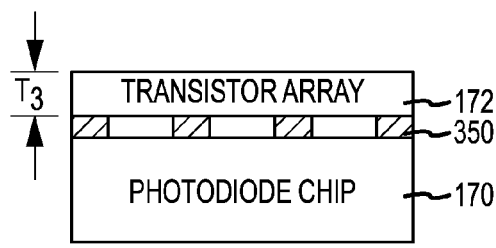
FIG.19B
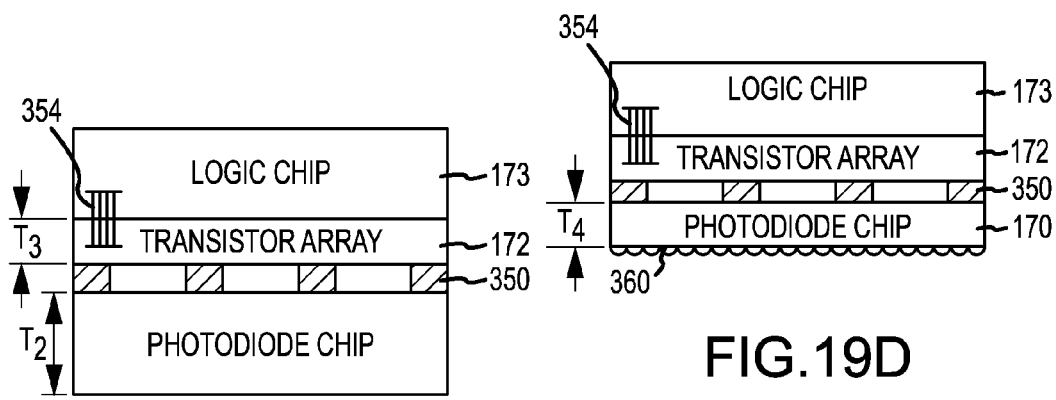
FIG.19C
FIG.19D

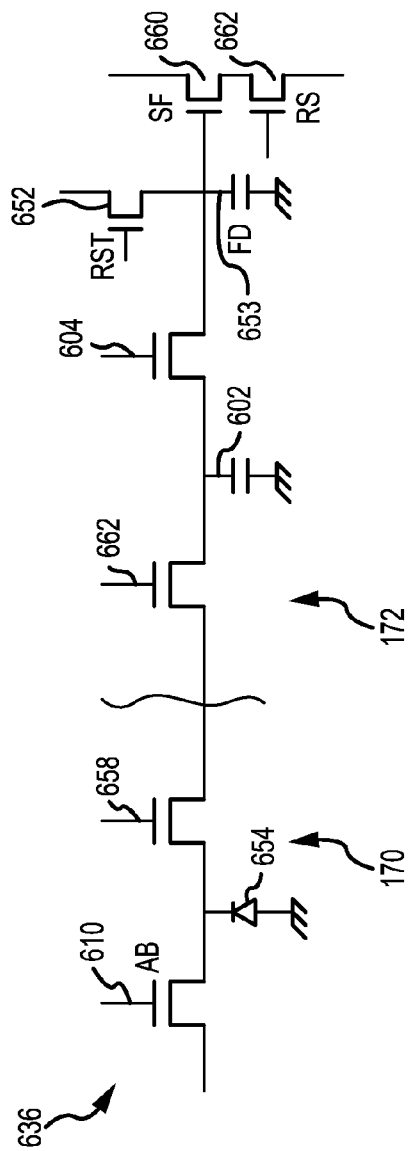
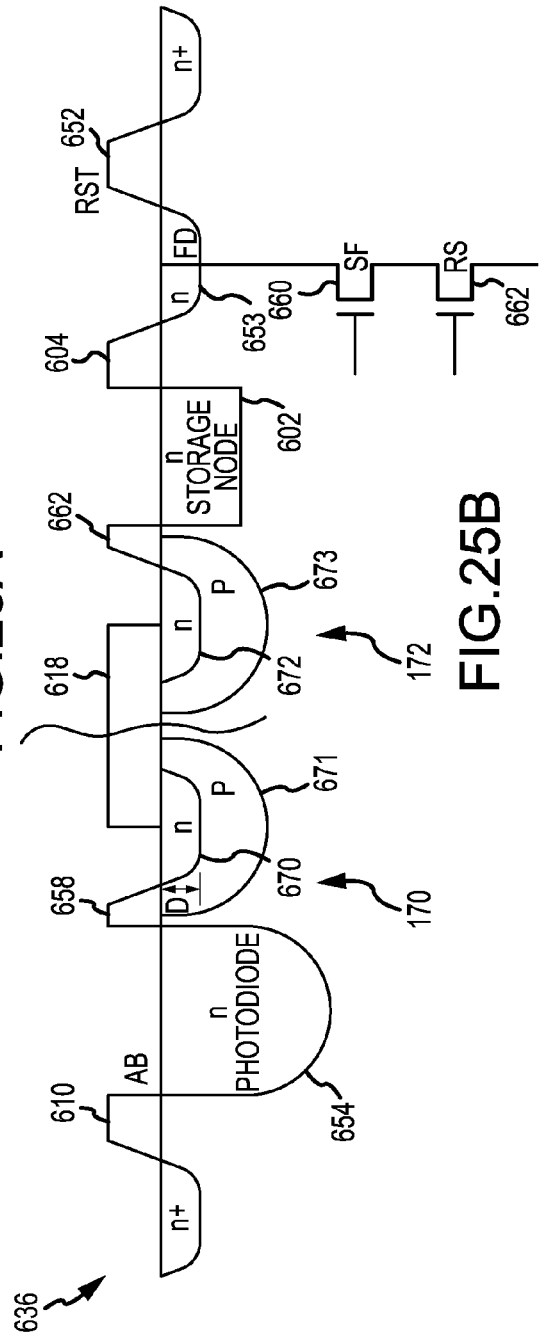
FIG.25A
FIG.25B

VERTICALLY STACKED IMAGE SENSOR

TECHNICAL FIELD

The present invention relates generally to electronic devices, and more specifically, to image sensors for electronic devices.

BACKGROUND

Cameras and other image recording devices often use one or more image sensors, such as a charged-coupled device (CCD) sensor or a complementary metal-oxide-semiconductor (CMOS) image sensor. A typical CMOS image sensor may include a two-dimensional array of pixels, where each pixel may include a photo detector, such as a photodiode, and one or more transistors to activate each pixel. An image sensor may be implemented in a rolling shutter configuration or a global shutter configuration.

In a rolling shutter, each of the pixels within the image sensor capture light row by row, and the captured light is then read out to a processor row by row. In this configuration, there may be a time delay between when the first pixel row captures light from the scene and when the last pixel row captures light from the scene. Accordingly, if there is movement in the scene between the first and last pixel rows, the movement may be captured as blurred lines or other motion artifacts. In a global shutter, each of the pixels capture light at the same time (i.e., has the same integration period) and then the pixels transfer the light to a storage component until the pixels can be read out by a processor. In a global shutter configuration, motion is captured and reproduced in an image better than a rolling shutter, as each of the pixels capture light at the exact same time. However, in this configuration, the image sensor generally must include storage space for each pixel, which may require a reduction in resolution or an increase in size for the image sensor.

For example, the resolution of an image sensor typically depends on the number of pixels, that the higher the number of pixels, the higher the resolution of the image sensor. However, as the resolution increases, often the size of the image sensor die also increases. The increase in size is especially true of image sensors in a global shutter configuration, where each pixel includes a light capturing element (e.g., photodiode) and a storage component. Accordingly, image shutters incorporating a global shutter implementation generally have lower resolution than a rolling shutter image sensor of the same size.

Additionally, many image sensors may sacrifice an increased resolution to have a smaller size. For example, many portable electronic devices, such as cell phones, tablet computers, and the like, may include a camera, but the image sensor of the camera may be designed to be as small as possible. Therefore, many cameras for portable devices may have image sensors with decreased resolutions so that they may be as small as possible.

SUMMARY

Examples of the disclosure may an image sensor for an electronic device. The image sensor includes a pixel array split between a photodiode chip and a transistor array chip. The photodiode chip including at least one photodiode or photogate for receiving light. In some embodiments, a transfer gate extends vertically from a top surface of the photodiode chip. The image sensor further includes a transistor array chip in communication with the photodiode chip. The transistor array chip includes a floating diffusion node in communication with the at least one photodiode, a reset gate in communication with the at least one photodiode, a source follower gate in communication with the floating diffusion node, and a row select gate in communication with the source follower gate and the floating diffusion node. The image sensor further includes a logic chip operably connected to the transistor array chip and in communication therewith. The transfer gate communicates data from the at least one photodiode to the transistor array chip and the logic chip selectively activates the vertical transfer gate, the reset gate, the source follower gate, and the row select gate.

Other examples of the disclosure may a mobile electronic device. The mobile electronic device includes a processor, a display screen in communication with the processor, a memory component in communication with the processor and the display screen and at least one camera in communication with the processor. The at least one camera includes a lens and at least one image sensor optical communication with the lens, the image sensor comprising a three chip vertical stack including a control circuitry chip, a photodiode chip, and a logic chip.

Yet other examples of the disclosure include an image sensor including a vertical and/or lateral transfer gate. In these embodiments, the image sensor may include one or more shared pixels, different doping for the one or more gates within the pixel architecture and varying charge transfers throughout integration.

BRIEF DESCRIPTION OF THE DRAWINGS

FIG. 19A is a simplified block diagram illustrating the transistor array chip and the photodiode chip after initially being connected together.

FIG. 19B is a simplified block diagram of the transistor array chip and the photodiode chip, after the transistor array chip has been thinned.

FIG. 19C is a simplified block diagram of the transistor array chip and the photodiode chip operably connected to a logic chip.

FIG. 19D is simplified block diagram of the transistor array chip, the logic chip, and the photodiode chip operably connected together after the photodiode chip has been thinned.

FIG. 25A is a simplified schematic of a pixel circuitry including shallow doped regions for the inter-chip contacts.

FIG. 25B is a simplified block diagram illustrating the doping scheme for the circuitry of FIG. 25A.

SPECIFICATION

Overview

Figure 1A:
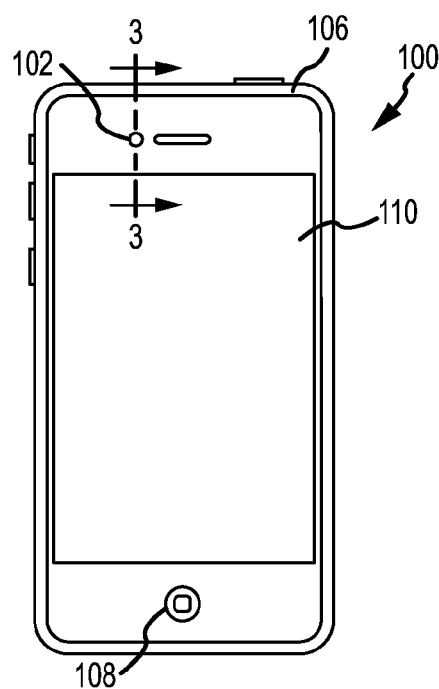
FIG. 1A is a front perspective view of an electronic device including one or more cameras.

The disclosure may take the form of an image sensor for cameras and other electronic devices. Many embodiments of the present disclosure include an image sensor having a transfer gate to communicate between the photodiodes in the image sensor and the readout circuitry for those photodiodes. In some embodiments, the transfer gate may be vertically oriented (as discussed in more detail below), and in other embodiments, the transfer gate may be laterally oriented. The orientation of the transfer gate may be selected based on the desired embodiment to be implemented and the desired size, shape, and functionality of the image sensor.

In some embodiments, the image sensor may include a pixel array having two or more chips stacked together and interconnected with a vertical gate structure. In other words, the pixel array may be split into two chips, e.g., one chip having the photodiodes and another chip having the readout circuitry and transistor array. For example, a first chip may first include the photodiode and a second chip, which may be vertically stacked on the first chip, may include the transistor array. A vertical transfer gate may communicatively couple the two chips together. By including the transistor array on a separate chip, the photodiode exposure area may be maximized, as the first chip may not have to include space for the transistor array. This saved space may be used for additional pixels or to increase the well size for each of photodiode.

In some embodiments, the image sensor may further include a third chip, such as a logic chip, stacked on top of the transistor array chip. The transistor array chip, photodiode chip, and the logic chip may be in communication through one or more vertical transfer gates, metal to metal (or other conductive material) contacts, and/or through silicon vias. In some instances, two chips, such as the transistor array chip and the logic chip, may be in communication through one communication connection (e.g., through silicon via) and the third chip (e.g., the photodiode chip) may be in communication with one of the other two chips through another connection (e.g., vertical transfer gate). Additionally, in some embodiments, the image sensor may include a fourth chip stacked on the logic chip. For example, the image sensor may include a memory chip stacked on the logic chip.

In other embodiments, the photodiode chip and the transistor array chip may be in communication through a ring gate structure. The ring gate structure may be formed on the photodiode chip and an inter-chip connection (such as a conductive wire) may extend vertically to connect with the transistor array chip. In this example, the photodiode chip and the transistor array chip may each include one or more Schottky contacts connected together through an inter-chip connection. Each of the Schottky contacts may be formed in a triple well structure, to reduce leakage current. For example, each contact may be surrounded by a well having a doping material opposite of the contact (e.g., n-doped contact surrounded by a p-doped well). The Schottky contacts allow the inter-chip connection between the photodiode chip and the transistor array chip to be pinned, which may control the depletion voltage and charge storage amounts for the photodiode. Additionally, while under forward bias the Schottky contacts may be fully depleted as the active area size and doping for the image sensor may be optimized for the bias needed to fully deplete the active regions. In other words, the doping amount and area may be determined to correspond to the anticipated charge transfer from the photodiode. The doping type of the contacts between the photodiode chip and the transistor array chip may be varied based on the desired pixel architecture of the image sensor.

In another example, the doping concentration, doping depth, and node active area of the nodes forming and in communication with the transfer gate may be controlled so that the charge transfer nodes may have substantially the same state between reset and post transfer. For example, the image sensor may include shallow doped regions forming charge storage nodes, where the doping concentration may be relatively high. In other words, each of the shallow doped regions may be highly doped but have a thin thickness or depth. The small size, but high doping concentration may allow the charge to be completely transferred from the storage node, reducing noise and error within a captured image.

In some embodiments, the pinning potentials for each node of the image sensor may increase from the photodiode towards a floating diffusion node. In other words, the doping concentration for each node may increase from the photodiode towards the floating diffusion node. In these embodiments the voltage depletion level increases from the photodiode towards the floating diffusion node, which may allow a charge to more easily be transferred between the photodiode to the floating diffusion node (where it may be eventually read out).

In some embodiments, the stacked image sensor may also provide for a global shutter with a smaller pixel size. This is possible as the storage node that stores the charge from the photodiode can be positioned above the photodiode exposure area, thus maintaining the size of the photodiode area, although an additional component is included in the image sensor. Additionally, in some global shutter operations additional transistors may be needed to operate the pixel. For example, the storage gate may include one or more transistors that control the entry and exit of charge into the storage node. In these embodiments, the image sensor may allow these additional transistors to be positioned above the photodiode and thus not reduce the surface area or space on the first chip allowed for the photodiode.

Additionally, the stacked image sensor may include one or more shields may be used to optically and/or electrically isolate the storage component (which may be used to implement a global shutter). For example, the image sensor may illuminated on its back side and the storage component may be positioned on the transistor array chip and metal shielding may be positioned between the photodiode chip and the transistor array chip. In this example, the storage component or node may be optically isolated from the light source exposed to the photodiode, which may reduce artifacts that could be introduced into images captured by the image sensor due to the storage component being exposed to light. The metal shielding may prevent light pollution (e.g., light not captured by the photodiode during integration) from entering into the storage node and corrupting the data stored therein. This may reduce errors due light reflected within the photodiode chip or light that enters into the photodiode chip after integration.

In other embodiments, the image sensor may include one or more components that may be shared by neighboring pixels. For example, one or more storage nodes or transistors may be shared by groups of pixels. Continuing with this example, in a global shutter implementation, the charge for each of the shared pixels within a group of pixels may be transferred sequentially to the storage node and each group of pixels (e.g., pixel cells) may be accessed globally. As another example, pixels within a select pixel cell may be summed together to produce a maximum signal, such as during low light.

In some embodiments including a shared pixel architecture, the charge for a cell of pixels may be rebalanced by sharing the charge of some pixels with other pixels. For example, select pixels within a pixel cell may be reset and charge stored in the photodiodes of the other pixels within the cell may be distributed (at least in part) to the reset pixel or pixels. Rebalancing the charge among pixels may allow the sensitivity of the image sensor to be dynamically adjusted without the requirement for an aperture control within the camera.

The present disclosure may also include examples of methods of manufacturing the image sensor. In embodiments including a vertical transfer gate, the stacked image sensor may be manufactured in some instances so that each of the chips may have substantially the same die size and may be stacked at the wafer level. Stacking the chips at the wafer level may reduce the overall die/module size as compared to conventional image sensors, as well as enhance the pixel/sensor functions. Additionally, because certain functions of the image sensor, e.g., the photodiode and the transistor logic, may be separated into discrete chips, each chip may be optimized to the particular function.

In some embodiments, the image sensor may be configured to vary the conversion gain to optimize or enhance a pixel signal based on lighting and other operating conditions. For example, because the photodiode has been separated from the transistor array, the amount of silicon available for each pixel is increased, which allows for further components to be used. In some instances, different floating diffusion nodes may be selected (e.g., through a multiplexing process) based on the pixel charge level or the floating diffusion area may be connected to capacitors or similar components through convert ion gain control gates.

DETAILED DESCRIPTION

Figure 1B:
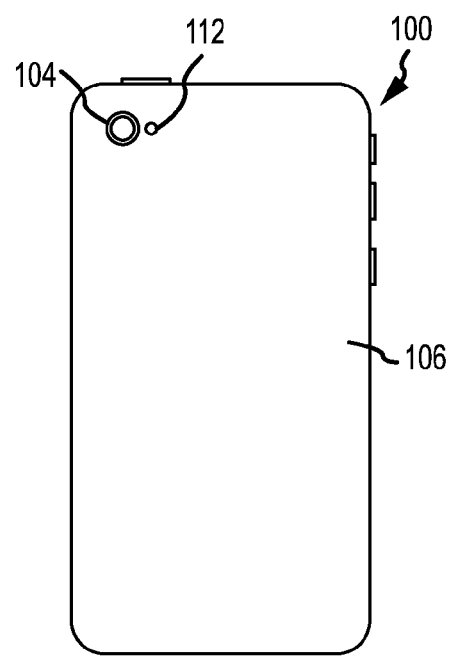
FIG. 1B is a rear perspective view of the electronic device of FIG. 1A.

Turning now to the figures, the image sensor and an illustrative electronic device for incorporating the image sensor will be discussed in more detail. FIG. 1A is a front elevation view of an electronic device 100 including the image sensor. FIG. 1B is a rear elevation view of the electronic device 100. The electronic device 100 may include a first camera 102, a second camera 104, an enclosure 106, a display 110, and an input/output button 108. The electronic device 100 may be substantially any type of electronic or computing device, such as, but not limited to, a computer, a laptop, a tablet, a smart phone, a digital camera, a printer, a scanner, a copier, or the like. The electronic device 100 may also include one or more internal components (not shown) typical of a computing or electronic device, such as, but not limited to, one or more processors, memory components, network interfaces, and so on.

As shown in FIG. 1, the enclosure 106 may form an outer surface or partial outer surface and protective case for the internal components of the electronic device 100 and may at least partially surround the display 110. The enclosure 106 may be formed of one or more components operably connected together, such as a front piece and a back piece, or may be formed of a single piece operably connected to the display 110.

The input member 108 (which may be a switch, button, capacitive sensor, or other input mechanism) allows a user to interact with the electronic device 100. For example, the input member 108 may be a button or switch to alter the volume, return to a home screen, and the like. The electronic device 100 may include one or more input members 108 and/or output members, and each member may have a single input or output function or multiple input/output functions.

The display 110 may be operably connected to the electronic device 100 or may be communicatively coupled thereto. The display 110 may provide a visual output for the electronic device 100 and/or may function to receive user inputs to the electronic device 100. For example, the display 110 may be a multi-touch capacitive sensing screen that may detect one or more user inputs.

Figure 2:
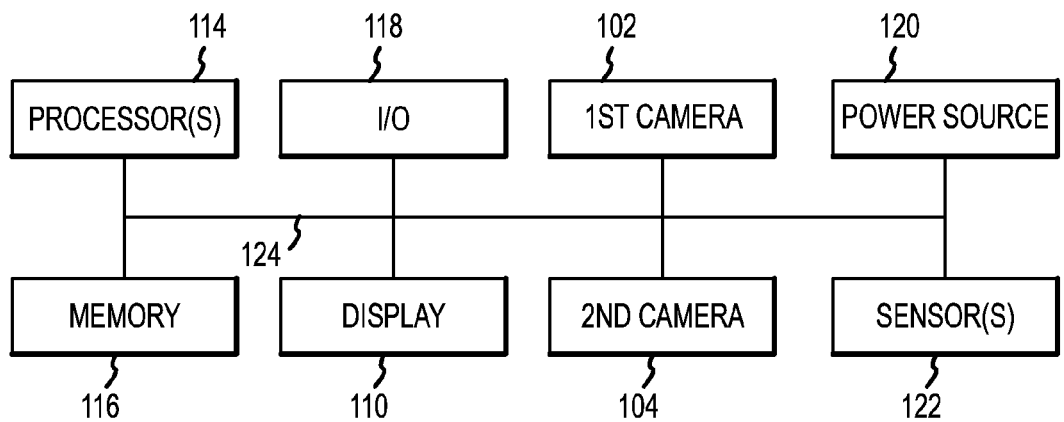
FIG. 2 is a simplified block diagram of the electronic device of FIG. 1A.

The electronic device 100 may also include a number of internal components. FIG. 2 is a simplified block diagram of the electronic device 100. The electronic device 100 may also include one or more processors 114, a storage or memory component 116, an input/output interface 118, a power source 120, and one or more sensors 122, each will be discussed in turn below.

The processor 114 may control operation of the electronic device 100. The processor 114 may be in communication, either directly or indirectly, with substantially all of the components of the electronic device 100. For example, one or more system buses 124 or other communication mechanisms may provide communication between the processor 114, the cameras 102, 104, the display 110, the input member 108, the sensors 122, and so on. The processor 114 may be any electronic device cable of processing, receiving, and/or transmitting instructions. For example, the processor 114 may be a microprocessor or a microcomputer. As described herein, the term "processor" is meant to encompass a single processor or processing unit, multiple processors, or multiple processing units, or other suitably configured computing element.

The memory 116 may store electronic data that may be utilized by the electronic device 100. For example, the memory 116 may store electrical data or content e.g., audio files, video files, document files, and so on, corresponding to various applications. The memory 116 may be, for example, non-volatile storage, a magnetic storage medium, optical storage medium, magneto-optical storage medium, read only memory, random access memory, erasable programmable memory, or flash memory.

The input/output interface 118 may receive data from a user or one or more other electronic devices. Additionally, the input/output interface 118 may facilitate transmission of data to a user or to other electronic devices. For example, in embodiments where the electronic device 100 is a phone, the input/output interface 118 may be used to receive data from a network, or may be used to send and transmit electronic signals via a wireless or wired connection (Internet, WiFi, Bluetooth, and Ethernet being a few examples). In some embodiments, the input/output interface 118 may support multiple network or communication mechanisms. For example, the network/communication interface 118 may pair with another device over a Bluetooth network to transfer signals to the other device, while simultaneously receiving data from a WiFi or other network.

The power source 120 may be substantially any device capable of providing energy to the electronic device 100. For example, the power source 120 may be a battery, a connection cable that may be configured to connect the electronic device 100 to another power source such as a wall outlet, or the like.

The sensors 122 may include substantially any type of sensor. For example, the electronic device 100 may include one or more audio sensors (e.g., microphones), light sensors (e.g., ambient light sensors), gyroscopes, accelerometers, or the like. The sensors 122 may be used to provide data to the processor 114, which may be used to enhance or vary functions of the electronic device 100.

Figure 3:
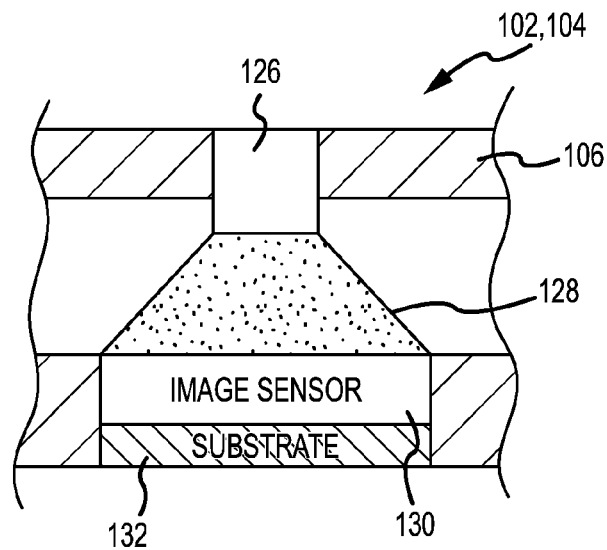
FIG. 3 is a cross-section view of the electronic device of FIG. 1A taken along line 3-3 in FIG. 1A.

With reference again to FIGS. 1A and 1B, the electronic device 100 may also include one or more cameras 102, 104 and optionally a flash 112 or light source for the cameras. FIG. 3 is a simplified cross-section view of one camera 102, taken along line 3-3 in FIG. 1A. Although FIG. 3 illustrates the first camera 102, it should be noted that the second camera 104 may be substantially similar to the first camera 102. In some embodiments one camera may include a global shutter configured image sensor and one camera may include a rolling shutter configured image sensor. In other examples, one camera may have an image sensor with a higher resolution than the image sensor in the other camera. With reference to FIG. 3, the cameras 102, 104 may include a lens 126 in optical communication with an image sensor 130. The lens 126 may be operably connected to the enclosure 106 and positioned above the image sensor 130. The lens 126 may direct or transmit light 128 within its field of view on to a photodiode layer (discussed in more detail below) of the image sensor 130.

The image sensor 130 may be supported beneath the lens 126 by a substrate 132 or other support structure. The image sensor 130 may convert light 128 into electrical signals that may represent the light from the captured scene. In other words, the image sensor 130 captures the light 128 optically transmitted via the lens 126 into electrical signals.

Image Sensor Architecture

Figure 4B:
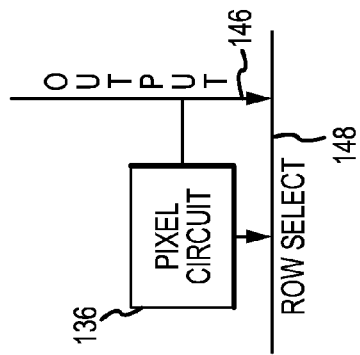
FIG. 4B is an enlarged view of the pixel architecture of FIG. 4A illustrating a single pixel.
Figure 4A:
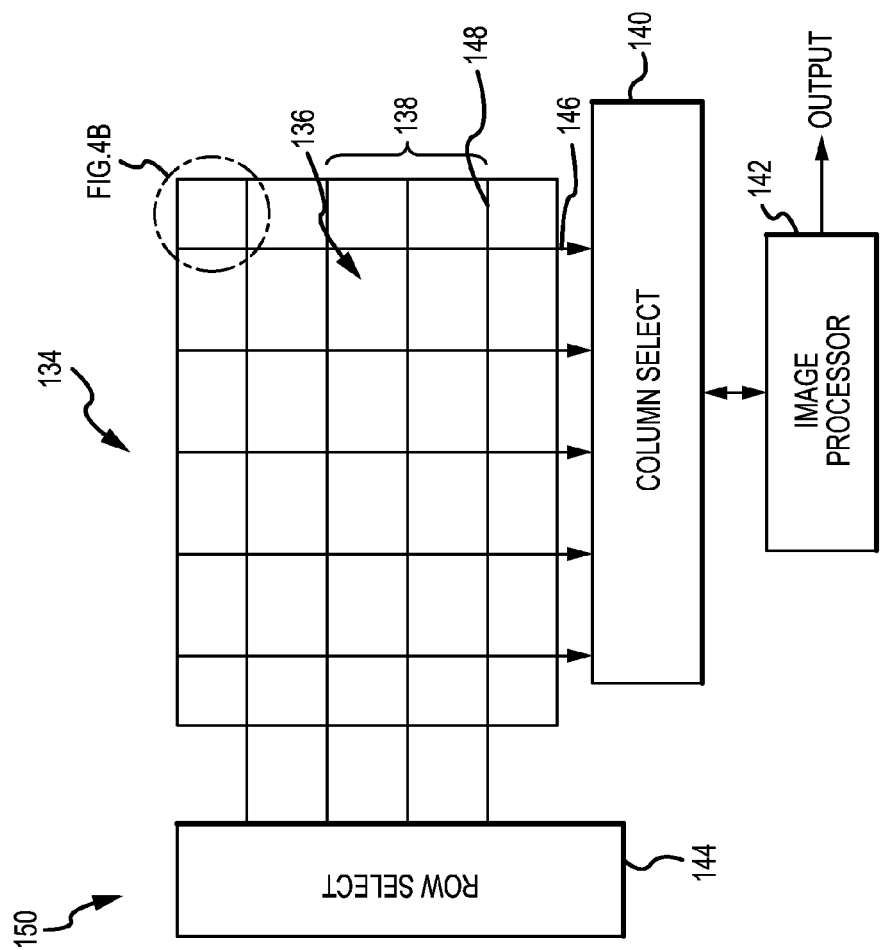
FIG. 4A is a simplified diagram of an image sensor architecture for a camera of the electronic device.
Figure 5:
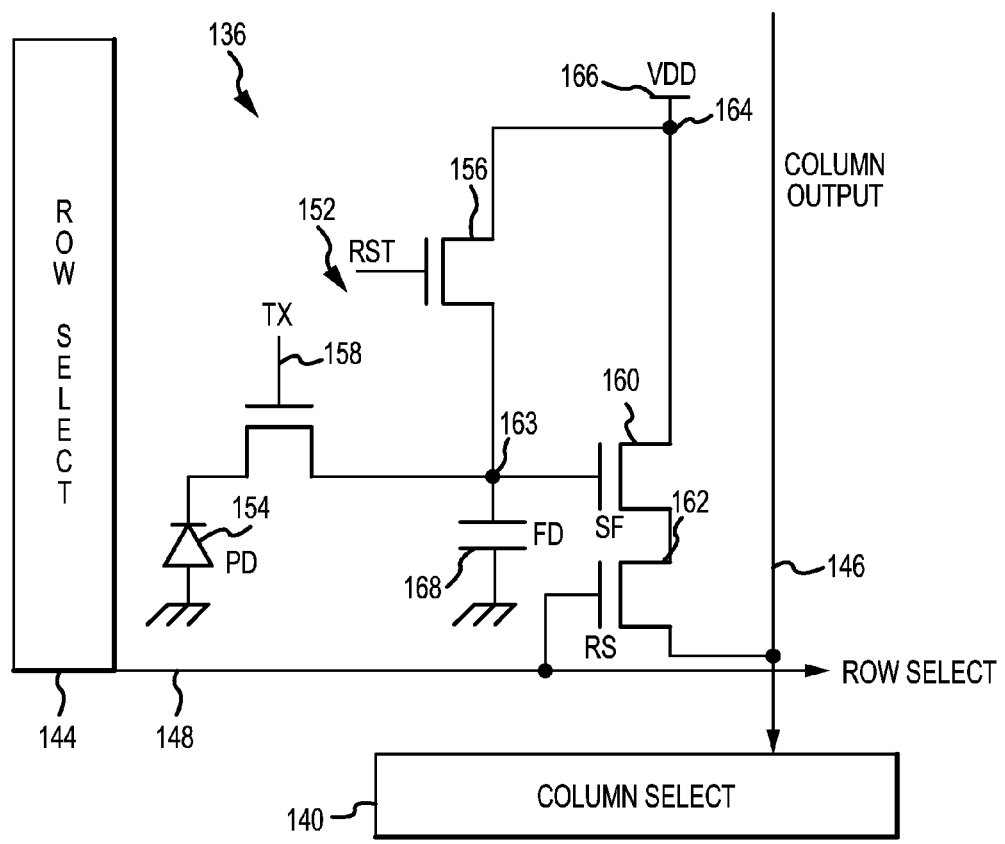
FIG. 5 is a simplified schematic view of the pixel of FIG. 4A.

An illustrative architecture for the image sensor 130 will now be discussed in more detail. FIG. 4A is a simplified schematic of an architecture for the image sensor 130. FIG. 4B is an enlarged view of a pixel of the pixel architecture of FIG. 4A. FIG. 5 is a simplified schematic view of the pixel of FIG. 4A. With reference to FIGS. 4A-5, the image sensor may include an image processing component 150 and a pixel architecture 134 or pixel array. This architecture defines one or more pixels 136 and/or groups of pixel cells 138 (e.g., groups of pixels 136 grouped together to form a Bayer pixel or other set of pixels). The pixel architecture 134 may be in communication with a column select 140 through one or more column output lines 146 and a row select 144 through one or more row select lines 148.

The row select 144 and/or the column select 140 may be in communication with an image processor 142. The image processor 142 may process data from the pixels 136 and provide that data to the processor 114 and/or other components of the electronic device 100. It should be noted that in some embodiments, the image processor 142 may be incorporated into the processor 114 or separate therefrom. The row select 144 may selectively activate a particular pixel 136 or group of pixels, such as all of the pixels 136 on a certain row. The column select 140 may selectively receive the data output from select pixels 136 or groups of pixels 136 (e.g., all of the pixels with a particular column).

With reference to FIG. 5, each pixel 136 may include a transistor array 152 or control circuitry and a photodiode 154. The photodiode 154 may be in optical communication with the lens 126 to receive light transmitted therethrough. The photodiode 154 may absorb light and convert the absorbed light into an electrical signal. The photodiode 154 may be an electron-based photodiode or a hole based photodiode. Additionally, it should be noted that the term photodiode as used herein is meant to encompass substantially any type of photon or light detecting component, such as a photogate or other photon sensitive region. The photodiode 154 is coupled to a transfer gate 158, the transfer gate 158 selectively connects the photodiode 154 to the remaining control circuitry 152 of the pixel 136.

The transfer gate 158 is coupled to a reset gate 156 and a source follower (SF) gate 160. The reset gate 156 and the SF gate 160 are coupled to a reference voltage node 164 which connects the two gates to a reference voltage source (Vdd) 166. The row select gate 162 is coupled to a row select line 148 for the pixel 136. A floating diffusion node 163 including a charge storage component 168 may be coupled between the transfer gate 158 and the reset gate 156 and SF gate 160. The control circuitry 152 (or transistor array) may include additional gates other than those shown in FIG. 5. For example, an anti-blooming gate may be in communication with the photodiode 154 to drain charge in excess of saturation level from the photodiode.

Generally, in operation, when one of the cameras 102, 104 is actuated to take a picture by a user, the reference voltage 166 is applied to the reset gate 156 and the transfer gate 158. When the transfer gate 158 is open, the charge within the photodiode 154 is drained to deplete the photodiode. In some embodiments, the cameras 102, 104 may not include a shutter over the lens 126, and so the image sensor 130 may be constantly exposed to light. In these embodiments, the photodiode 154 may have to be reset or depleted before a desired image is to be captured. Once the charge from the photodiode 154 has been depleted, the transfer gate 158, and the reset gate 156 may be turned off, isolating the photodiode 154. The photodiode 154 may then begin integration and collecting light 128 transmitted to the image sensor 130 from the lens 126. As the photodiode 154 receives light, it starts to collect charge (e.g., a depletion region reduces as electrons from the light are received). However, the charge within the photodiode 154 may remain within a well of the photodiode 154 because the transfer gate 158 (connecting the photodiode 154) to the control circuitry 150 and other gates is off.

Once integration is complete and the photodiode 154 has collected light 128 from the lens 126, the reset gate 152 may be turned on to reset the floating diffusion node 163. Once the floating diffusion 163 has been reset, the reset gate 156 may be turned off and the transfer gate 158 may be turned on. The charge from the photodiode 154 can then be transferred to the floating diffusion node 163 and be stored in the storage component 168. To read out the charge from the photodiode 154 (here, via the floating diffusion 163), the row select gate 152 and the SF gate 160 may be activated, and the SF gate 160 amplifies the charge within the floating diffusion 163 and through the row select gate 162, the signal or charge is provide to the column output line 146.

In a rolling shutter operation, photodiodes 154 in different rows may be exposed at different times. Accordingly, if one or more objects within a scene are moving, a first row may capture a different position of the image than a second row as they are exposed sequentially, which may cause motion artifacts in the sensed image. In a global shutter operation, additional storage nodes may be added to store charge from the photodiode 154. In the global shutter operation, each row within the pixel architecture 134 may be reset and exposed at substantially the same time. Each pixel may also simultaneously transfer the charge from the photodiode 154 to a storage node, and then each pixel 136 may be read out row by row.

Vertical Transfer Gate

Figure 6:
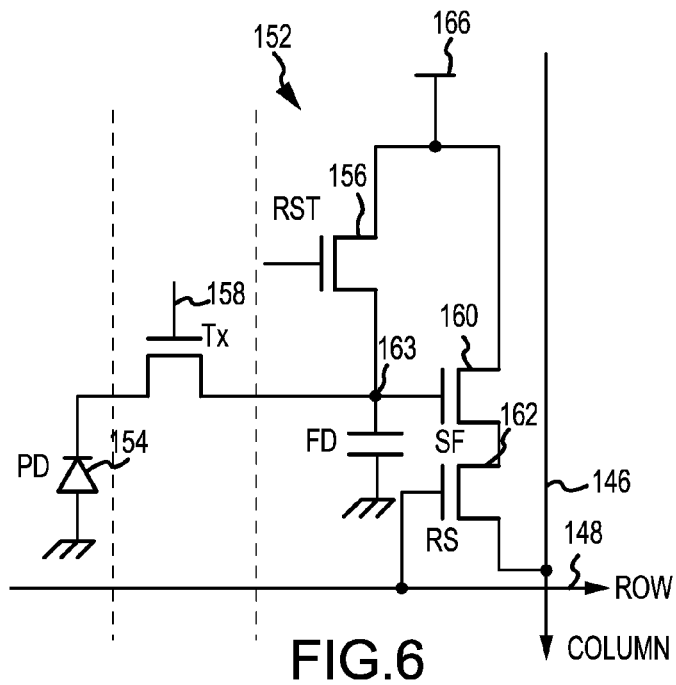
FIG. 6 is a schematic view of the pixel of FIG. 5 illustrating a vertical transfer gate.
Figure 7:
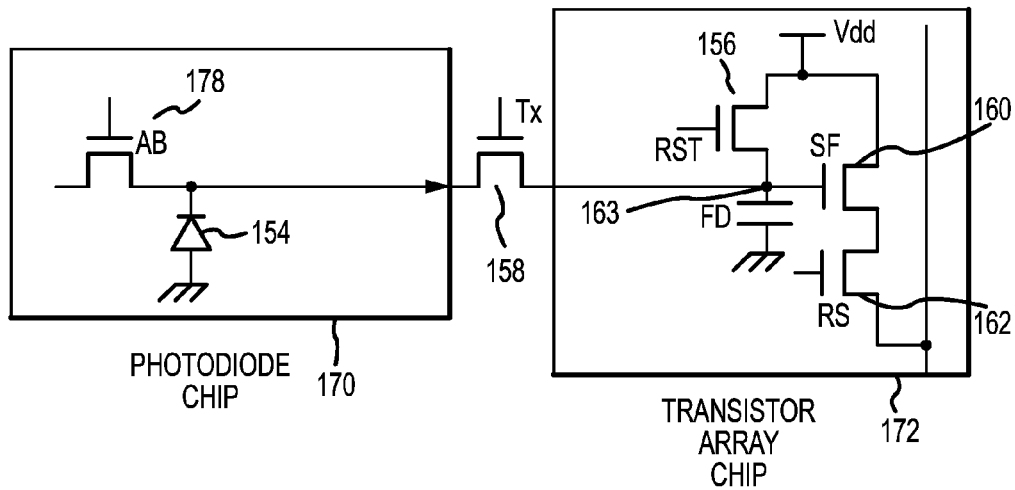
FIG. 7 is a block diagram of the schematic of FIG. 6 illustrating the vertical transfer gate extending between a photodiode chip and a transistor array chip.
Figure 8:
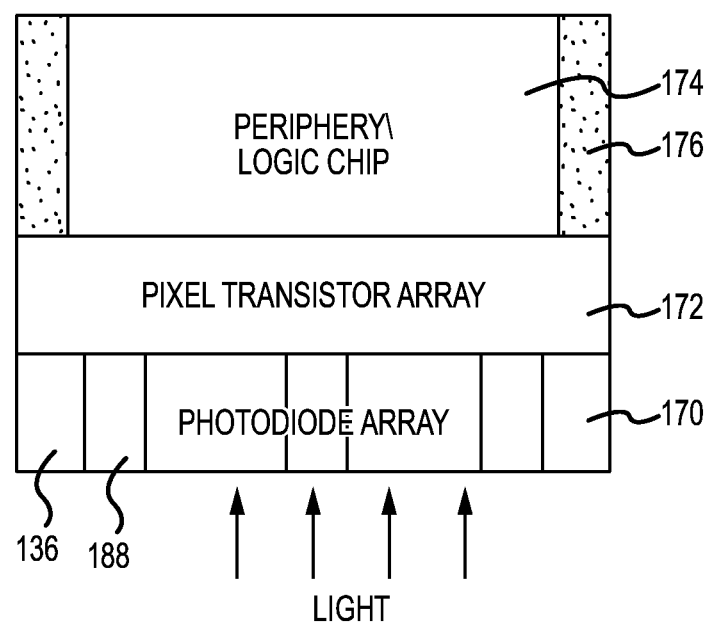
FIG. 8 is a simplified block diagram of the image sensor illustrating the chip stack including the photodiode chip, the transistor array chip, and a logic chip.

In some embodiments, the image sensor 130 may include a pixel array including a two-chip stacked structure with the transfer gate 158 extending between the two chips. In this example, the components of each pixel may be split into two separate chips. In some embodiments, the image sensor may further include a third chip, a logic chip, within the stacked structure. FIG. 6 is a schematic view of a pixel of the image sensor 130 illustrating the division of chips for the image sensor. FIG. 7 is a simplified block diagram of the pixel illustrated in FIG. 6, including an optional anti-blooming gate. FIG. 8 is a simplified side elevation view of the image sensor 130 including the transfer gate structure of the FIG. 6. With reference to FIGS. 6-8, the image sensor 130 may include a photodiode chip 170 and a transistor array chip 172, where the two chips 170, 172 are vertically stacked. In this configuration, the transfer gate 158 may extend vertically between the two chips 170, 172 to communicatively couple them together.

Each of the chips may include a top and bottom surface and a thickness. In some instances, the dimensions of the thicknesses may be less than the dimension of the surfaces or faces for each respective chip. As used herein, the term "vertically stacked" is meant to encompass embodiments where the photodiode chip, the transistor array chip, and/or the logic chip may be stacked so that their faces or surfaces abut one another and are generally aligned across the thickness dimension.

In some embodiments, the photodiode chip 170 may include the photodiode 154 and optionally an anti-blooming gate 178 and the transistor array chip 172 may include the control circuitry 150 or transistor array. The transfer gate 158 may be defined through the connection between the photodiode chip 170 and the transistor array chip 172. In some embodiments, the drain or charge storage node of the transfer gate 158 (i.e., the end of the gate that connects to the floating diffusion node 163) may be located on the transistor array chip 172. This may allow more space on the photodiode chip 170 to be dedicated to the photodiodes for each pixel. Thus, the number of photodiodes 154 and/or their well size may be increased, without causing a subsequent increase in the surface area of the image sensor 130. Additionally, as will be discussed in more detail below, the two chips 170, 172 may be manufactured in light of their specialized functions, e.g., the photodiode chips 170 may be manufactured to increase performance of the photodiode function, which may allow the chips to be optimized for their desired performance.

Figure 9A:
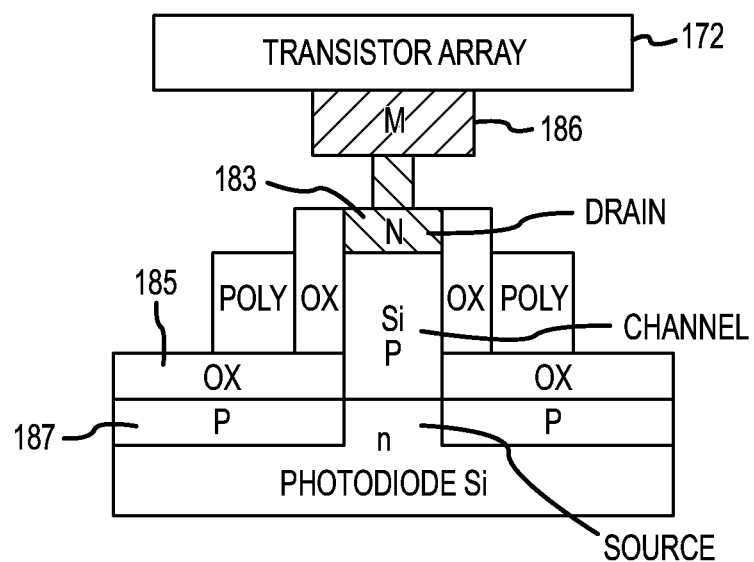
FIG. 9A is a block diagram illustrating a simplified structure of the image sensor and particularly the transfer gate between the photodiode chip and the transistor array chip.
Figure 9B:
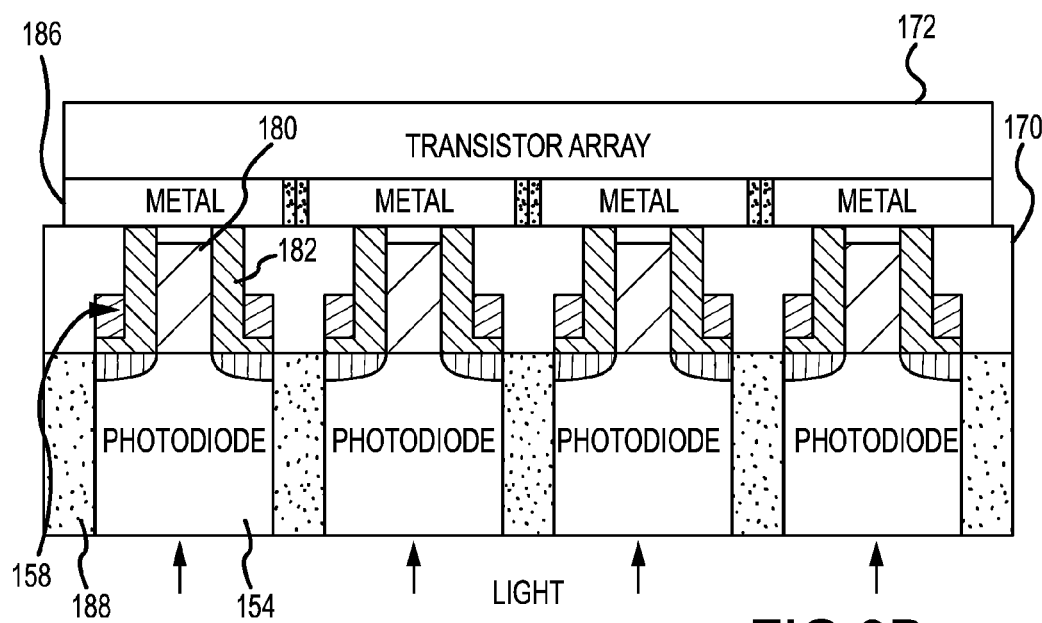
FIG. 9B is a block diagram illustrating a simplified structure for a pixel cell having four pixels illustrating the transfer gate between the photodiode chip and the transistor array chip.
Figure 10:
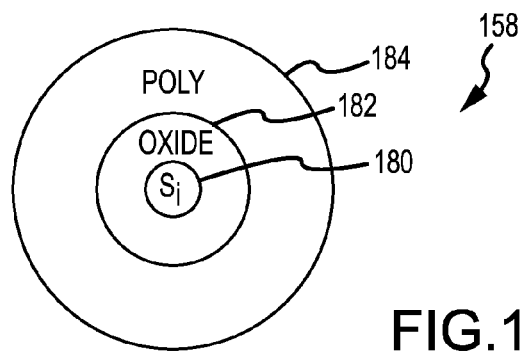
FIG. 10 is a cross-section view of the transfer gate take along line 10-10 in FIG. 9A.

A simplified structure of the image sensor 130 and particularly the transfer gate 158 is illustrated in FIG. 9A. A simplified structure for a pixel cell 138 is illustrated in FIG. 9B. With reference to FIGS. 9A and 9B, the transfer gate 158 may extend from the photodiode chip 170 (which may include a silicon substrate). The transfer gate 158 may include a semiconductor transfer channel 180 that may be surrounded by a oxide layer 182 (e.g., silicon oxide) and a polysilicon layer 184. FIG. 10 is a cross-section view of the transfer gate 158 taken along line 10-10 in FIG. 9A. As shown in FIG. 10, the transfer channel 180 may be surrounded by the oxide layer 182, which may be surrounded (at least in part) by the polysilicon layer 184.

With reference to FIGS. 9A-10, a metal layer 186 may connect the transfer channel 180 to the transistor array chip 172. The metal layer 186 may include one or more isolations 181 (see FIG. 9B) or insulating barriers positioned between the connections for each pixel. The isolations 181 may help to ensure that the signals from one photodiode 154 are not inadvertently transferred or combined with the signals from adjacent photodiodes during transfer to the transistors.

A top of the semiconductor transfer channel 180 may include a drain region 183 positioned on a top thereof. In this embodiment, the semiconductor transfer channel 180 may be p-doped and the drain region 183 may be n-doped; however, other variations are envisioned. With continued reference to FIG. 9A, a bottom oxide layer 185 may be positioned between the photodiode 154 and the polysilicon layer 184. In this embodiment, base doped region 187 may be positioned between the bottom oxide layer 185 and the photodiode 154.

When the transfer gate 158 is activated, e.g., turned on, the metal layer 186 may encourage electrons to flow from the photodiode 154 through the transfer channel 180. The silicon base forming the photodiode 154 forms the source for the transfer gate 158, with the silicon transfer channel 180 acting as the channel or pathway for electrons, and the drain region 183 forms the drain for the transfer gate 158. This structure allows electrons to be transmitted from the photodiode to the transistor array 172 (via the channel and the metal 186 contact.

The transfer gate 158 structure may be formed through a selective epitaxy (EPI) process. For example, the gate oxide layer 182 may be formed by thermal oxidation of the EPI. In this example, the threshold voltage of the transfer gate 158 may be varied by adjusting EPI doping or ion implantation. In other embodiments, the transfer gate 158 may be formed through other processes. As one example, amorphous or polysilicon may form the transfer channel 180 and/or the polysilicon layer 182 may be formed through metal materials or other semiconductor materials, such as, but not limited to amorphous silicon, tantalum, or tungsten. The metal contacts between the photodiode chip 170 and the transistor array chip 172 may be used in place of a through silicon via (TSV) between the photodiode chip 170 and the transistor array chip 172. By using connections that do not require a TSV, the image sensor 130 may be used to create smaller sized pixel architectures as the photodiode array 170 substrate (e.g., silicon) may not have to be large enough to accommodate the additional size of the vias. In other words, substantially all of the space on the photodiode chip 170 may be used to collect light. It should be noted that in some embodiments, one or more TSVs may also be used in addition to or instead of the vertical transfer gates.

With reference again to FIGS. 8 and 9B, in some embodiments, the photodiode array chip 170 may include a plurality of photodiodes for each pixel 136 defined therein. For example, a substrate forming the photodiode chip 170 may include implants of pixel separators 188 between the photodiode 154 for each pixel 136. The pixel separators 188 may separate each pixel well from adjacent pixel wells, and may define each photodiode 154 area. As one example, the pixel separators 188 may be implants of silicon. In these embodiments, the transfer gate 158 for each pixel 136 may be formed on a top surface of the photodiode chip 170, but separated from adjacent transfer gates by a distance substantially equal to a length of the separating material 188. For each photodiode 154, the photodiode chip 170 may include an inter-chip connection to the transistor array chip 170 through a separate vertical transfer gate 158. For example, the number of connections between the two chips 170, 172 may be determined by the number of pixels. That is, for every photodiode 154, the photodiode chip and the transistor array may include a communication pathway or interconnect for the data sensed by each photodiode 154. Using through silicon vias to provide a connection for every pixel to its control circuitry would be difficult, and require the size of the image sensor to be increased. With the vertical transfer gate, each pixel may have its own connection to the control circuitry. However, in other embodiments (see, for example, FIG. 16A) the number of inter-chip connections may be reduced as the circuitry for a set of pixels may be shared.

The image sensor 130 structure illustrated in FIGS. 8-10 may provide for an increased photon sensing area. This is because the surface area of the image sensor 130 exposed to light may include photodiodes 154 only and may not need additional control circuitry, such as one or more storage nodes or switching transistors. Thus, the exposed surface may be maximized for light collection, while the control circuitry may be positioned behind the light collection area. This may allow for the pixel architecture 134 to have substantially the same exposure area as conventional pixels, but include an increased number of pixels 136. This may provide for an increased sensitivity and resolution as compared to conventional pixels having the same surface area. Additionally or alternatively, the well size for each photodiode 154 may be increased to receive more light before reaching a saturation level, without reducing the number of pixels that can be positioned on the photodiode chip.

In some embodiments, the photodiode chip 170 may be illuminated from the backside, i.e., a bottom of the photodiode chip 170 may be in optical communication with the lens 126. The back illumination may allow the entire back surface of the photodiode chip 170 including the photodiodes 154 to be exposed to light, without the light being blocked by the transfer gate 158 or components of the transistor array.

Figure 11:
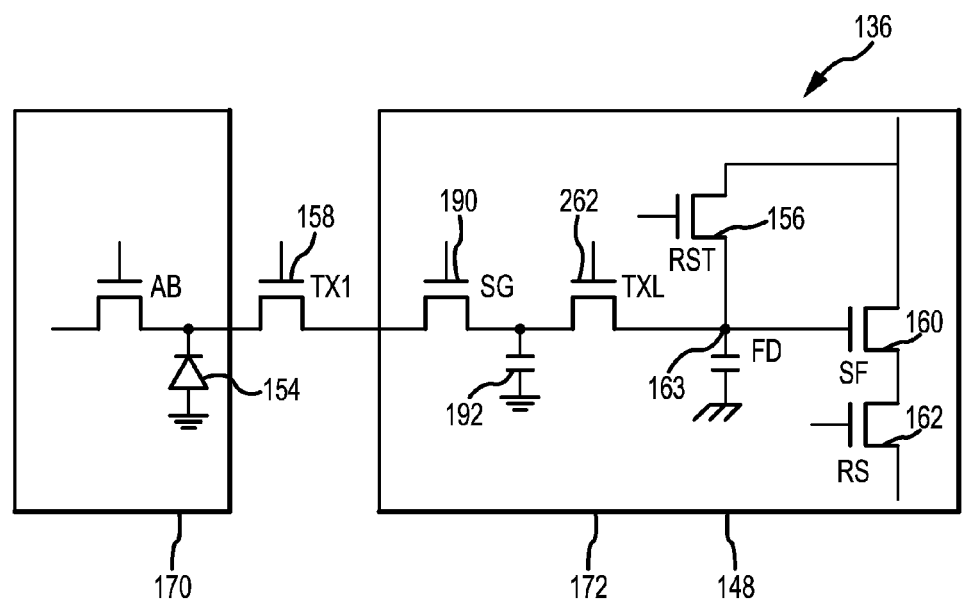
FIG. 11 is a simplified diagram of a pixel on the photodiode chip and the transistor array chip including a storage gate on the photodiode chip.

In some embodiments, the image sensor 130 may be further configured for a global shutter mode. FIG. 11 is a simplified diagram of the photodiode chip 170 and the transistor array 172 chip including a storage gate. With reference to FIG. 11, each pixel 136 may include a storage gate 190 that defines a storage node 192. The storage gate 190 may store a charge from the photodiode 154 in the storage node 192 region to allow a global shutter operation. For example, in a global shutter operation, each of the pixels 136 of image sensor 130 may begin charge integration at the same time. During the integration period, each of the photodiodes 154 may accumulate charge corresponding to light transmitted through the lens 126 that encounters each photodiode 154. After integration, the storage gate 190 may be activated and the charge from the photodiode 154 may be transmitted to the storage node 192 (which in some embodiments may be formed as a n-doped region beneath the storage gate 190). The data from the photodiode 154 may be held at the storage node 192 until the particular pixel 136 is ready to be read out.

When the pixel 136 is to be read out, the transfer gate 158 may be activated to transfer the charge from the storage node 192 to the floating diffusion 163 node. Once the data is stored in the floating diffusion 163, the pixel 136 may be operated in substantially the same manner as described above with respect to FIG. 6, i.e., every pixel may be read out sequentially. During a global shutter operation, all of the pixels 136 may capture light at substantially the same time, which may decrease artifacts in an image due to an object moving. For example, during a rolling shutter operation where each pixel is sequentially integrated and read out, if an object moves between a first pixel row integration and a last row integration, the image may have blurred or distorted lines. In the image sensor 130 of FIG. 11, the pixels capture light at the same time, the light is then stored, which allows for the pixels to be read out sequentially, but capture light simultaneously.

It should be noted that the vertically stacked pixel structure may allow the image sensor 130 to implement a global shutter mode without requiring a significant reduction in resolution. For example, conventional image sensors having a global shutter mode may have to use a reduced number of pixels as each pixel may have to be increased in size to accommodate the additional transistor and storage node for global shutter operation. The increased pixel size may result in a reduced number of pixels that fit onto a particular image sensor substrate. On the contrary, the image sensor 130 of FIG. 11 may allow a storage node 192 at each pixel 136, without sacrificing photodiode space. This is because the transfer gate 158 is formed vertically and may not require space on the photodiode chip 170. Thus, the image sensor 130 may be used to capture moving objects without requiring a reduction in pixel resolution as compared to a conventional image sensor having the same light exposure surface area.

Shared Pixel Architecture

In some embodiments, one or more components for each pixel may be shared across a group or cell of pixels. Using a stacked chip configuration, specifically, the vertical transfer gate structure illustrated above, may require small pitch inter-chip connections between the photodiode chip and the transistor array chip. For example, in instances where the pixel size is small, an inter-chip connection under 2 μm may be required. However, by having groups of pixels share one or more components, the number of inter-chip connections may be reduced, which may allow the size of each inter-chip connection to be increased. For example, pixel transistor sharing (e.g., sharing one or more of the source follower gate, reset gate, and/or row select gate) reduces the number of transistors per pixels. This reduction allows for smaller pixel sizes and/or pixel binning functions. Having multiple pixels sharing the same inter-chip connection may also reduce the number of interchip connections and allow an increased size of the interchip connection, which reduces the complexity of the interchip connection process. It should be noted that the image sensor may implement these sharing architectures without or without a vertical transfer gate (e.g., the image sensor may include a lateral transfer gate).

Figure 12A:
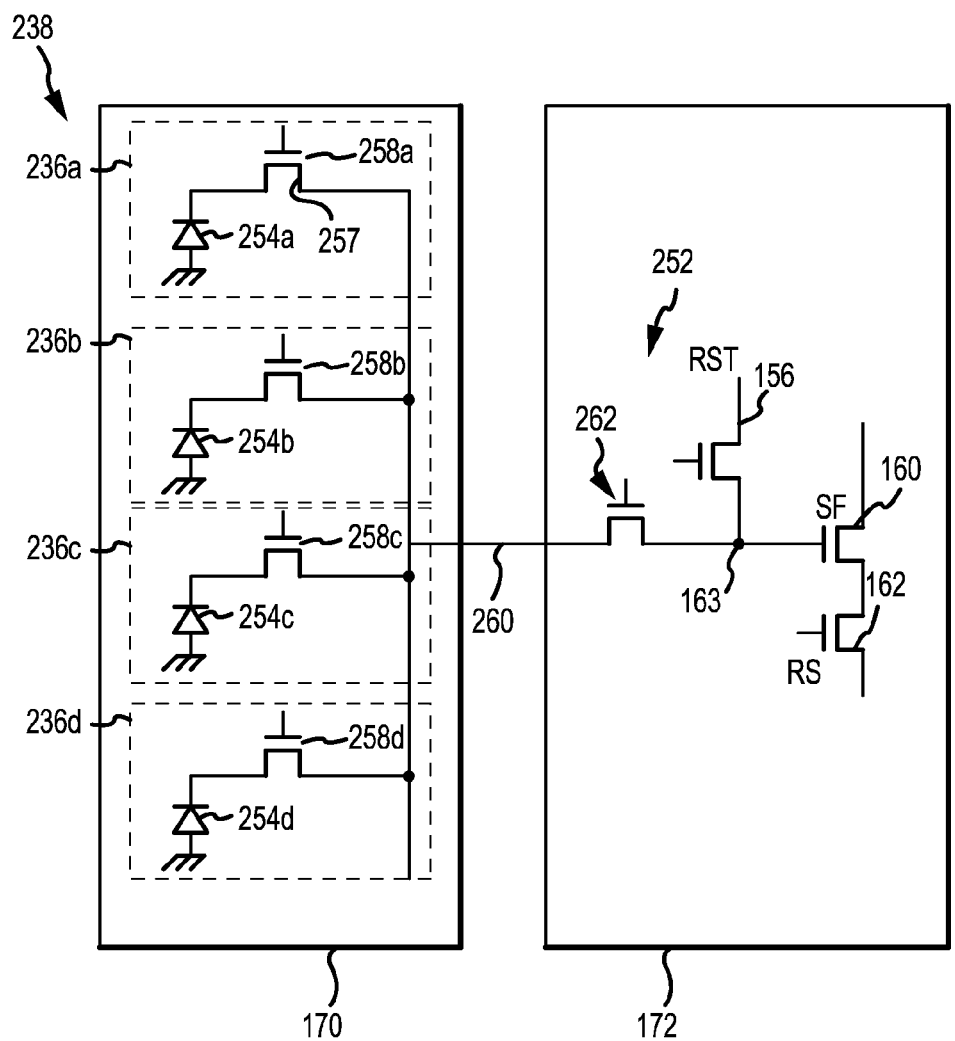
FIG. 12A is a simplified schematic view of a pixel cell having a shared control circuitry.
Figure 12B:
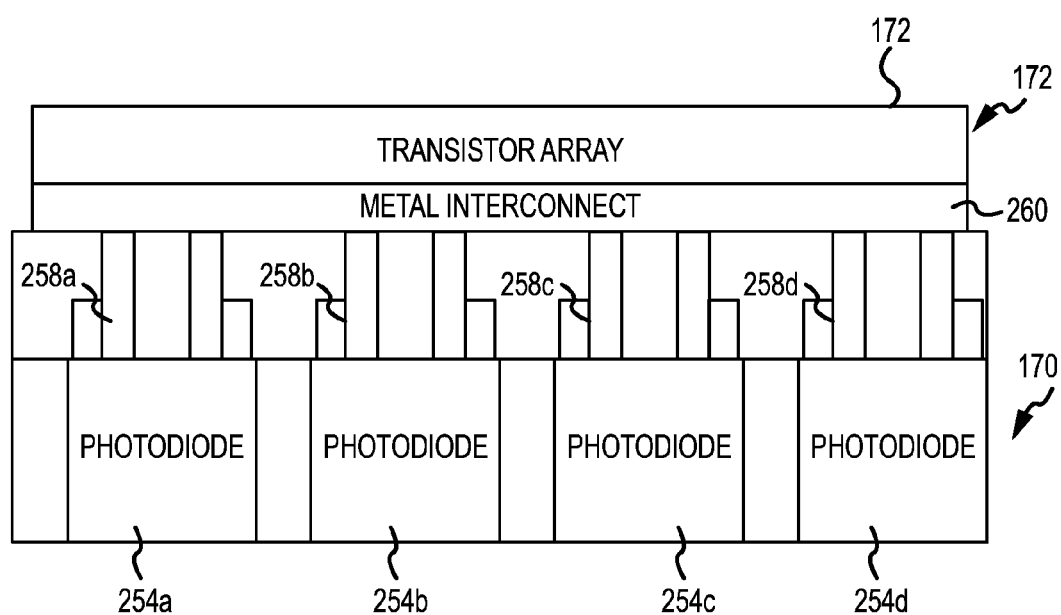
FIG. 12B is a simplified cross-section of the image sensor including the shared architecture of FIG. 12A.

FIG. 12A is a simplified schematic view of a pixel cell having a shared control circuitry. FIG. 12B is a simplified cross-section of the image sensor including the shared architecture of FIG. 12A. With reference to FIGS. 12A and 12B, a group of pixels 236a, 236b, 236c, 236d may form a pixel cell 238. In the pixel cell 238, each of the pixels 236a, 236b, 236c, 236d may include a different color filter, such as, red, green, blue. For example, each pixel cell 238 may form a Bayer pixel array. In other embodiments, each of the pixels 236a, 236b, 236c, 236d may have the same color filters, no color filters, or may be otherwise varied. In the embodiment illustrated in FIGS. 12A and 12B, each of the pixels 236a, 236b, 236c, 236d within the pixel cell 238 may share a control circuitry 252 or transistor array. For example, each photodiode 254a, 254b, 254c, 254d may be connected through one or more activating or trigger transistors 258a, 258b, 258c, 258d to an interconnect 260. The interconnect 260 may connect the photodiodes 254a, 254b, 254c, 254d to the control circuitry 252.

In some embodiments, each trigger transfer gate 258a, 258b, 258c, 258d may be in communication with the interconnect 260. In this example, a drain 257 for each transfer gate may be in communication with the transistor array chip 172. Alternatively, each of the transfer gates may be interconnected or otherwise in communication at a particular node on the photodiode chip 170 and a single vertical transfer gate may extend to communicatively connect the photodiode chip 170 and the transistor array chip 172. For maximum resolution, each pixel may have its own transfer gate 158 (which may either be a vertical transfer gate as shown in FIGS. 9A-10 or may be a lateral transfer gate). In some embodiments, a transfer gate may in communication with the interconnect 260 and may be in communication with all four pixels. In other words, the transfer gate may transfer the signal from four or more pixels to the transistor array to reduce the complexity of the pixel circuitry.

With reference to FIG. 12A, the control circuitry 252 on the transistor array 272 may include a second transfer transistor 262, in addition to the rest gate 156, the SF gate 160, and the row select gate 162. The second transfer gate 262 may communicate the charge or data from each photodiode 254a, 254b, 254c, 254d to the floating diffusion node 163, the SF gate 160, and the row select gate 162.

With reference to FIGS. 12A and 12B, in operation, the lens 126 may direct light onto the image sensor 130, and specifically, onto the photodiode diodes 254a, 254b, 254c, 254d of the pixel chip 170. The photodiodes 254a, 254b, 254c, 254d may, in turn, accumulate a charge. As the charge is accumulating or after a set integration time, the trigger transfer gates 258a, 258b, 258c, 258d of each pixel 236a-236b may be selectively activated. For example, the first trigger gate 258a may be selectively activated (e.g., an activating voltage may be applied to the gate 258a) while the other trigger gates 258b, 258c, 258d of the remaining pixels 236b, 236c, 236d remain deactivated or off. In this configuration, the first photodiode 254a is communicatively coupled to the floating diffusion node 163 (when the second transfer transistor 262 is activated). The floating diffusion 163 may then selectively provide the charge to the SF 160 and row select 162. Once the charge from the first pixel 236a has been read out, the first trigger transistor 258a may be deselected or deactivated and the second trigger transistor 258b may be activated while the other trigger transistors remain off. The image sensor 130 may continue to read out each pixel by activating the respective trigger transistor until each of the pixels 236a, 236b, 236c, 236d within the pixel cell 238 have been read out. It should be noted that in some embodiments, each of the pixels 236a, 236b, 236c, 236d may include one more storage nodes or storage gates on the photodiode chip 170. In these implementations, the charge from the photodiodes 254a, 254b, 254c, 254d may be transferred to the storage nodes which may hold the charge until the trigger transistor is activated.

In the shared architecture of FIGS. 12A and 12B, the number of transistors required for a select pixel cell 238 may be reduced as compared to conventional image sensors. This may decrease the expense and/or complexity of the image sensor of FIGS. 12A and 12B as compared to conventional image sensors. In some embodiments, each of the transfer gates of the pixels may be connected to the metal interconnect layer. Alternatively, in other embodiments, the transfer gates may be interconnected together at the pixel chip 170 and a single vertical transfer gate may be interconnected with the transistor array chip.

Dual Mode—Color and Monochrome

Figure 12C:
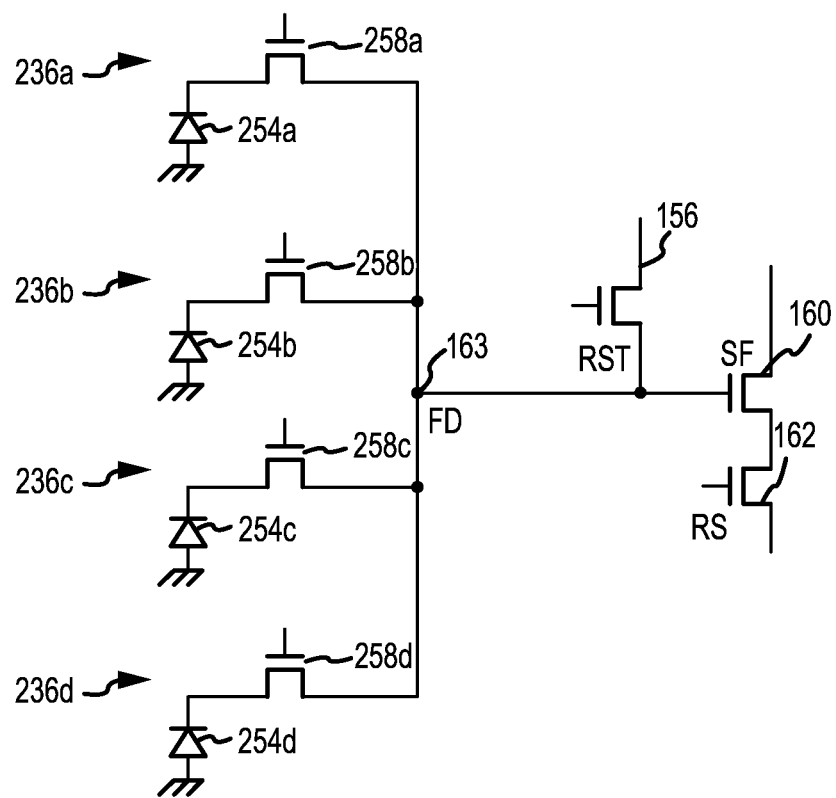
FIG. 12C is a simplified schematic view of a pixel sharing architecture for a monochrome mode image sensor including four pixels sharing a floating diffusion node
Figure 12D:
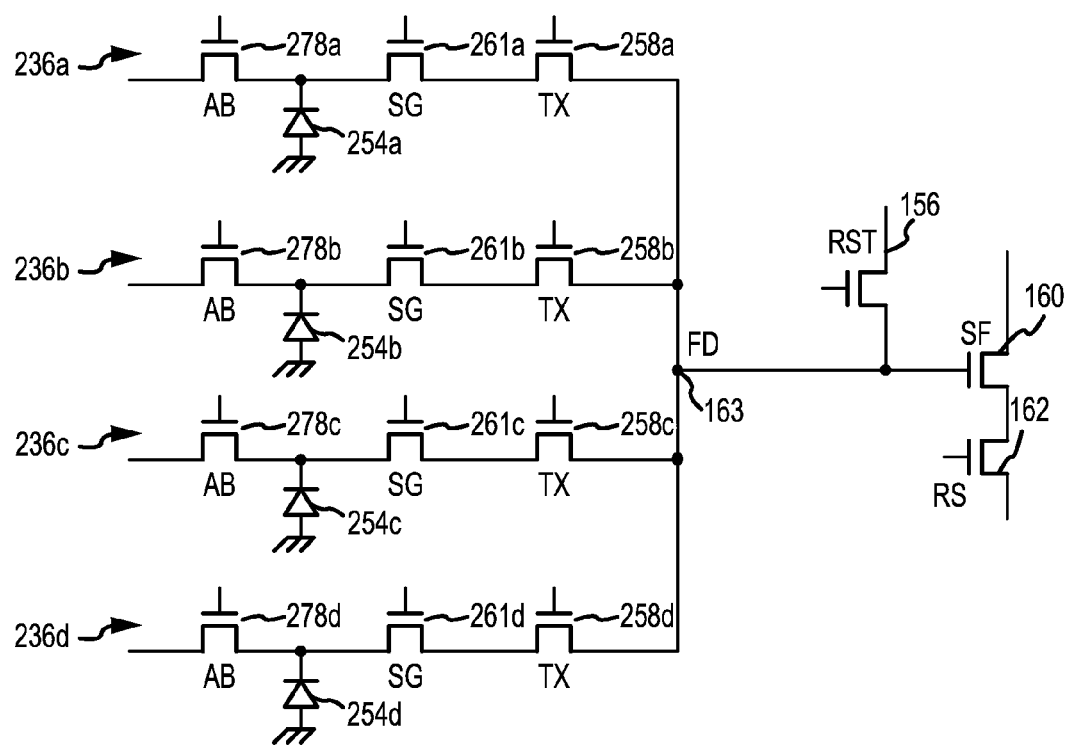
FIG. 12D is a simplified schematic view of a pixel sharing architecture for implementing a global shutter monochrome mode image sensor.

In some embodiments, the image sensor may have two or more modes. For example, the image sensor may have a monochrome mode and a color mode. In monochrome mode two or more of the pixels may be summed together, which may enhance the sensitivity of the image sensor in low light environments. In color mode, each of the pixels may be read out individually. FIGS. 12C and 12D illustrate a sharing architecture for an image sensor with a monochrome mode. In the architectures illustrated in FIGS. 12C and 12D, two or more of the photodiodes may be summed together to enhance the sensitivity of the image sensor. FIG. 12C illustrates a sample architecture for a rolling shutter implementation and FIG. 12D illustrates a sample architecture for a global shutter implementation.

With reference to FIG. 12C, in a rolling shutter implementation, each pixel 236a, 236b, 236c, 236d may share the floating diffusion node 163 such that if each transfer gate 258a, 258b, 258c, 258d is activated at the same time, the charge from each of the photodiodes 254a, 254b, 254c, 254d may each be transferred to the floating diffusion node 163 to then be read out.

With reference to FIG. 12D, in a global shutter implementation, each pixel 236a, 236b, 236c, 236d may further include a storage gate 261a, 261b, 261c, 261d between the transfer gate 258a, 258b, 258c, 258d and the photodiode 254a, 254b, 254c, 254d. The storage gate 261a, 261b, 261c, 261d may store the charge from the photodiodes 254a, 254b, 254c, 254d prior to the charge being transferred through the transfer gates to the floating diffusion 163. In the embodiments illustrated in FIGS. 12C and 12D, four pixels may each share a single floating diffusion node. However, in other embodiments, fewer or more pixels may share the floating diffusion node or may otherwise be shared together. Alternatively, it should be noted that the shared architectures disclosed herein (e.g., FIGS. 12A-17B) may also be used to implement a monochrome mode and/or share charge from one or more of the pixels. Moreover, although the below embodiments are discussed with response to a monochrome mode, in some embodiments, the image sensor may include subsets of shared pixels, which each subset having the same color filter, so that color information may not be lost.

Figure 12E:
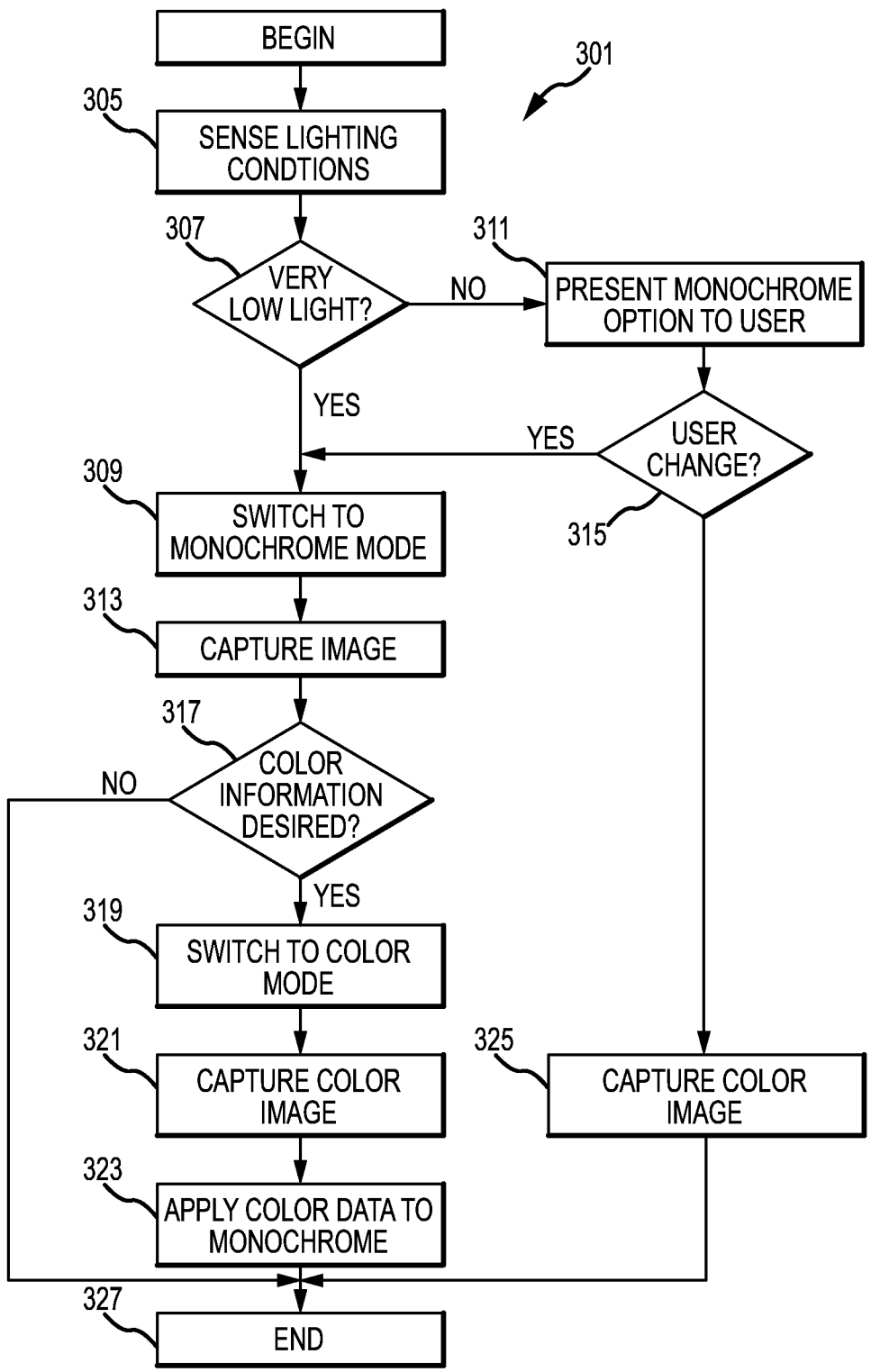
FIG. 12E is a flow chart illustrating a method of operating a dual mode image sensor.

FIG. 12E is a flow chart illustrating a method of operating a dual mode or monochrome image sensor. The method 301 may begin with operation 305 and the image sensor 130 or an ambient light sensor or other sensor may sense the light conditions. For example, the image sensor 130 may capture a test image that may be analyzed to determine the lighting conditions of the object to be photographed. Once the test image has been captured or the light conditions have otherwise been sensed, the method 301 may proceed to operation 307. In operation 307 the processor 114 may analyze the test image (or signals from the one or more pixels) to determine if the light is very low light. For example, the device 100 may include a setting for determining a low threshold in which a low light mode may be activated. Alternatively, the user may analyze the test image to determine if the light is sufficiently low to activate a "low light" mode.

If the light is determined to be sufficiently low, the method 301 may proceed to operation 309. In operation 309, the image sensor 130 may be switched into monochrome or low light mode. For example, during operation 309, two or more pixels or groups of pixels may be communicatively coupled to share a common floating diffusion node 163 (or the pixels may otherwise be summed together). For example, one or more sharing or grouping transistors or gates may be activated so that one or more pixels may be summed together.

However, if the light is not sufficiently low to activate monochrome or low light mode, the method 301 may proceed to optional operation 311. In operation 311, the device 100 may present an option to the user to allow an override and switch the image sensor 130 into monochrome mode. For example, the display 110 may present a "switch to monochrome mode" and allow the user to provide input to the device 100 that may override the automatic analysis of the processor regarding low light mode. After operation 311, the method 301 may proceed to operation 315 and the processor 114 may analyze a received user input. In operation 315, the processor 114 may determine whether the user provided input to change the image sensor 130 to monochrome mode.

If the user did not change the image sensor 130 into monochrome mode, the method 301 may proceed to operation 325. In operation 325, the image sensor 130 may capture an image with each individual pixel being read out individually, and optionally including one or more color filters. In this operation, the captured image may have an increased resolution and color data as compared to the monochrome mode. However, if the user did provide input to change the image sensor 130 to monochrome mode, the method 301 may proceed to operation 309.

After operation 309 and the image sensor has been switched to monochrome mode, the method 301 may proceed to operation 313. In operation 313, the image sensor 130 may capture an image. For example, the image sensor 130 may begin integration for the pixel array and each of the pixels may receive light through the lens 126. After integration, the signals for select groups of pixels may be summed together. In low light, the pixels may not exceed the full well capacity of the floating diffusion node although the signals from two or more pixels are combined. This is because due to the low level of the light signals captures, the pixels (even when combined) may not receive enough light to exceed the capacity of the floating diffusion 163. Additionally, the image captured during monochrome mode may have reduced noise, as the "cross-talk" between pixels may be eliminated. This is because each of pixels are summed together and thus color noise due to one colored pixel receiving more light than another color pixel may be rendered moot when the pixels are summed together.

It should be noted that summing the pixels together may allow a monochrome mode to the activated without changing or removing any color filters that may be positioned on the pixel array 134. For example, although each of the pixels may include a color filter, when summed together, the image sensor 130 may capture images that are grayscale or monochrome. In addition to allowing the image sensor to increase it's sensitivity during low light, the monochrome option may provide a user with an option to capture black and white or grayscale images without requiring a user to change or modify the image sensor. Additionally, the monochrome mode may be implemented to capture black and white images directly, without removing the color data after the image has been captured.

After operation 313, the method 301 may proceed to operation 317. In operation 317, the processor 114 may determine whether color information for the captured image is desired. For example, the device may receive a user input that the user wishes to have color data in the captured image. If colored information is desired, the method 301 may proceed to operation 319. However, if colored information is not desired, the method 301 may proceed to an end state 327 and terminate.

In instances where colored information is desired, the method 301 may proceed to operation 319. In operation 319, the image sensor 130 may switch into color mode. In color mode, the one more groups of pixels that were shared together may be decoupled and/or one the groups of pixels having similar colors may be shared together.

After operation 319, the method 301 may proceed to operation 321. In operation 321, the image sensor 130 may capture a second image, this image may include color data from the captured object or scene. Once the color image has been captured, the method 301 may proceed to operation 323 and the color data from the color image may be applied to the monochrome image. In other words, the color image may capture luminance which may be "painted" onto the originally captured monochrome image. The monochrome image may have an increased sensitivity as compared to the color image as the light may be sufficiently low that the sum of two or more pixels may produce more light data than the single colored pixels in the color image. By using the color data from the color image, the final image may have an increased sensitivity, along with some color data transposed onto it. After operation 323, the method 301 may proceed to the end state 327.

Implementing a shared pixel architecture allows the image sensor to be dual-mode, providing both color and monochrome images. Using the monochrome mode, the image sensor 130 may maximize the signal to noise ratio during low light and allow images that may be not be visible during color mode to be visible. It should be noted that this type of dual-mode operation may be implemented with substantially any of the shared pixel architectures discussed herein, and that although the discussion of the monochrome has been made with respect to FIGS. 12C-12E, other shared architectures, such as those shown in FIGS. 12A and 13-17B may be used to implement the same or similar functionality.

Additionally, it should be noted that in some embodiments, the pixels summed together may be selected that have the same color filter, which may reduce the loss of color data. However, in instances where the light may be significantly low, summing pixels of multiple color planes together, or otherwise summing more pixels together may produce greater sensitivity. In some instances, the method 301 shown in FIGS. 12C and 12D may be done by sharing one floating diffusion. In this case, once the transfer gates are activated, the charge from each of the pixels may be deposited into the floating diffusion node 163 at substantially the same time. Using summing, the signal may be increased without increasing the noise and summing may be done during pixel integration. Alternatively, a binning operation may be used. In this operation, pixels may be read out individually and the signals may be averaged together for a select group of pixels. Using binning, the noise ratio may increases by a square root of two. Using binning, the averaging may be done after integration and may allow the user to view an image and then sum the signals together to enhance resolution.

Programmable Conversion Gain

Figure 13:
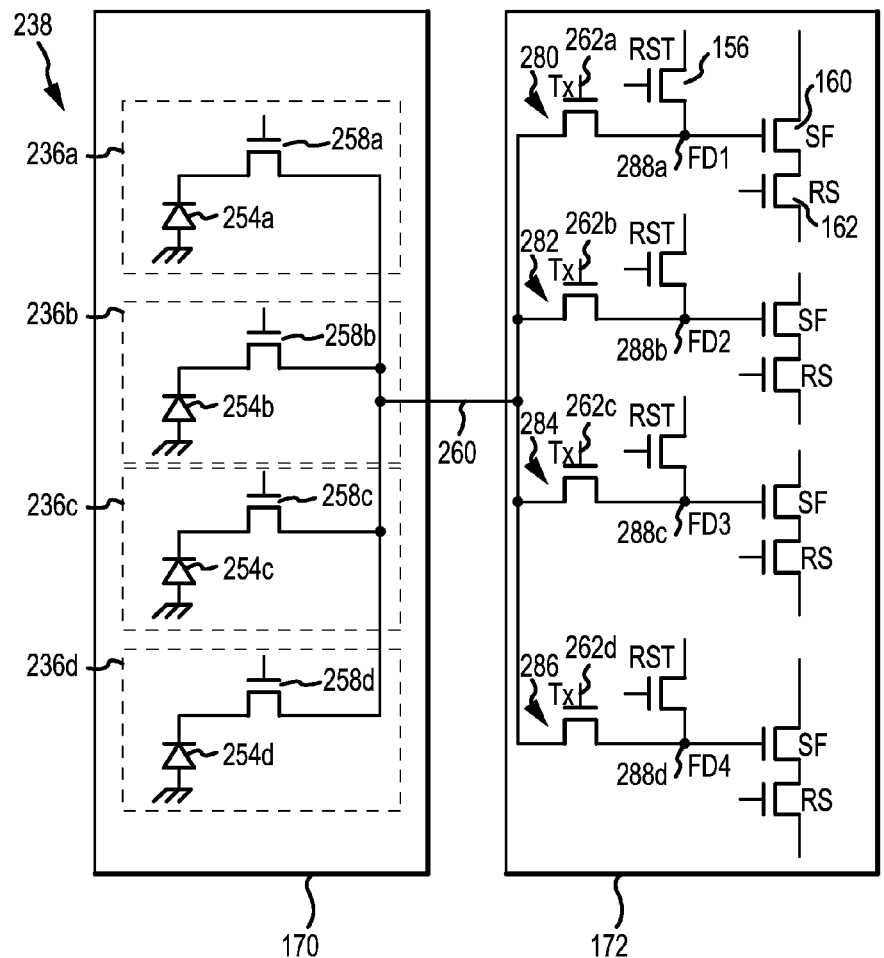
FIG. 13 is a simplified schematic view of another example of a shared pixel architecture including multiple control pathways.

In other embodiments, the pixel cell 238 may include a number of control circuitry pathways which may be used to vary the conversion gain for each pixel. FIG. 13 is a simplified schematic view of another example of a shared pixel architecture including multiple control pathways. With reference to FIG. 13, the pixel group 238 may be in selective communication with a plurality of communication paths 280, 282, 284, 286. Each communication pathway may include a transfer transistors 262a, 262b, 262c, 262d, a floating diffusion 288a, 288b, 288c, 288d, a reset gate 156, a SF gate 160, and a row select gate 162. The reset, SF, and row select gates 156, 160, 162 may be substantially the same for each communication pathway 280, 282, 284, 286. However, in some embodiments, each of the floating diffusion nodes 288a, 288b, 288c, 288d may be differently doped or otherwise configured to have varying properties, as will be discussed in more detail below.

In some embodiments, the floating diffusion nodes 288a, 288b, 288c, 288d may be regions formed in the transistor array chip 172 silicon that are electrically isolated from other nodes. The floating diffusion nodes 288a, 288b, 288c, 288d may each have a capacitance value. The capacitance value for each of the floating diffusion nodes may determine the conversion gain of each node, i.e., the change of the potential or voltage of the node with the addition of one electron. Because each of the floating diffusion nodes 288a, 288b, 288c, 288d, or subset thereof, may have different capacitance values, the transistor array in this example may have multiple conversion gains. In other words, each of the communication paths 280, 282, 284, 286 may have a different conversion gain from the other communication pathways.

In these embodiments, the communication pathway 280, 282, 284, 286 may be dynamically selected for each pixel based on the desired conversion gain. In other words, the particular communication pathway 280, 282, 284, 286 that is selected (e.g., by activating a select transfer transistor 262a-262d) may be activated based on a desired conversion gain. In this manner the conversion gain for each of the floating diffusions 288a-288d may be used to determine which communication pathway is activated for any of the pixels. Adjusting the conversion gain may vary the change in the output voltage due to the absorption of one charge, which may vary the sensitivity of the image sensor, speed of saturation, or the like.

Figure 14:
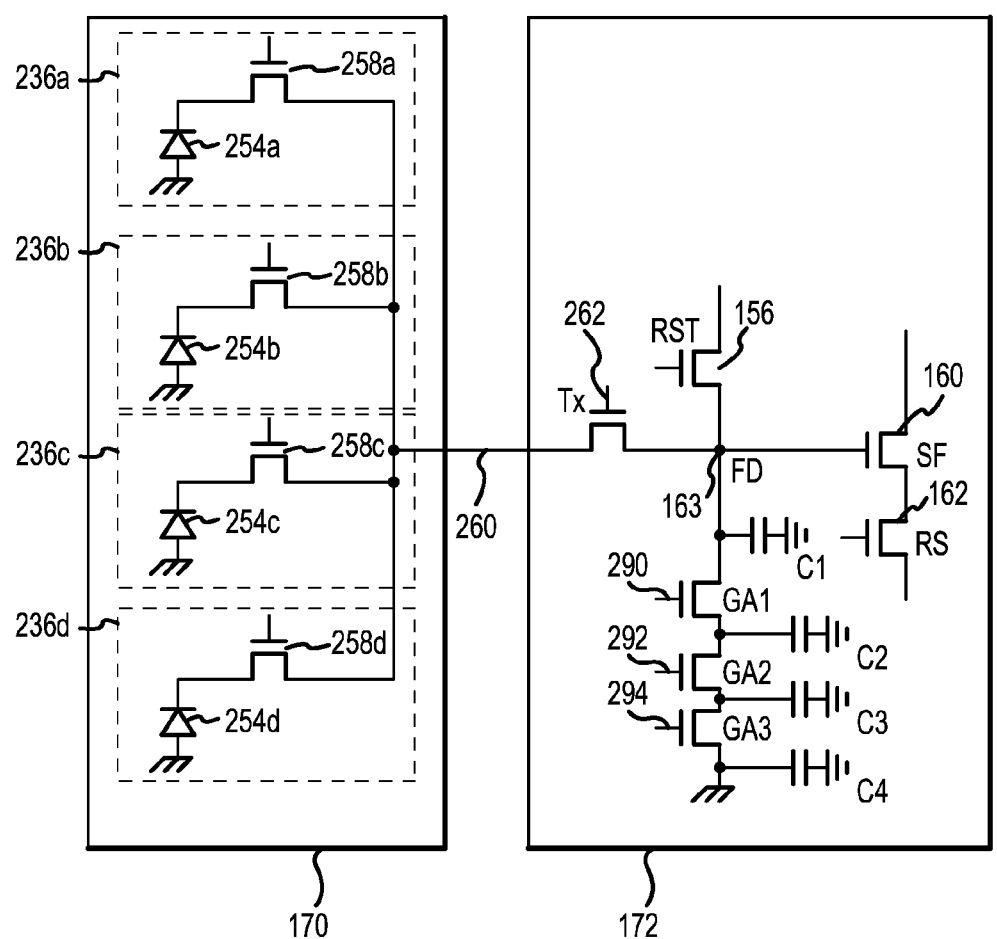
FIG. 14 is a simplified schematic view of an image sensor having a shared architecture including a floating diffusion node having an adjustable conversion gain.

In yet another embodiment, the floating diffusion node may be dynamically adjusted for each of the pixels by adjusting the conversion gain of one or more floating diffusion nodes. FIG. 14 is a simplified schematic view of an image sensor having a shared architecture including an adjustable floating diffusion node. With reference to FIG. 14, the transistor array and control circuitry may include one transfer transistor 262, a floating diffusion node 263, and one or more conversion gain adjustment gates 290, 292, 294. The gain adjustment gates 290, 292, 294 may be operably connected to the floating diffusion node 263 between the transfer gate 262 and the SF 160.

The gain adjustment gates 290, 292, 294 may be one or more transistors coupled to one or more capacitors, the transistors may be selectively activated to vary the conversion gain at the floating diffusion node 263. For example, when the first gain adjustment gate 290 is activated, the capacitance value of the floating diffusion node 263 may be varied. Generally, the conversion gain of the floating diffusion node 263 may be inversely related to the capacitance at the node 263. By selectively activating one or more of the gain adjustment gates 290, 292, 294 (which may have the same or different capacitive values), the capacitance at the floating diffusion node 263 is varied.

For example, when all of the gain adjustment gates 290, 292, 294 are deactivated or in the off position, the floating diffusion node 163 may have a capacitance equal to the capacitive value of capacitor C1. When the first gain adjustment gate 290 is on, but the remaining gain adjustment gates 292, 294 are off, the floating diffusion node 163 has a capacitance that is equal to sum of the capacitive values of C1 and C2 (e.g., C1+C2). When the first two gain adjustment gates are on, the floating diffusion node 163 has a capacitive value equal to capacitive values C1, C2, and C3 summed together. Finally, when all of the gain adjustment gates are activated, the floating diffusion may have the maximum capacitive value which is equal C1, C2, C3, and C4 summed together.

As demonstrated by the above example, in some embodiments, the gain adjustment gates may be activated in select groups to additively vary the capacitance at the floating diffusion node. In this example, each gain adjustment gate may provide an incremental change to the capacitive value of the floating diffusion node and, as such, a user may tailor the number of gain adjustment gates to be activated to select the conversion gain of the floating diffusion node. It should be noted that the gain adjustment gates 290, 292, 294 may be communicatively coupled to the row drivers to be selectively activated as desired. Additionally, the "on" voltage for each of the gain adjustment gates may be selected to be sufficiently high to avoid voltage drops across each gain adjustment gate. It should be noted that the capacitive values of the capacitors C1, C2, C3, and C4 may be the same or may be different from each other. In some embodiments, each of the capacitors may have a different value, which may be progressively smaller, so that the value of the capacitance at the floating diffusion node may adjust in smaller increments as each additional gain adjustment gate is activated.

Using either a dynamically changing floating diffusion node (e.g., FIG. 14) or multiple floating diffusion nodes having different conversion gain values, the conversion gain for one or more pixels may be adjusted. Adjusting the conversion gain may allow the image sensor to maximize the pixel properties based on different lighting conditions and/or exposure times. For example, the image sensor may be configured to maximize the conversion gain at low light to increase the pixel output signals. Conversely, the image sensor may be configured to reduce the conversion gain during high light conditions to accommodate the increased signal charge amount from each photodiode. It should be noted that other changes may be implemented as desired by the user.

Figure 15A:
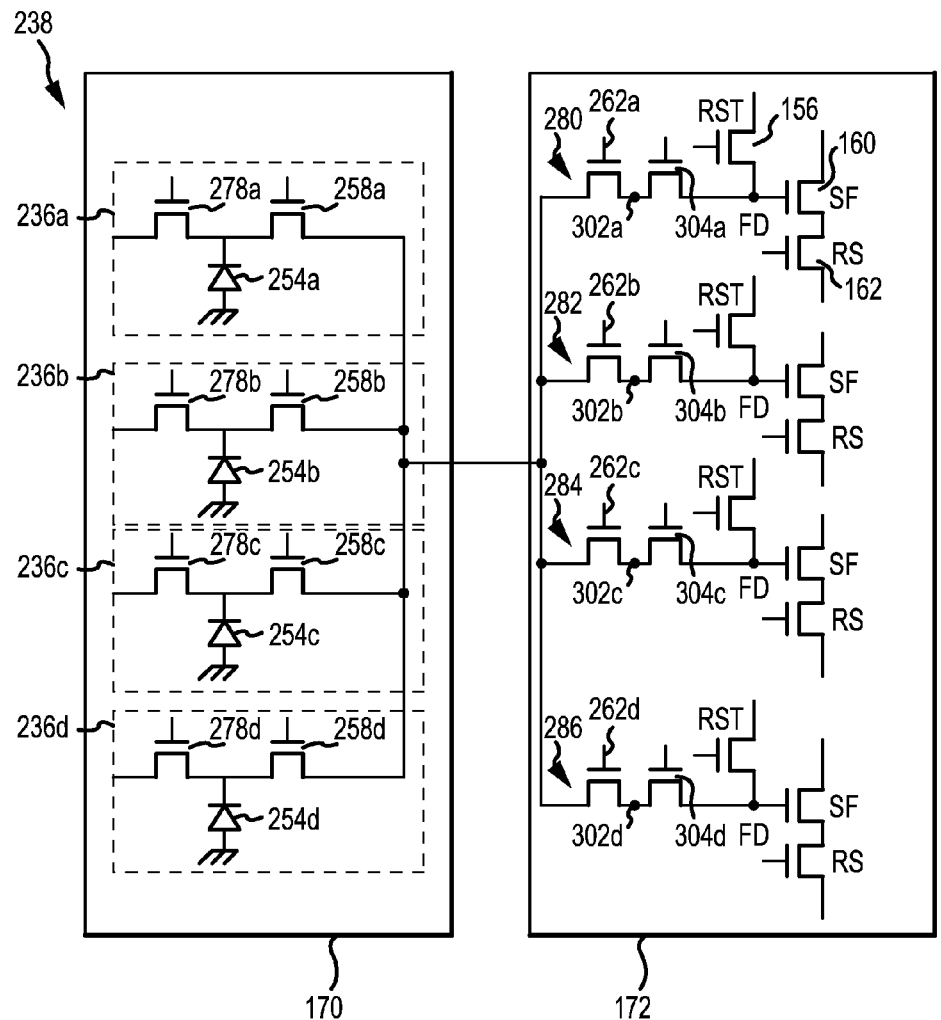
FIG. 15A is a simplified schematic view of a pixel cell having a shared control circuitry and global shutter configuration.

The shared pixel architecture as described above with respect to FIGS. 12-14 may be also be used in a global shutter configuration. FIG. 15A is a simplified schematic view of a pixel cell having a shared control circuitry and global shutter configuration. With reference to FIG. 15A, the image sensor may include one or more anti-blooming gates 278a, 278b, 278c, 278d in communication with each photodiode 254a, 254b, 254c, 254d. It should be noted that although the anti-blooming gates 278a, 278b, 278c, 278d are illustrated in FIG. 15A with respect to a global shutter configuration, in other embodiments, the anti-blooming gates may be incorporated into a rolling shutter configuration such as those shown in FIGS. 12-14. As described above with respect to FIG. 7, the anti-blooming gates 278a, 278b, 278c, 278d may drain excess charge from the photodiodes 254a, 254b, 254c, 254d after the photodiodes have been saturated.

With continued reference to FIG. 15A, the transistor array chip 172 may include an additional transfer gate defining a storage node between the transfer gate and the floating diffusion 263. For example, the transistor array chip 170 may include a storage transfer gate 304a, 304b, 304c, 304d positioned between the transfer gates 262a, 262b, 262c, 262d and the SF 160 for each communication pathway. A storage node 302a, 302b, 302c, 302d may be defined between the transfer gates 262a, 262b, 262c, 262d and the storage transfer gates 304a, 304b, 304c, 304d. The storage nodes 302a, 302b, 302c, 302d store the charge transferred from the photodiode chip 172, that is, the charge from each of the photodiodes 254a, 254b, 254c, 254d prior to the charge being read out. In this manner, each of the photodiodes 254a, 254b, 254c, 254d may integrate at substantially the same time, but once the data has been transferred to the storage nodes 302a, 302b, 302c, 302d, the data from each pixel may be read out sequentially.

As is explained in more detail below, the shared architecture illustrated in FIG. 15A may provide for an "effective" global shutter. In these embodiments, pixels in each group may be read out within the pixel cell individually, but the values for each pixel cell or group may be read out collectively. In this implementation, as the "rolling shutter" occurs only in the individual pixels within each cell and the "rolling" time for the image sensor may only be the time to read out four pixel rows (or the number of pixels within the pixel cell). Each pixel cell is read out globally and therefore the only time difference between the readout between the first pixel row in the image sensor and the last pixel row in the image sensor is the time to read out each of the four pixel rows in each pixel cell. This time difference is a substantially smaller time difference as compared to a conventional rolling shutter where time difference between the readout of the first pixel row and the last pixel row is determined by the entire number of rows in the pixel array. Thus, in these effective global shutter configurations, the final image is very close to those of an actual global shutter.

Figure 15B:
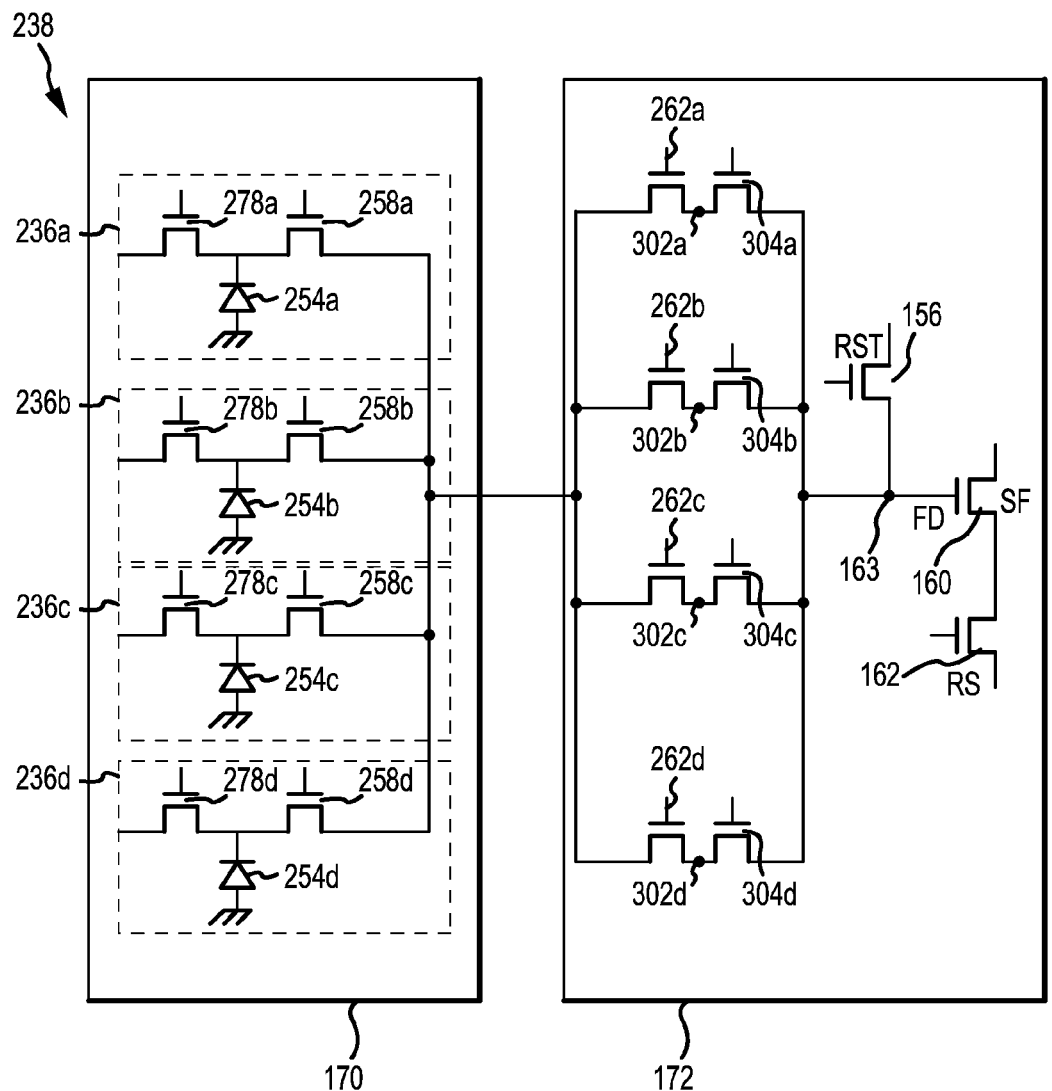
FIG. 15B is a simplified schematic of a global shutter shared architecture configuration.

In some embodiments, the global shutter configuration illustrated in FIG. 15A may be modified to allow a pixel group or cell to share a SF gate, a reset gate, and/or a row select gate. FIG. 15B is a simplified schematic of a global shutter shared architecture configuration. With reference to FIG. 15B, each of the pixels 236a-236d may be in communication with the reset gate 156, the SF gate 160, and the row select gate 162. In this manner, the number of transistors on the transistor array chip 172 may be reduced, as there may only be a single set of control gates 156, 160, 162 for a group of four or more pixels. The circuit may operate in substantially the same manner as described above with respect to FIG. 15A. However, in this example, the data from each of the photodiodes 254a-254d may remain within the storage nodes 302a-302d until the storage transfer gates 254a-254d are activated to provide the data to the SF 160 and eventually to the read out circuitry (e.g., column select 142).

Effective Global Shutter Using Rolling Shutter Configuration

Figure 16A:
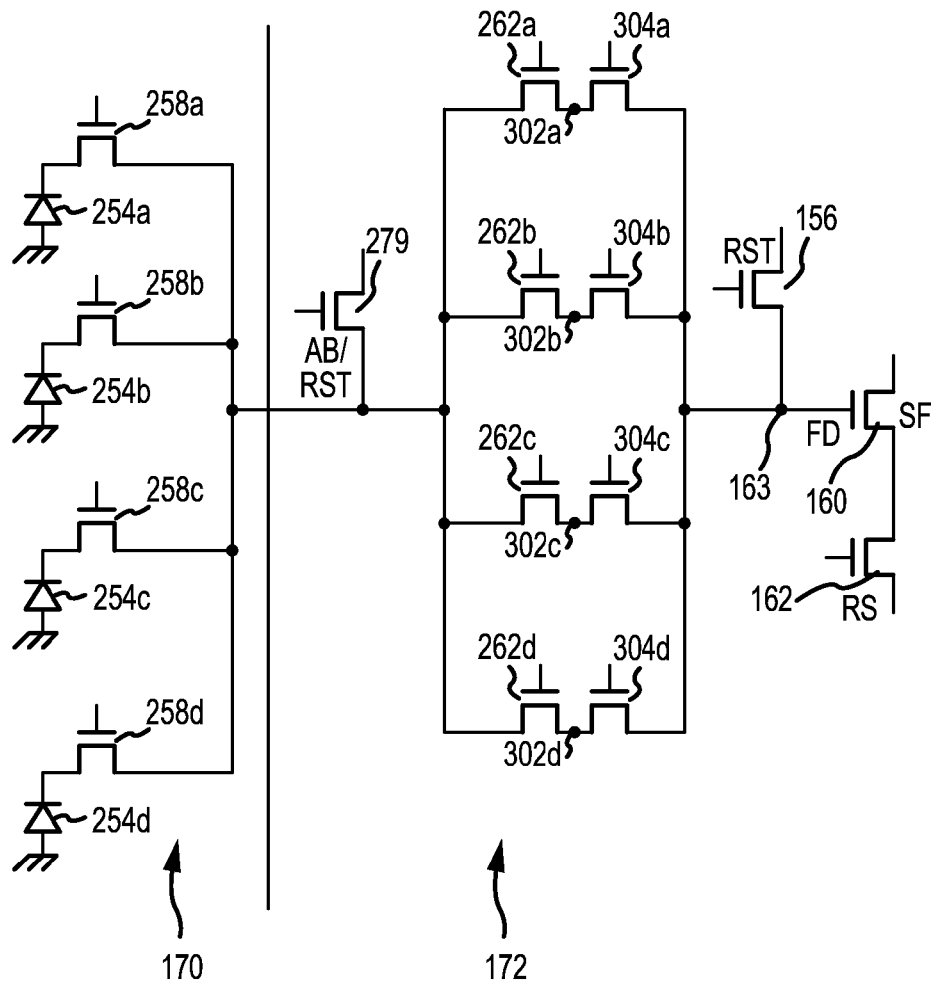
FIG. 16A is a simplified schematic view of a four pixel cell including an effective global shutter configuration.
Figure 16B:
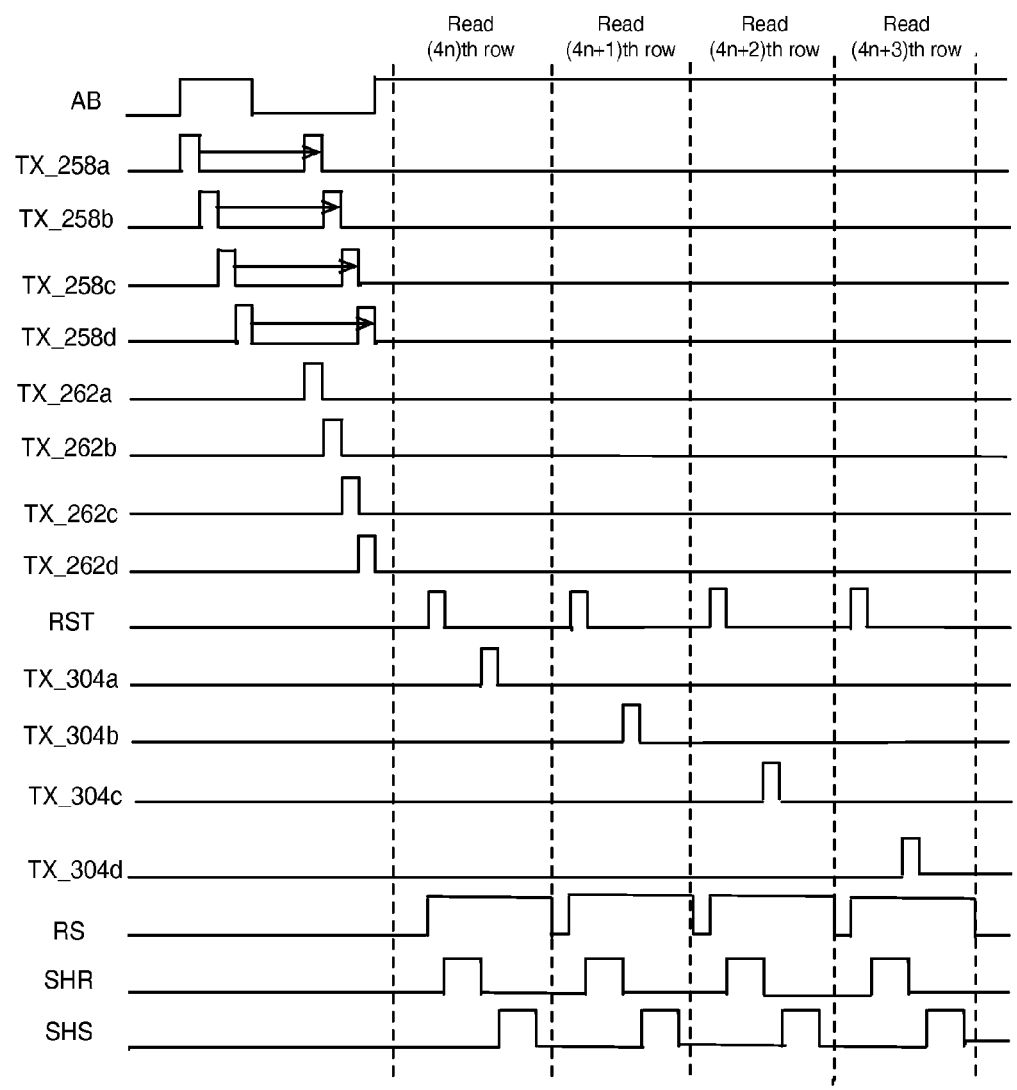
FIG. 16B is a timing diagram for the schematic of FIG. 16A.

As briefly explained above, in embodiments, the shared architecture may be configured to provide a hybrid between a global shutter and rolling shutter implementation. In this example, select pixels may be read out sequentially, but the pixels may be grouped into cells, and each of the cells may be read out globally. FIG. 16A is a simplified schematic view of a four pixel cell. FIG. 16B is a timing diagram for the schematic of FIG. 16A. With reference to FIG. 16A, the pixel cell 138 may include four pixels 136, which may each share an anti-blooming/reset gate 279. In some embodiments, the anti-blooming/reset gate 279 may be a vertical gate extending between the photodiode chip 170 and the transistor array chip 172. This may allow the two chips 170, 172 to have a single inter-chip connection between the two chips. By reducing the number of inter-chip connections, the pitch between the two chips may be increased, and the complexity in creating the connection may be reduced.

In operation, with reference to FIGS. 16A and 16B, the anti-blooming/reset gate 279 may be activated and the photodiodes 254a-154d may be reset and the charge stored therein may be dumped. Once the photodiodes 254a-254d are reset, each photodiode 254a-254d may begin integration and start collecting light from the lens 126. The charge from each of the photodiodes 254a-254d may be transferred sequentially by activating the select trigger transfer gate 258a-258d and the transfer gates 262a-262d. The charge from each photodiode 254a-254d may then be transferred into the respective storage node 302a-302d and then read out when the row select 162 is activated. In these embodiments, each of the pixel cells 138 within the pixel architecture 134 may be configured to have a global integration time. However, each pixel 136 within each pixel cell 138 may be sequentially integrated and the charge may be transferred to the storage node 302a-302d sequentially rather than at the same time. Although this implementation may not be a true global shutter implementation, as each photodiode within a select pixel cell does not have exactly the same integration time, the time difference for the four pixels within the pixel cell 138 to sequentially transfer their charge to the storage node may be very small, and the resultant image may be an effective global shutter image.

For example, in conventional rolling shutter implementations, the charge from each photodiode is read out row by row for the entire pixel architecture. Thus, there may be a substantial time difference between when the charge from the first pixel is transferred to the storage node and when the charge from the last pixel row is transferred. In the implementation in FIGS. 16A and 16B, each pixel cell 138 may be activated at the same time, but the charge for each pixel within the pixel cell may be transferred to a storage node sequentially. In other words, the charge for each pixel 136 may be transferred sequentially, but each of the pixel cells 138 may be activated globally. Thus, the only difference between when the first pixel in a pixel cell is transferred to the storage node and when the last pixel in a pixel cell is transferred to a storage node, may be three pixels (rather than each row of the pixel architecture), this time difference may be minimal. The time difference may be substantially reduced to produce an effective global shutter.

With reference to FIG. 16B, in the example timing diagram, the anti-blooming/reset gate 279 may be activated first and then switched off during integration for the photodiodes 254a-254d. When integration is over, which may be last around 10 ms, or substantially any other time period desired by a user, the trigger transfer gate 258a-258d for a select pixel 136 row may be activated and the transfer gate 262a-262d for the select pixel 136 may also be activated. Once the charge from the photodiode 254a-254d is transferred into the storage node 302a-302d, the next pixel may be activated and its corresponding transfer gates may be activated to transfer its charge into the storage node. With reference to FIG. 16B, the first pixel and the second pixel may have approximately the same length of integration, but the integration times may be shifted from each other. In other words, the first pixel may begin integration slightly before the second pixel, but may terminate integration slightly before the second pixel terminates integration. In this example, the pixels may have the same total integration time, but may be shifted in time. However, this time shift may be very small, e.g., between 5-10 us and thus may have a large impact on motion artifacts in a captured image.

Once in the storage node 302a-302d the charge from each pixel may be read out row by row. However, in the storage node 302a-302d the charge may be protected from additional light from the lens and so although read out may be completed row by row, and the light captured may represent the light captured during integration.

Using a shared architecture as described above with respect to FIGS. 12-16, the pixels 236a, 236b, 236c, 236d within the pixel cell 238 may be summed or in embodiments where each of the pixels may have a different color filter, the colors may be mixed in-pixel (e.g., prior to reaching the processing components). Additionally, the light collected from each of the photodiodes 254a-254d may be summed at the same transfer gate drain together to maximize the produced signal. For example, in instances where the light level may be low, the light signal at each photodiode 254a-254d may be summed to increase the signal and provide increased sensitivity (albeit at a lower resolution).

Charge Rebalancing

Figure 17A:
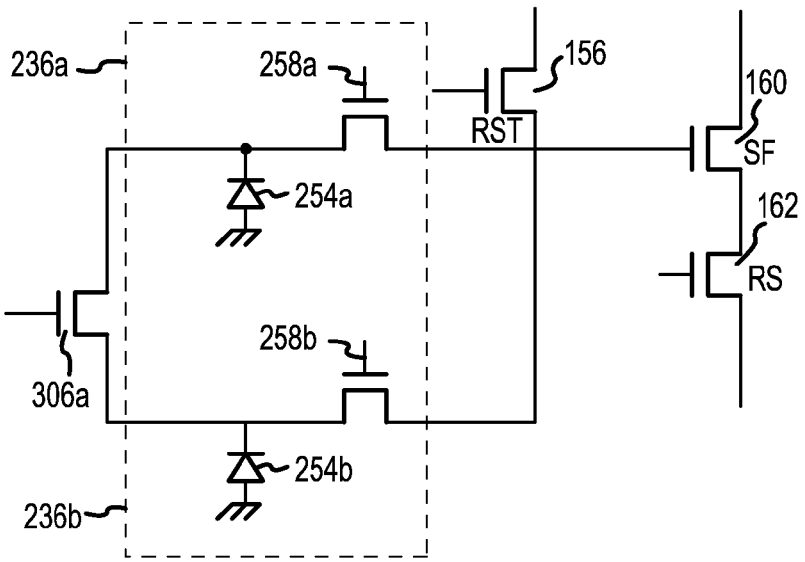
FIG. 17A is a simplified schematic of the image sensor including a two pixel mixing configuration.
Figure 17B:
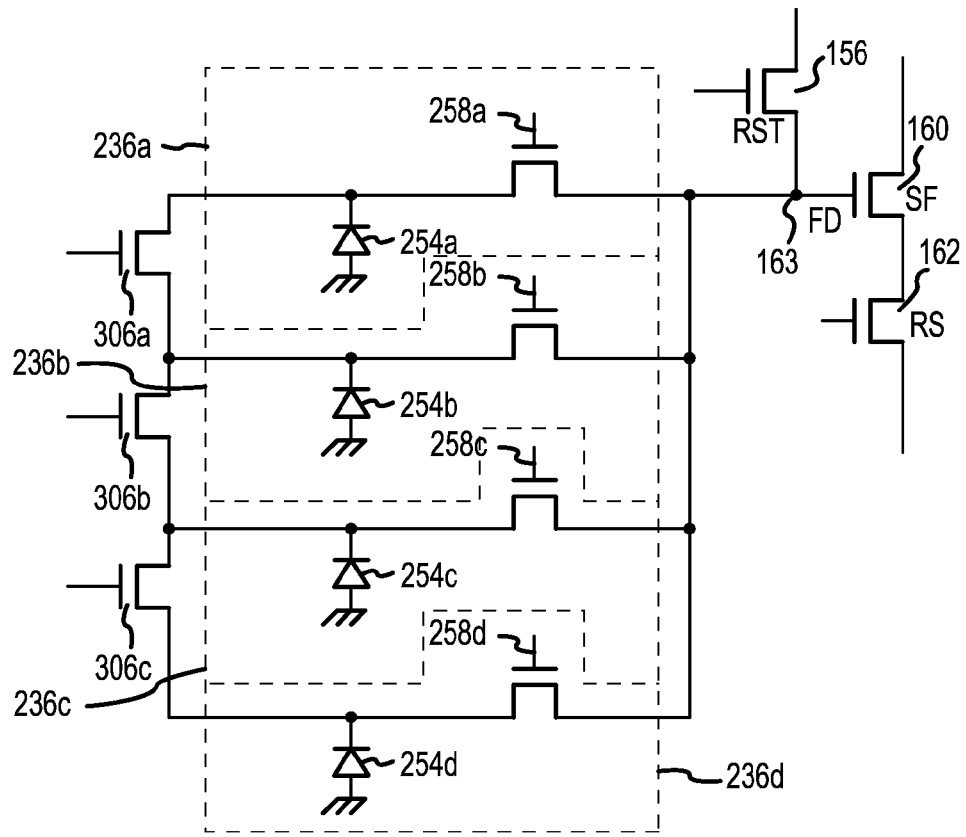
FIG. 17B is a simplified schematic of a four or quadra pixel mixing configuration.

In some embodiments, the photodiode chip 170 may further include one or more mixing gates to provide additional sensitivity for the image sensor 130. FIG. 17A is a simplified schematic of the image sensor including a two pixel mixing configuration. FIG. 17B is a simplified schematic of a four or quadra pixel mixing configuration. With reference to FIGS. 17A and 17B, the image sensor 130 may include one or more mixing gates 306a, 306b, 306c that may be in communication with two or more pixels 326a-326d. In some embodiments, the mixing gates 306a, 306b, 306c may couple two or more photodiodes 254a-254d together. The mixed photodiodes 254a-254d may have the same color filter (e.g., both have green filters) or may lack a color filter, or may have different color filters. In the latter example, the color features may be lost when the photodiodes are mixed, but the sensitivity (as discussed below) may be increased.

It should be noted that the mixing gates may be implemented in the image sensor in embodiments including the vertical transfer gate illustrated in FIGS. 9A-10 or may be implemented in embodiments of the image sensor including a lateral or otherwise oriented transfer gate.

The mixing gates 306a, 306b, 306c selectively connect the photodiodes 254a-254d to allow the signal from two or more of the photodiodes to rebalanced among the various pixels. The charge for each of the photodiodes 254a-254d may then be read out selectively, such as by selectively activating the trigger transfer gates 258a-258d, or may be read out collectively (activating all of the trigger transfer gates 258a-258d).

For example, with reference to FIG. 17B, in operation, the photodiodes 254a-254d may be activated and may begin collecting light from the lens 126. The photodiodes 254a-254d may be activated in groups or rows for a rolling shutter operation or may be activated simultaneously (or substantially simultaneously) for a global shutter operation. With the shared architecture of FIG. 17B, the four pixels 236a-236d may each share a single readout region, that is, a single reset gate 152, floating diffusion 163, SF 160, and row select 162. When activated, each of the photodiodes 254a-254d may begin integration, that is, the photodiodes 254a-254d may be reset and then may begin collecting light transmitted through the lens 126.

With continued reference to FIG. 17B, during exposure, the first trigger gate 258a of the first pixel 236a may be activated and the charge accumulated in the first photodiode 254a may be dumped into the floating diffusion node 163 and the photodiode 254a may be reset. Once the first pixel 236a is reset, one or more of the mixing gates 306a-306c may be activated. Depending on the number of mixing gates activated, the charge in the photodiodes 254b, 254c, 254d may be rebalanced into the first photodiode 254a and among each other. For example, in some embodiments, two of the pixels may be reset during integration and mixed with the other two non-reset pixels. In some embodiments, each of the photodiodes may be mixed together by the mixing gates 306a-306c prior to the select pixels being reset. In these embodiments, the charge rebalance between the photodiodes 254a-254d may be substantially uniform across each of the four pixels. In some embodiments, the pixels may be rebalanced a second time after the select pixels have been reset. It should be noted that in some embodiments, if the charge is rebalanced between two or more pixels prior to the charge being dumped or reset, the pixels may be rebalanced a second time after the charge dump.

Each photodiode 254a-254d may be reset any number of times. For example, the first pixel 236a may be reset two or more times during the integration or exposure period. The photodiode 254a-254d chosen to be reset may be based on the sensitivity or saturation limits of each of the photodiodes 254a-254d. For example, certain color filters may cause one or more of the photodiodes to saturate faster than the others (e.g., if a scene has more green light than other wavelengths). By resetting one or more pixels during integration and rebalancing the charge for a group of pixels, the saturation time of the photodiodes may be extended. In other words, the pixels may require a longer time to reach saturation, because some of the charge is dumped from one or more of the pixels. This may allow the image sensor to have a longer exposure or integration time, which may vary the sensitivity of the image sensor, especially in different lighting environments. For example, if a certain light color is dominant, the photodiode may saturate faster than the others which could result in a discoloration of the captured image. By resetting the saturating pixel and rebalancing the charge, the captured image may be enhanced.

In some embodiments, the change in sensitivity for the image sensor may be weighted to a select time period during exposure. For example, if the charge for one or more pixels is reset during the beginning of the exposure time, the sensitivity of the beginning of the exposure time may be reduced as compared to the end of the exposure time. In this example, the final captured image may have a weighted light value towards the end of the integration time, which could create image effects, such as showing an object tracking with the initial positions illustrated in fainter lines than the final versions. This could be used to allow a user to determine the desired artifacts, especially with respect to motion, for captured images. As one example, a user may wish to capture the end position of a moving object with more clarity than the beginning position. In this example, the charge may be dumped in the beginning of integration to weigh the final captured image towards the end position of the moving object.

With reference to FIGS. 17A and 17B, in some embodiments, each of the pixels 236a-236d may be selectively read out or the pixels may be read out together (combining the charge further). For example, in one implementation, the trigger gate 258a-258d for each pixel may be selectively activated, and once activated, the photodiode 254a-254d for the selected pixel can transfer the stored charge to the floating diffusion node 163. Alternatively, each of the trigger gates 258a-258d (or a combination thereof) may be activated and the charge from those pixels may each be provided to the floating diffusion node 163.

With reference to FIGS. 17A and 17B, the mixing gates 306a, 306b, 306c allow the sensitivity of the image sensor 130 to be adjusted without requiring an adjustable aperture or lens 126 aperture size. For example, some cameras may include a feature that adjusts the size of an aperture for the lens 126, which may control the amount of light that may reach the image sensor. However, in many mobile devices that incorporate an image sensor (such as smart phones, etc.) the cameras may not include an adjustable aperture. By using the mixings gates, the image sensor can still adjust the sensitivity without the additional components (such as an iris diaphragm or other adjustable feature to selectively cover the aperture). Additionally, in these embodiments, the image sensor 130 may by dynamically adjustable by a user or automatically by one or more image processing components (such as the processor 142). This may allow the image sensor 130 to improve the sensitivity of images captured without the user having to change one or more features.

It should be noted that the shared architectures discussed above with respect to FIGS. 12A-17B may be implemented using a split pixel array (e.g., a photodiode chip and a transistor array chip_, but do not necessarily have to be implemented with a split chip. In many instances, using the split chip including the vertical transfer gate may allow the transistor array to be positioned above the photodiode chip, which may create additional space on the photodiode chip for additional sharing transistors or other components. Accordingly, in conventional pixels, the reduction of photodiode space on the photodiode chip to accommodate the additional sharing components (e.g., mixing transistors, etc.) may require a significant reduction in resolution or an increase in the size of the image sensor. However, in instances where resolution or size may not be as much of a concern, the sharing architectures illustrated and discussed herein may be implemented in a lateral chip orientation, i.e. with one or more lateral transfer gates rather than a vertical transfer gate.

Image Sensor Chip Manufacturing Process

Figure 18:
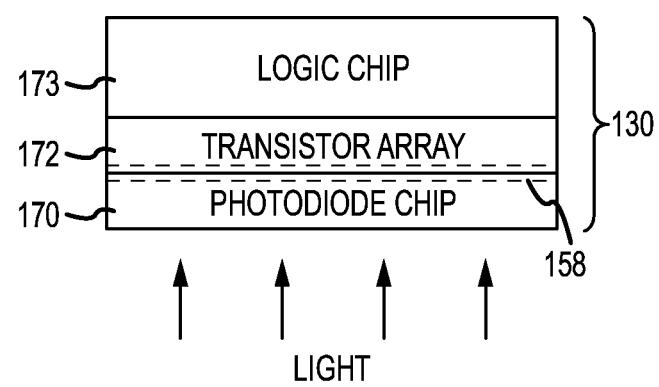
FIG. 18 is a simplified diagram illustrating the image sensor including a three chip stacked array.

In some embodiments, the image sensor 130 may include a logic chip that may be vertically stacked on top of the transistor array chip 172. These embodiments may allow for a reduction in horizontal size of the image sensor 130, as the logic chip may be positioned vertically rather than laterally on the pixel array (transistor array and photodiode chip). These embodiments may further allow additional chips, such as one or more memory chips, to be added to the stacked image sensor structure. FIG. 18 is a simplified diagram illustrating the image sensor 130 including a three chip stacked array. With reference to FIG. 18, a logic chip 173 may be stacked on top of the transistor array chip 172, such that the transistor array chip 172 may be sandwiched between the logic chip 173 and the photodiode chip 170. The transistor array chip 172 may facilitate communication between the logic chip 173 and the photodiode chip 170.

The logic chip 173 or logic board may include one or more of the processor or control components for the image sensor 130. For example, with reference to FIGS. 4 and 18, the logic chip 173 may include the row select 144, the column select 140, the image processor 142, and/or other components that may control the pixel array and/or receive data therefrom (e.g., row drivers for the transfer gates and reset gates, analog to digital converters, input/output components, etc.) The logic chip 173, the transistor array chip 172, and the photodiode chip 170 may each be in communication with each other through one or more communication pathways, such as, but not limited to, vertical transfer gates, through silicon vias (TSVs), or bond pads. In many embodiments the image sensor 130 may include a plurality of connection pathways, such as, one or more vertical transfer gates and one or more TSVs.

With reference again to FIG. 18, the image sensor 130 may include a back-side illumination (BSI) structure. For example, the logic board 173 and transistor array 172 may be mounted on the front of the photodiode chip 170 and the photodiodes 154 may be positioned on a backside of the photodiode chip 170. This structure may prevent light from being blocked by wiring and other components within the transistor layer 172 and logic chip 173, and may allow more light to enter each photodiode as compared with conventional image sensors. As will be discussed in more detail below, in some embodiments, the photodiode chip 170 and the transistor array chip 172 may be bonded together and then the connected chips may be bonded to the logic chip 173. In other embodiments, the transistor array chip 172 and the logic chip 173 may be bonded together and then the photodiode chip 170 may be bonded to the transistor array chip 172 to create the image sensor. These two embodiments will be discussed in more detail below.

Figure 20:
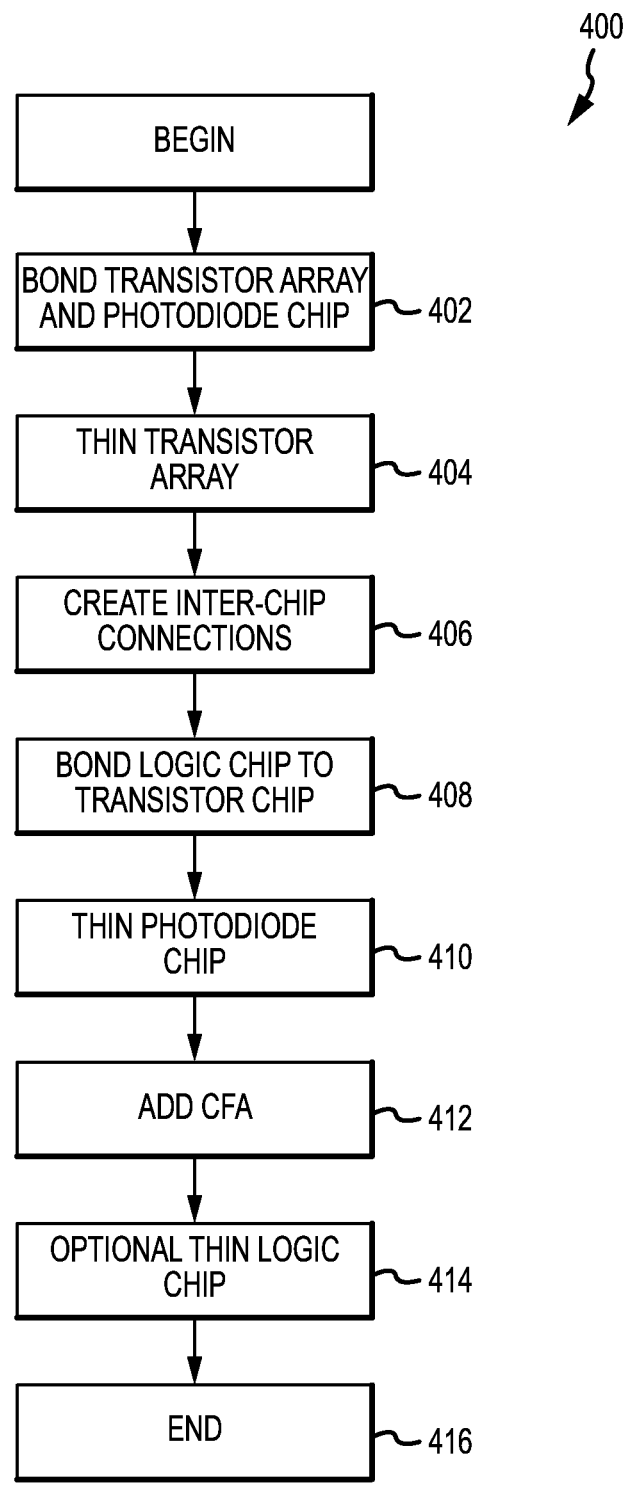
FIG. 20 is a flow chart illustrating a first example of a manufacturing process for the image sensor.

A first manufacturing process for creating the image sensor 130 will now be discussed in more detail. FIGS. 19A-19D illustrate the image sensor during various stages of manufacturing. FIG. 20 is a flow chart for one embodiment of a manufacturing process. With reference to FIGS. 19A and 20, the method 400 may begin with operation 402 and the transistor array chip 172 may be bonded to the photodiode chip 170. With reference to FIG. 19A, a metal and dielectric layer 350 may be positioned between the two chips 170, 172. The metal portions of the metal and dielectric layer 350 may connect the transistor array chip 172 with the vertical transfer gates 158 extending from the surface of the photodiode chip 172 (see FIG. 12B). The dielectric and metal layer may be positioned on top of the photodiode chip or the transistor array chip, or a portion of the layer may be positioned on both the chips prior to bonding.

In some embodiments, the photodiode chip 170 and the transistor array chip 172 may be bonded through a wafer bonding process. However, in other embodiments, the photodiode chip 170 and the transistor array chip 170 may be bonded together in a number of manners, such as, but not limited to, direct bonding, plasma activated bonding, eutectic bonding, and/or hybrid bonding.

In embodiments where the photodiode chip and the transistor array chip are bonded through a wafer bonding process, the two bonding surfaces (e.g., the surface of the transistor array and the photodiode chip that are to be connected together) may be smoothed. For example, a chemical mechanical polishing or planarization (CMP) process may be used to smooth the surfaces using a combination of chemical and mechanical forces.

In some embodiments, one or more metal layers on the photodiode chip 170, such one or more layers within the vertical transfer gate, may be exposed through oxide or the dielectric portions of the intermediate layer 350. For example, with reference to FIG. 19A, the intermediate layer 350 may include dielectric traces 366 spacing apart the metal or conductive traces 364. The metal traces 364 may form the portions of the transfer gates 158 as discussed above. The photodiode chip 170 and the transistor array chip 172 may then be aligned so that the transfer gates 158 extending from the photodiode chip 170 align with the corresponding locations on the transistor array 170. Once aligned, the two chips may be bonded as described above.

With continued reference to FIG. 19A, when the transistor array chip 172 and the photodiode chip 170 are initially connected together, the transistor array chip 172 may have a thickness T1 and the photodiode chip 170 may have a thickness T2. The two thicknesses T1 and T2 may be thicker than the final thickness for each chip, e.g., 4 or more microns.

With reference again to FIG. 20, after the two chips 170, 172 have been bonded or otherwise connected together, the method 400 may proceed to operation 404. In operation 404 the transistor array chip 172 may be thinned to reduce the thickness. For example, the transistor array chip 172 may be etched or ground to remove layers of the substrate or wafer. In one example, a selective etch process such as EPI wafers having a large doping contrast between the substrate and the EPI or silicon on insulator (SOI) wafers with silicon or buried oxide contrast may be used to control the etch amount and thus the final thickness of the chip. In other embodiments, the chip may be thinned through wafer grinding, polishing, and/or selective etch. With reference to FIG. 19B, after operation 404, the transistor array chip 172 may have a thickness T3. The thickness T3 may be smaller than the first thickness T1. For example, the first thickness may be larger than 500 microns, whereas the silicon thickness T3 after thinning may be about 3 microns. In some embodiments the transistor array chip 172 may have a final silicon thickness of approximately 1 to 5 microns.

Referring again to FIG. 20, after operation 404, the method 400 may proceed to operation 406. In operation 406, one or more inter-chip connections may be defined or otherwise created. For example, TSVs 354 may be have defined during the manufacturing of the transistor array chip 172, e.g., passageways may be defined through the chip 172, and during operation 406, the passageways may be filled with a conductive material. In these examples, because the transistor array chip 172 may be thinned prior to being connected to the logic chip 173, the inter-chip connections, such as the TSVs 354 may be smaller. This is because, generally, as a silicon substrate (such as the transistor array) increases in thickness, any TSVs may be increased in diameter to ensure a connection due to tapering of the via through the thickness of the silicon. Additionally, due to manufacturing techniques such as processing, etching, and the like, the thicker the silicon may be, the more difficult it can be to have a small diameter via. With the method 400, the image sensor 130 may have vias with a decreased diameter, although the original thickness of the transistor array substrate may be relatively thick.

As another example, one or more bond pads may be formed on a top surface of the transistor array chip 172. In some embodiments, the inter-chip connections may generally be defined in the transistor array chip 170, as the vertical gate structure 158 may form the inter-chip connection for the photodiode chip 170 and the transistor array chip 172. However, in other embodiments, the photodiode chip 170 may include one more TSVs or the like. In these examples, the TSVs may be created in the transistor array chip and the photodiode chip and then aligned together to create a continuous TSV.

After operation 406, the method 400 may proceed to operation 408. In operation 408 the logic chip 173 may be bonded or otherwise connected to the transistor array chip 172. The transistor array chip 172 and the logic chip 173 may be bonded together through a silicon wafer bonding process, such as, but not limited to, direct bonding, plasma activated bonding, adhesive bonding, thermo-compression bonding, reactive bonding, glass frit bonding, eutectic bonding, and/or anodic bonding. With reference to FIG. 19C, the transistor array chip 172 may be sandwiched between the logic chip 173 and the photodiode chip 170. The logic chip 173 may form the top end of the image sensor 130 stack with the photodiode chip 170 forming a bottom end. The three chips 170, 172, 173 may be in communication with each other and may include one more communication mechanisms to communication with other components (such as the processor 114) of the electronic device 110 or camera.

With reference again to FIG. 20, after the logic chip 173 has been bonded to the transistor array chip 172, the method 400 may proceed to operation 410. In operation 410 the photodiode chip 170 may be thinned. Similar to operation 404, in operation 410 the photodiode chip 170 may be etched or otherwise reduced in thickness. For example, with reference to FIG. 19D, after operation 410, the photodiode chip 170 may have a thickness T4. The thickness T4 may be smaller than the thickness T2. In some embodiments, the silicon thickness T4 may be smaller than 3 microns whereas the thickness T2 may be larger than 500 microns. In some embodiments, the photodiode chip 170 may have a final thickness of approximately 1 to 5 microns. However, the exact thickness of the photodiode chip 170 at any of the operations may be varied as desired.

The photodiode chip 170 may be thinned to allow better light capturing characteristics. For example, the photodiode 154 may have a depth between 2 to 3 microns within the silicon forming the photodiode chip. In instances where the photodiode chip silicon is too thick (much thicker than the thickness of the photodiode), light may be absorbed into the silicon before it reaches the photodiode. This absorption may decrease the quantum efficiency for the pixel, and may increase the cross-talk between adjacent pixels. However, if the silicon forming the photodiode chip is too thin, light may be able to pass through the photodiode, decreasing the quantum efficiently as well. Accordingly, in many instances, the photodiode chip may have a thickness that is relatively close to the thickness of the photodiode, but not so thin as to reduce the quantum efficiency.

In some embodiments, the logic chip 173 is bonded to the transistor array 172 in operation 408 prior to the photodiode chip 170 being thinned in operation 401. This allows the logic chip 173 (which may be thicker than the desired thickness of the photodiode chip) to function as a carrier wafer for the image sensor. That is, the photodiode chip 170 can be more easily thinned down when attached to a thicker substrate, the logic chip 173 in this example. This is because as the chip is thinned down, it may become more fragile and easier to break. However, when the chip is attached to a thicker carrier, the carrier provides support for the chip and allows it to be more easily handled. By utilizing the logic chip as a carrier chip, the photodiode chip 170 and the transistor array chip 172 may be thinned further than in instances where the photodiode chip 170 may be thinned prior to the transistor array chip being connected to the logic chip 173.

Referring again to FIG. 20, after operation 410 the method 400 may proceed to operation 412. In operation 412 a color filter array or color filter mosaic, such as a Bayer filter, may be added to the photodiode chip 170. With reference to FIG. 19D, the color filter array (CFA) 360 may be positioned on a backside of the photodiode chip 170 and may be positioned between the photodiodes 154 within the photodiode chip 170 and the light source (e.g., the CFA 360 may be positioned between the photodiodes and the lens 126). The CFA 360 may include a color scheme or positioning of color filters, but may generally be configured to filter light that reaches each pixel. Specifically, the CFA 360 may determine the light wavelengths that reach a particular photodiode 154 or group of photodiodes. It should be noted that the CFA 360 may be varied as desired, e.g., a blue, green, red filter may be used or a cyan, magenta, or the like may be used. Additionally, depending on the desired application for the image sensor 130, the CFA 360 may be omitted or only positioned on a portion of the photodiode chip 170.

After operation 412, the method 400 may proceed to optional operation 414. In operation 414 the logic chip 173 may be thinned. In some embodiments, the logic chip 173 may be thinned in a process similar to those used to thin the transistor array 172 and/or the photodiode chip 170. However, in other examples, the logic chip may be thinned or reduced in thickness in a variety of manners. For example, it may be desirable to create very thin image sensors 130 which may help reduce the thickness and size of the electronic device 100. After operation 414, the method 400 may proceed to an end state 416 and terminate.

In some embodiments, the image sensor 130 may further include one or more components stacked on top of the logic chip. For example, one or more memory chips, such as a dynamic random access memory (DRAM), may be stacked on the logic chip 173. In these embodiments, the logic chip may be thinned and the additional chips may then be bonded thereto.

Figure 21A:
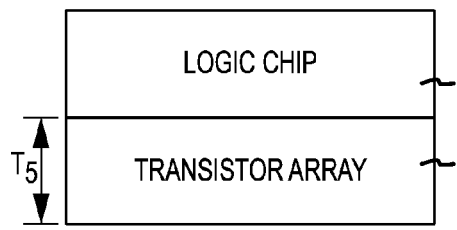
FIG. 21A is a simplified block diagram illustrating the transistor array chip and the logic chip after being operably connected together.
Figure 21B:
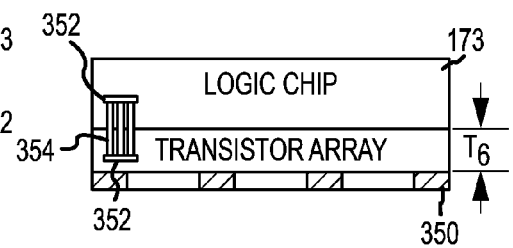
FIG. 21B is a simplified block diagram illustrating the logic chip and the transistor array chip operably connected together with the transistor array chip thinned down.

In another example, the image sensor 130 may be manufactured using a process where the transistor array chip and the logic chip are bonded together and then the photodiode chip may be bonded to the transistor array chip. FIGS. 21A-21E illustrate the image sensor during different stages of a second manufacturing embodiment. FIG. 22 is a flow chart illustrating a method for the second manufacturing embodiment. With reference to FIGS. 21A and 22, the method 500 may begin with operation 502 and the logic chip 173 may be bonded or otherwise connected to the transistor array chip 172. As described above with respect to FIG. 20, bonding the two chips may be done in a variety of manners. However, in some embodiments, the logic chip 173 and the transistor array chip 172 may be bonded together through a wafer bonding process. When a wafer bonding process is used, or as required by other bonding processes, the surfaces of the logic chip and the transistor array chip may be smoothed by a CMP process or other surface smoothing process.

With reference to FIG. 21A, when the transistor array 172 is first bonded to the logic chip 173, the transistor array chip 172 may have a thickness T5. In some embodiments, the thickness T5 may be larger than a thickness of the finally constructed image sensor. However, the increased thickness T5 may allow the transistor array chip 172 to be more easily handled during processing.

Once the logic chip 173 and the transistor array chip 172 are connected, the method 500 may proceed to operation 504. In operation 504 the transistor array chip 172 may be thinned or ground. For example, the transistor array chip 172 may be etched to remove excess substrate material until it has reached the desired thickness. With reference to FIG. 21B, after operation 504, the thickness of the transistor array chip 172 may be reduced to a thickness T6. The thickness T6 may be less than the original thickness T5 of the transistor array chip 172.

With reference again to FIG. 22, after operation 504, the method 500 may proceed to operation 506. In operation 506 inter-chip connections between the logic chip 173 and the transistor array chip 172 may be created. For example with reference to FIG. 21B, one or more TSVs 354 may be defined through the silicon substrate of the transistor array 172 and terminate in one or bond pads 352 (which may have previously been defined on the logic chip 173). The TSVs 354 may be defined through selective etching as the transitory array chip 172 is created, and in operation 506 may be filled with a conductive material. Alternatively, one or more etching or other processes may be used to define the TSVs 354 and then the TSVs may be filled during operation 506. In some embodiments, one more metal layers may be used as the inter-chip connection for the logic chip 173 and the transistor array chip 172. The metal layers or connections may be used instead of or in addition to the TSVs 354.

As described above, defining the inter-chip connections, such as the TSVs 354 after the substrate or chip has been thinned allows the TSVs 354 to have a reduced diameter. This may allow the TSVs 354 to take up less property or space on the transistor array chip 172, which may allow the transistor array chip 172 to be smaller and/or include more control circuitry or gates for the image sensor 130.

After operation 506, the method 500 may proceed to operation 508. In operation 508 the intermediate layer 350 may be positioned on the transistor array chip 172. For example, the transistor array chip 172 may include one or more dielectric portions and/or metal connection portions. The dielectric portions may be spaced between each of the metal connections to define distinct connection pathways.

Once the intermediate or connection layer 350 has been applied, the method 500 may proceed to operation 510. In operation 510, the transistor array chip 172 and the photodiode chip 170 may be bonded together. As with the method 400 in FIG. 20, the two chips may be bonded together in a number of manners; however, in one embodiment, the chips may be bonded with a wafer bonding process. Prior to bonding, the photodiode chip 170 and the transistor array chip 172 may be aligned so that the vertical transfer gates 158 may be aligned with the metal or conductive traces defined in the intermediate layer 350 on the transistor array 172. This allows the transfer gates 158 to be in communication with the control circuitry on the transistor array chip 172. Additionally, one or both of the surfaces of the chips may be smoothed prior to bonding.

Figure 21C:
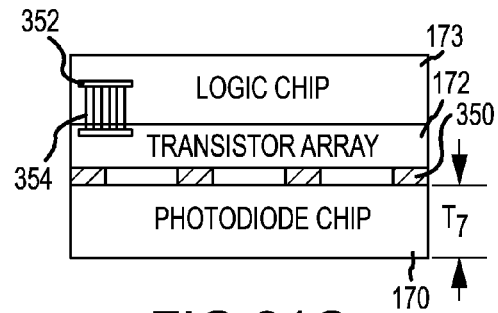
FIG. 21C is a simplified block diagram illustrating the logic chip and the transistor array chip operably connected to the photodiode chip.
Figure 22:
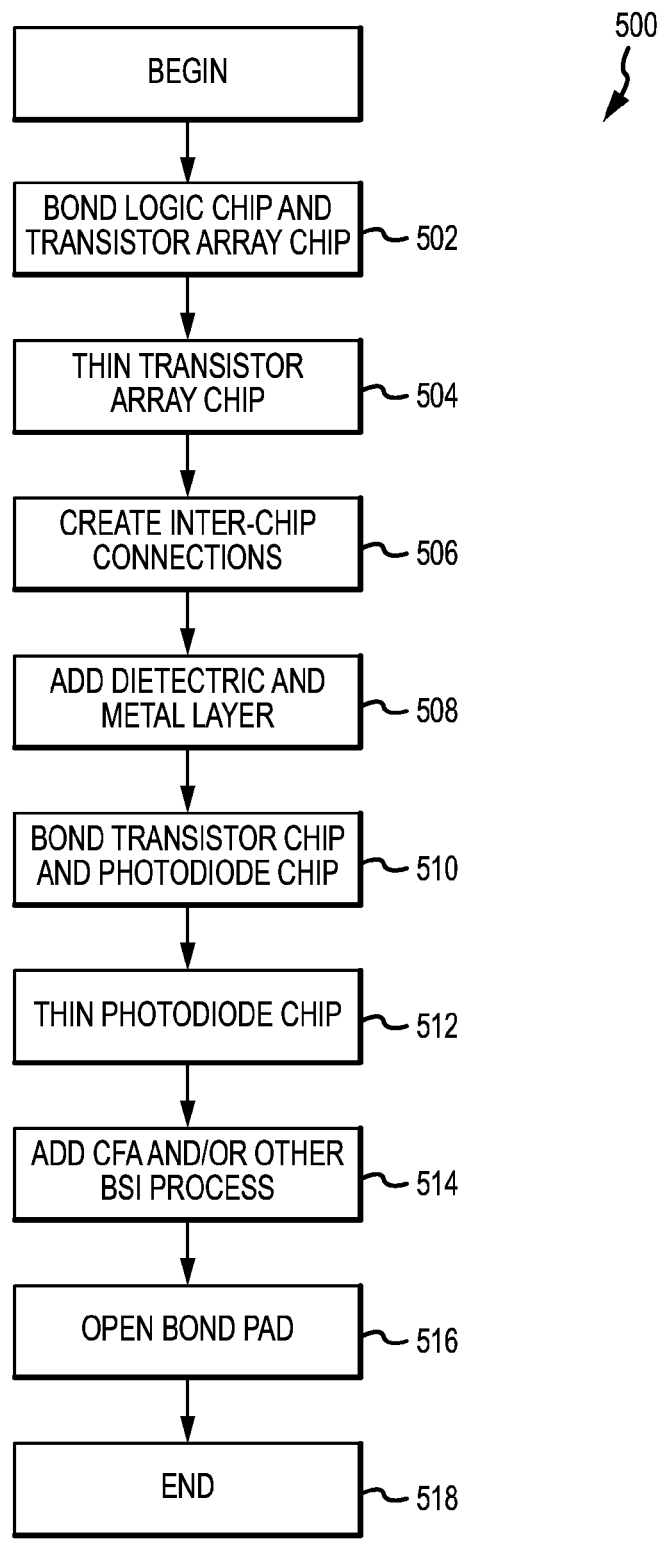
FIG. 22 is a flow chart illustrating a second example of a manufacturing process for the image sensor.

With reference to FIG. 21C when the photodiode chip 170 is connected to the transistor array chip 172 it may have a thickness T7. The thickness T7 may be thicker than the resulting thickness of the photodiode chip, but may allow for easier handling during the manufacturing process.

Figure 21D:
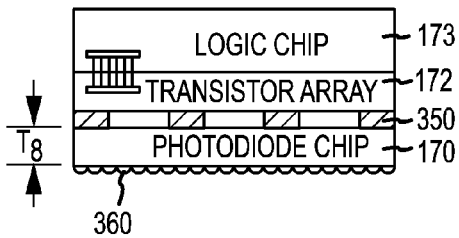
FIG. 21D is a simplified block diagram illustrating the logic chip, the transistor array chip, and the photodiode chip operably connected together with the photodiode chip thinned down.
Figure 21E:
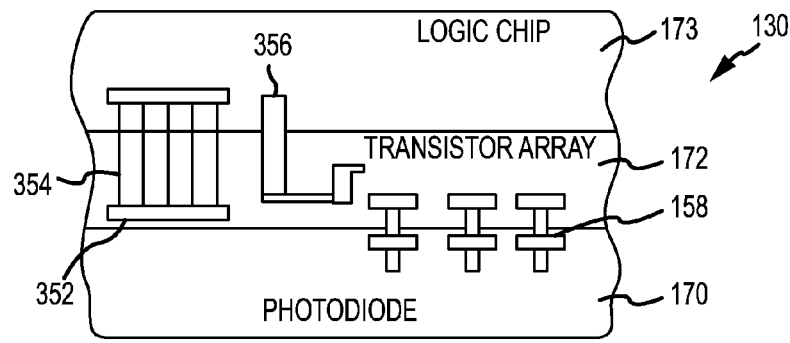
FIG. 21E is a simplified block diagram of the image sensor stack including the photodiode chip, the transistor array chip, and the logic chip.

After operation 510, the method 500 may proceed to operation 512. In operation 512 the photodiode chip 170 may be thinned. With reference to FIG. 21D, after operation 512, the photodiode chip 170 may have a thickness T7. The new silicon thickness T7 may be thin (e.g., 1 to 5 microns) to allow light to be absorbed by the photodiode. As briefly described above, in instances where the silicon of the photodiode chip is too thick, light entering the chip will be absorbed by the silicon prior to reaching the photodiode chip. The photodiode chip 170 may be thinned in a number of manners, such as grinding, CMP, and/or etching. In these embodiments, the transistor array chip and logic chip assembly may act as a carrier wafer for the photodiode chip. That is, the photodiode chip may be thinned down as the logic chip and transistor array chip may form a supporting substrate for the thinner material to allow the thickness to be reduced.

In some embodiments, after the photodiode chip 170 has been thinned one or more inter-chip connections may be defined. For example, one or more TSVs may be defined through the photodiode chip and may be in communication with the logic chip and/or transistor array. In some embodiments, these additional inter-chip connections may be defined on the edges or periphery of the photodiode chip 170, which may help to leave the center and/or majority of the space for the photodiodes and light collection. In one embodiment, the photodiode 1170 and/or transistor array chip 172 may include a metal or conductive tab that may protrude from an edge of the wafer or silicon substrate. One or more vias may extend from the logic chip to the metal tabs to communicatively couple the chips to the logic chip.

However, in many embodiments, the transfer gates 158 may form the connection of the photodiode chip 170 to the other chips and TSVs may be omitted from this chip. This may allow substantially the entire bottom surface of the photodiode chip 170 to be used for light collection and potentially light blocking elements (e.g., metal interconnects) may be omitted from the light absorption pathways in the photodiode chip.

With reference again to FIG. 22, after operation 512, the method 500 may proceed to operation 514. In operation 514 one or more CFAs may be added to the light absorbing surface of the photodiode chip 170. For example, with reference to 21D a CFA 360 having one or more wavelength filters (e.g., blue, green, red) may be added to the surface of the photodiode chip 170. The CFA 360 may selectively allow light having predetermined wavelengths to reach each of the photodiodes 154 defined within the photodiode chip 170. During this step additional backside illumination processes may be performed as well. These may include backside anti-reflective coating application, passivation, metal light shield application, micro-lens, bond pad opening, and the like.

After operation 514, the method 500 may proceed to operation 516. In operation 516 one or more of the bond pads 352 may be opened. For example, a photolithography and/or etch process may be used to open the bond pads 352. After operation 514 the method 500 may proceed to an end state 518 and terminate.

It should be noted that the methods 400, 500 illustrated in FIGS. 20 and 22 may be used in other instances where a vertical transfer gate is not used. For example, the image sensor 130 may be constructed with one or more TSVs and/or other inter-chip connection elements. In these examples, one more transfer gates may be defined on the photodiode chip but may be in communication with the control circuitry of the transistor array.

Figure 23A:
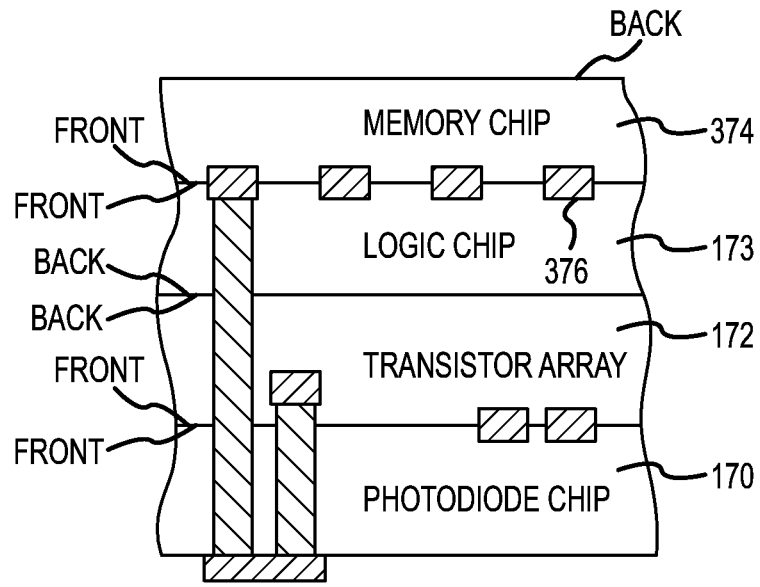
FIG. 23A is a simplified block diagram illustrating an image sensor including a four-chip stack.
Figure 23B:
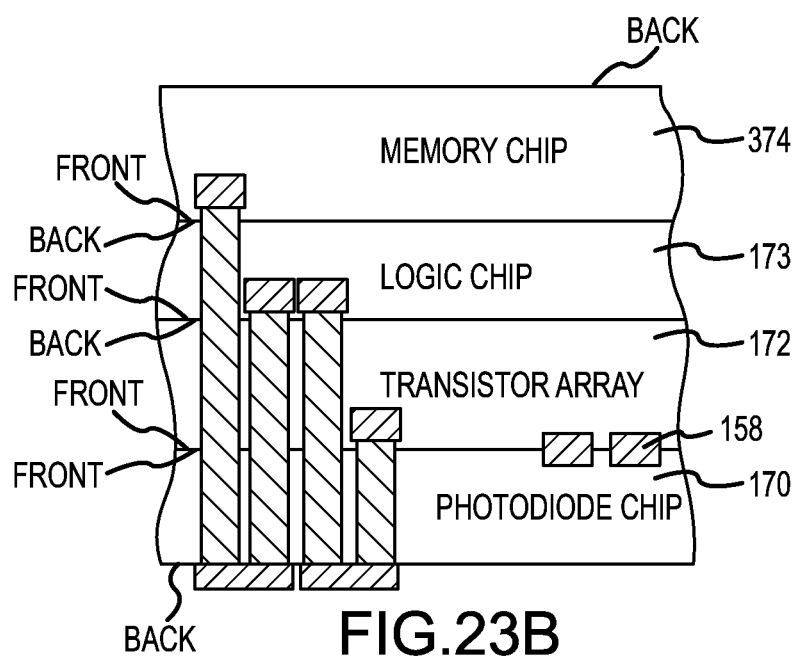
FIG. 23B is a simplified block diagram illustrating another example of an image sensor including a four-chip stack.

Additionally, although the methods 400, 500 have been discussed with respect to a three chip stack, additional chips may also be added. For example, in the method 400 after the logic chip has been thinned, another wafer may be bonded thereto, thinned and a fifth wafer stacked on top. FIGS. 23A and 23B illustrate two examples of a four-chip stack using the methods 400, 500 illustrated in FIGS. 20 and 22. As shown in FIGS. 23A and 23B, a memory chip 374 may be added on top of the logic chip 173.

In some embodiments, such as the embodiment illustrated in FIG. 23A, a TSV 354 may extend from the memory chip 374 to the photodiode chip 170 to connect with one or more metal connections 376 or other components of the memory chip 374. In this embodiment, another TSV 354 may extend from the transistor array chip 172 to the photodiode chip 170. The logic chip 173 and the memory chip 374 may be in communication with each other through one or more metal layers or connections 376.

In the embodiment illustrated in FIG. 23A, the memory chip 374 and the logic chip 173 may be stacked so that the front surface of each chip interfaces with the other. Similarly, the transistor array chip 172 and the photodiode chip 170 may be stacked so that their front surfaces interface with each other. In this example, the two back surfaces of the transistor array chip 172 and the logic chip 173 may interface with each other. Accordingly, in the embodiment illustrated in FIG. 23A, each chip may interface with a corresponding surface (either front or back) of the adjacent chip.

In other embodiments, such as the embodiment illustrated in FIG. 23B, one or more TSVs 354 may extend from the photodiode chip 170 to communicate with each of the chips. For example, the photodiode chip 170 may be in communication with the memory chip 374 (or other chip), the logic chip 173, and the transistor array chip 172.

In the embodiment illustrated in FIG. 23B, the logic chip 173 and the memory chip 374 may be stacked front to front and the transistor chip 172 and the photodiode chip 170 may also be stacked front to front. In other words, the front surface of the memory chip 374 interfaces with the front surface of the transistor chip 172 and the front surface of the photodiode chip 170 interfaces with the transistor array chip 172. In this example, the logic chip 173 and the transistor array chip 172 may be stacked such that a front surface of the logic chip 173 may interface with a back surface of the transistor array chip 172. However, many other examples are envisioned as well.

The methods 400, 500 of FIGS. 20 and 22 may allow each of the chips 170, 172, 173 to be optimized separately to include specialized functions to enhance the performance of each chip. Additionally, because the inter-chip connections, such as the TSVs, may be created after the chip has been thinned down, the TSVs or other connections may be easier to create and smaller in diameter.

Ring Gate and Triple Well

Figure 24A:
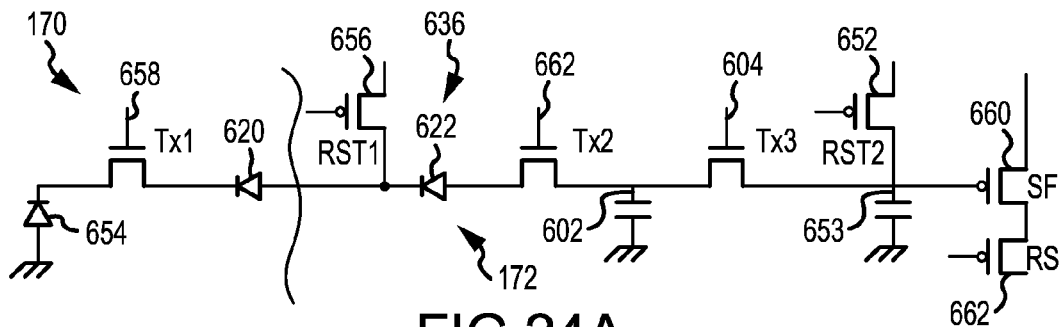
FIG. 24A is a simplified schematic view of a pixel circuitry including differently doped contacts for inter-chip connections.
Figure 24B:
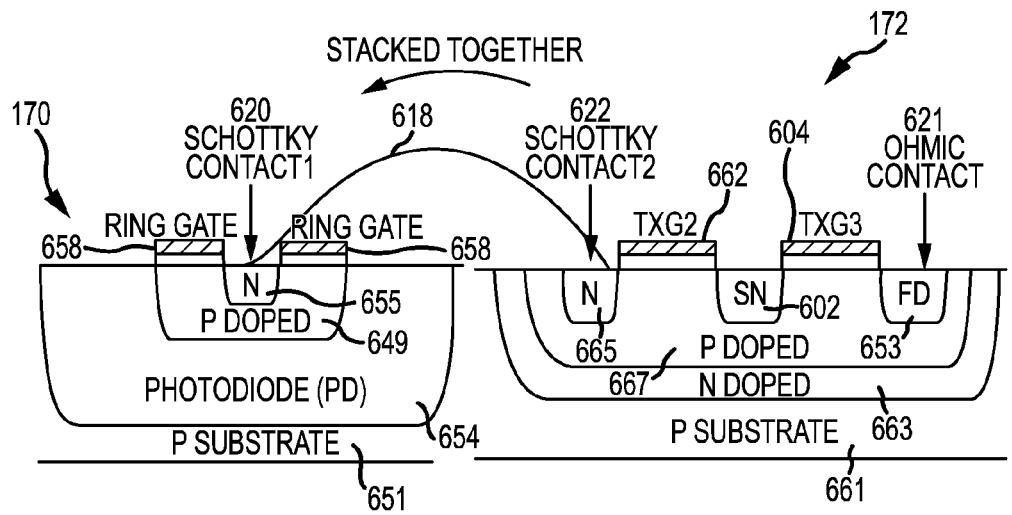
FIG. 24B is a simplified cross section of the photodiode chip and the transistor array chip of FIG. 24A illustrating first and second Schottky contacts and a ring gate structure.

In some embodiments, the image sensor may include a split chip design (e.g., photodiode chip and transistor chip) including a ring gate structure for communicating between the two gates. FIG. 24A is a simplified schematic view of a pixel circuitry including differently doped contacts for inter-chip connections. FIG. 24B is a simplified cross section diagram of the select portions of the photodiode chip and the transistor array chip illustrating the differently doped regions. With reference to FIGS. 24A and 24B, the image sensor may include one or contacts between the pixel chip 170 and the transistor array chip 172. During operation it is generally desirable to transfer all of the charge collected within the photodiodes to the transistor array chip with the least among of noise. Using ohmic contacts (e.g., heavily doped and deep charge pockets) may introduce some noise as these type of contacts may not be able to be fully depleted in the charge transfer and reset process (e.g., between integration and readout).

In the pixel circuitry embodiment in FIGS. 24A and 24B, Schottky or lightly doped contacts may be used for the connections between the pixel chip 170 and the transistor array chip 172. Specifically, the pixel circuit 636 may include a photodiode 654 in communication with a floating diffusion 653, SF gate 660, and row select gate 662. The photodiode 654 may be in selective communication with the floating diffusion 653 by a trigger transistor 658, a transfer transistor 662, and a storage node transistor 604. In embodiments where a global shutter operation may be desired, a storage node 602 may be positioned between the transfer transistor 662 and the storage node transistor 604. A first reset 656 may activate the trigger transistor 658 and a second reset 652 may activate the storage node transistor 662. In this embodiment, two Schottky contacts 620, 622 or Schottky diodes may be formed between the photodiode chip 170 and the transistor array chip 172.

The first Schottky contact 620 may include a triple well structure. For example, the Schottky contact may include a n-type doped drain 655 surrounded by a p-type doped channel region 649, which is surrounded by a n-doped photodiode source 654 positioned on top of a p-doped substrate 651. The n-type doped drain 655 may have a doping concentration ranging between $10^{14}$ to $10^{17}$ cm$^3$. The varying layers of n-type and p-type doping create a triple well and the contact at the n-doped region 655 may be surrounded by the p-type doped region 649 and another n-type doped region (the photodiode 654). In the embodiment illustrated in FIG. 24B, the contact 655 of the n-type region "floats" on top of the photodiode 654. The photodiode 654 forms a source for the ring gate 658 and is positioned on top of a substrate 651. Because the photodiode 654 may form substantially (if not all) of the bottom of the photodiode chip 170, the photodiode 654 may have a larger well capacity than conventional image sensors.

Figure 24C:
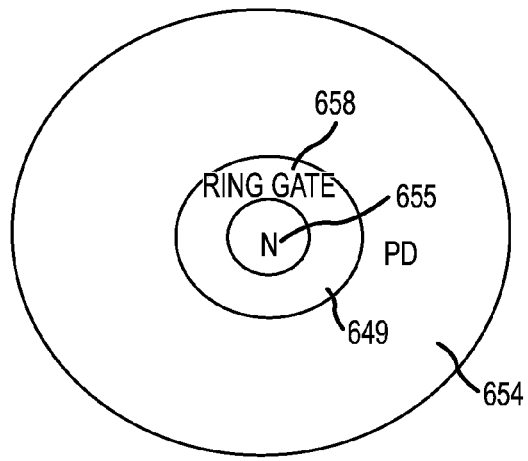
FIG. 24C is a top view of the photodiode chip of FIG. 24B.

FIG. 24C is a top view of the photodiode chip of FIG. 24B. As shown in FIG. 24C, the transfer gate 658 may be formed in a ring gate structure, such that the ring or transfer gate 658 may surround the contact 655 and be positioned. In other words, the ring gate 658 may form a circular ring around the n-doped drain 655.

The transistor array chip 172 may include the second Schottky contact 622, as well as the other transfer gates 662, 604, floating diffusion node 653, and the other read out components. The transistor array chip 172 may also include a triple well structure. For example, the second Schottky contact 622 may include a n-type source region positioned on top of a p-type doped well 667 region, which is incorporated into a n-type base 663 on top of a p-type substrate 661. Similarly, the floating diffusion node 653 and the storage node 602 may be formed as n-type doped regions within the p-doped well 667. The p-doped well 667 may surround each of the n-type doped regions and the n-type doped base 663 may surround the entire p-type doped well 667.

An inter-chip connection 618 (which may be metal or other conductor) may extend between the photodiode chip 170 and the transistor array chip 172 to communicatively connect to the first Schottky contact 620 and the second Schottky contact 622. For example, the inter-chip connection 618 may communicatively couple the drain 655 from the photodiode chip 170 with the source 665 of the transistor array chip 172. The inter-chip connection 618 may be a metal material such as molybdenum, platinum, chromium or tungsten, palladium silicide, or platinum silicide. The metal inter-chip connection 618 is in contact with both the Schottky contacts 620, 622 or Schottky diodes.

In operation, the ring gate 658 is deactivated during integration, allowing the photodiode 654 to collect light. Once the charge is to be transferred from the photodiode 645 (e.g., at the end of integration), the ring gate 658 may be activated, creating a gate channel allowing carriers from the photodiode 654 to travel laterally through the well 649 into the center of the ring gate 658, the drain region 655. Due to the triple well structure, at the beginning of integration, the Schottky contact 620 on top of the drain 655 is depleted with the void of charges. While the contact 620 is depleted, the n-type doped drain 655 (and the inter-chip connection 618) are shorted to the p-type doped well 649. However, because the well 649 is "floating" without any external connections, the short-circuit condition does not conduct a current. Thus, leaking current from the Schottky contact 620 is reduced or eliminated. Additionally, because the Schottky contact 620 is voided of charges at the beginning of charge transfer, charge eventually transferred from the photodiode 654 through the inter-chip connection 618 may be substantially free of noise.

Once the charge from the photodiode 654 reaches the drain 655, the charge is transferred through the inter-chip connection 618 to the transistor array chip 172, e.g., the second Schottky contact 622 on a first side of the transfer gate 662. Once the charge has been transferred to the transistor array chip 172, the transfer gates 662, 604 may be activated to transfer charge from the Schottky contact 622 to the storage node 602 and then to the floating diffusion node 653. The potential for the pixel may be set so that the charge flows from the first Schottky contact 620 to the second Schottky contact 622, and thus the second Schottky contact 622 may have a higher potential than the first Schottky contact 620.

Similarly to the photodiode chip 170, the triple well structure of the transistor array chip 172 may reduce charge leakage from the second Schottky contact 622. For example, at the beginning of charge transfer from the photodiode chip 170, the second Schottky contact 622 may be depleted, such that charges transferred into the source node 655 may be substantially free of noise. Additionally, because the p-type doped well 667 is "floating" on top of the n—type base 667 region, a short circuit will not conduct charge, reduce or eliminating charge leakage from the second Schottky contact. Because of the triple well structure in both the photodiode chip 170 and the transistor array chip 172, the charge transfer from the photodiode 654 to the floating diffusion may be completed without leakage from the Schottky contacts 620, 622 and with a reduced noise level as compared to image sensors having ohmic contacts for inter-chip pixel charge transfer.

It should be noted that in some embodiments, the floating diffusion node 653 may be an ohmic contact, whereas as the contacts between the photodiode chip and the transistor array chips are Schottky contacts 620, 622. Additionally, in the embodiment illustrated in FIGS. 24B and 24C, the drain and source regions of the Schottky contacts 620, 622 are formed as n-type doped regions, with the regions 655, 665 surrounded by a p-type doped well 649. However, in other embodiments, a hole-based photodiode may be used and the Schottky contacts 620, 622 may be formed of p-type doped regions surrounded by a n-type well.

Doping Contacts to Increase the Charge Transfer Efficiency

Figure 26:
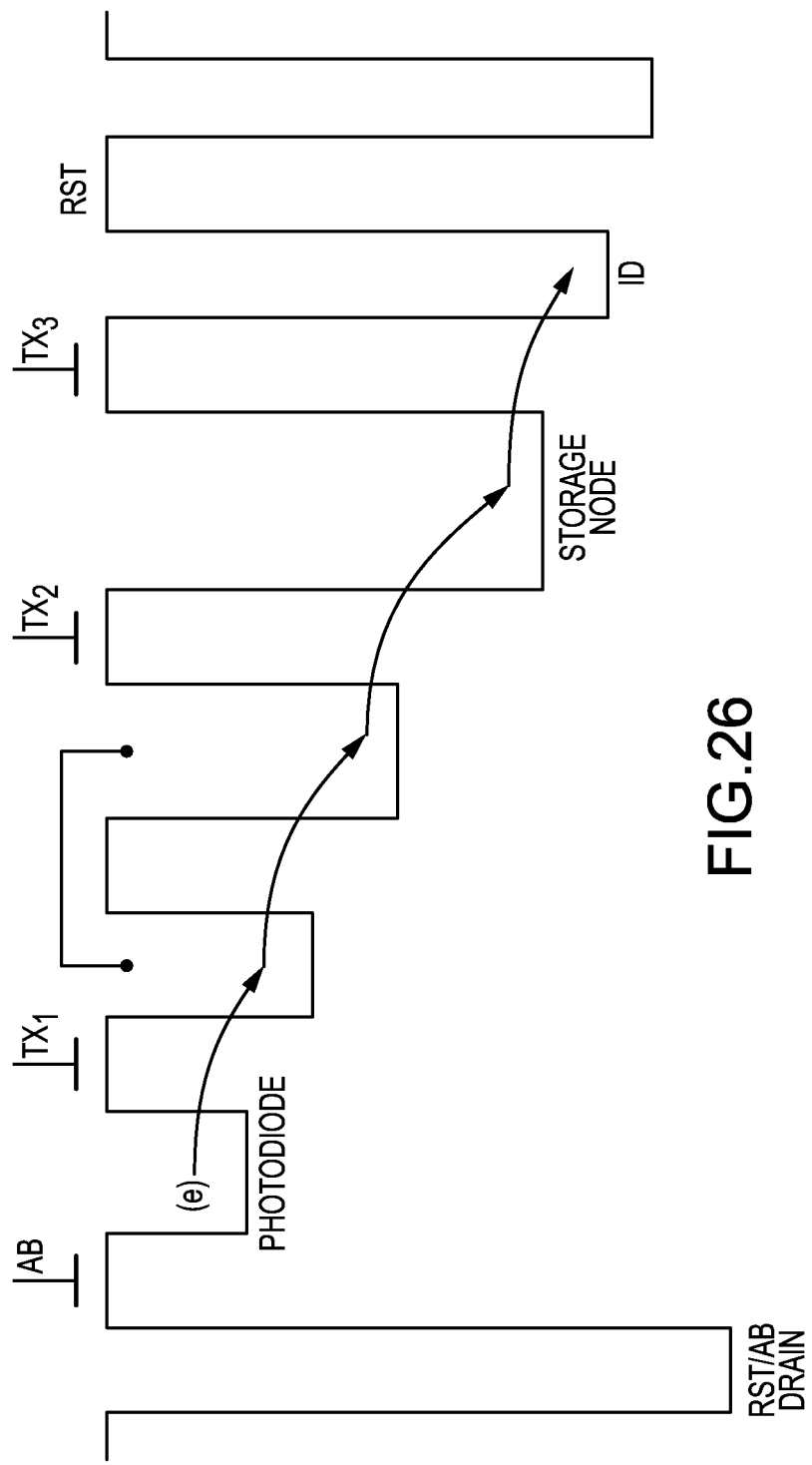
FIG. 26 is a potential diagram illustrating the potential increases across the pixel circuitry from the photodiode towards the floating diffusion node.

In some embodiments, in embodiments using ohmic contacts, the doping levels may be varied to increase the charge transfer percentage. FIG. 25A is a simplified schematic of a pixel circuitry including shallow doped regions for the inter-chip contacts. FIG. 25B is a simplified block diagram illustrating the doping scheme for the circuitry of FIG. 25A. FIG. 26 is a diagram of a potential profile for the pixel circuit illustrated in FIGS. 25A and 25B. With reference to FIGS. 25A-26, the image sensor may include shallow or low-depth doped regions within the silicon substrate of the chips 170, 172 to increase the charge transfer percentage.

In one embodiment, a first shallow doped region 670 may be formed at the source of the trigger transfer gate 658 and a second shallow doped region 672 may be formed at the drain of the transfer gate 662. Each of these shallow doped regions 670, 672 may have a depth D (see FIG. 25B) that may less than the depth of adjacent doped regions (e.g., the storage node or photodiode region). The doping concentration for the shallow doped regions 670, 672 may be relatively high (e.g., between $10^{16}$ cm$^{-3}$ to $10^{18}$ cm$^{-3}$). In other words, each of the shallow doped regions 670, 672 may be highly doped but have a thin thickness or depth. This combination, highly doped but shallow depth, may allow an ohmic contact between the photodiode and transistor array chips, while still providing a substantially complete charge transfer.

In some embodiments, the shallow doped regions 670, 672 may include a first doping type at the surface (e.g., n-type shallow doping area) and a second doping type (e.g., p-type) forming the well into the substrate. Because the depletion depth of the doped regions 670, 672 is controlled (as the regions are surrounded by an opposite type dopant) the shallow doped regions 670, 672 may be pinned, reducing dark current and other noise issues. In other words, the second doping type may form a pinning layer, preventing the depletion region from being expanded to the surface of the silicon layer, which may prevent a dark current from being generated. Additionally, changing the depth D of the shallow doped regions 670, 672, the doping concentration, and the node active region, a pinned potential may be selected as desired. In some embodiments, the doped regions 676, 672 may have a doping depth of approximately 0.01 microns to 0.2 microns and a concentration of $10^{18}$ cm$^{-3}$.

With reference to FIGS. 25A and 25B, the two shallow doped regions 670, 672 may connected together through an inter-chip connection 681. In these embodiments, the inter-chip connection 681 may be a ohmic contact such as silicides (TiSi2, CoSi2, NiSi, etc.). The ohmic contact may have a reduced potential carrier as compared to other types of contacts (e.g., Schottky contacts), which may allow for a reduced voltage to be used to activate the charge transfer.

In some embodiments, the pinning potentials for each node may increase from the photodiode 654 towards to the floating diffusion node 653 and the reset voltage. FIG. 26 is a potential diagram illustrating the potential increases across the pixel circuitry from the photodiode 654 towards the floating diffusion node 653. In other words, the doping concentration for each node (photodiode 654, first shallow doped region 670, second shallow doped region 672, storage node 602, floating diffusion node 653) may increase from the photodiode to the floating diffusion. Specifically, the first shallow doped region 670 may have a higher doping concentration than the photodiode 654, the second shallow doped region 672 may have a higher doping concentration than the first shallow region, the storage node 602 may have a higher doping concentration than the second shallow region, and the floating diffusion node 653 may have a higher doping concentration than the storage node 602. In this manner, the voltage depletion levels increases from the photodiode 654 towards the floating diffusion.

The increasing potential may allow the charge to float from the photodiode to the storage node (for global shutter operations) and then transfer the charge to the loading diffusion nodes (which may be n-type unpinned) for read out row by row. For example, electrons or charge carriers within the photodiode 654 may more easily travel into the increased doping regions (which have a higher potential), and thus may allow each node to be fully depleted. This is because as the adjacent wells have an increased potential, each subsequent node can accept more electrons, which may allow each well to be fully depleted before the next well or node reaches saturation.

The embodiment of the pixel circuitry for the image sensor illustrated in FIGS. 25A and 25B may allow the doping or transistor type on the photodiode chips 170 and the transistor array chip 172 to be substantially the same. As discussed above with respect to FIGS. 24A and 24B, the doping type for the transistors of the two chips may be varied. However, in the embodiments illustrated in FIGS. 25A and 25B, the substrates of each may be doped with the same doping type (e.g., either n or p type) and the transistors may be same type. For example, for electron based photodiodes, the photodiode chip 170 and the transistor array chip 172 may include n-type contacts and NMOS transistors may be used and for hole based photodiodes p-type contacts and PMOS transistors may be used. Using the same types of contacts and transistors for both the photodiode chip 170 and the transistor array chip 172 may provide for a less complicated manufacturing process for the image sensor.

In some embodiments, the charge transfer nodes between the photodiode 654 and the floating diffusion node 653 may remain at substantially the same states between a reset state (e.g., before charge transfer) and after the charge transfer. This is possible because the trigger transfer gate 658 and the transfer gate 662 may be positioned between the photodiode 654 and the storage node 602. This eliminates a contact (such as drain or source) of the transistors from being in the photodiode or storage node wells. In other words, the charge is transferred into and out of the storage node 602 through separated transfer gates and thus eliminating the contacts actually present in the storage node well. In other words, the drain or source of a transfer transistor may not be inserted into the well forming the storage node and/or photodiode. The n-type storage node 602 forms the drain of the gate 662 and the source of the gate 604. These gates may then be connected together through the n-type doped silicon, rather than a silicon-contact-metal-contact-silicon connection.

Light Shielding

As described above, the image sensor 130 may be configured to include storage nodes for each pixel to allow global shutter operations. In these embodiments, each pixel 136 may integrate or capture light at the same time, and the charge from the photodiodes may be stored in a storage node until the particular pixel row can be read out by the row select 144 and column select 140. While the charge from the photodiode is stored in the storage node, there is a possibility that light may enter into the storage node, which could create noise or other errors in the produced image. For example, in the stacked configuration illustrated in FIGS. 8 and 11, the image sensor 130 may receive light through a back-side of the photodiode chip 170 and the storage node (which may be on either the photodiode chip or the transistor array chip 172), may be exposed to potential light as enters the photodiode chip.

In some embodiments, the global charge storage nodes may be positioned on the transistor array chip 172 rather than the photodiode chip 170. In these embodiments, a light shielding layer (such as a metallic layer) may be positioned between the storage node and the photodiode chip 170. The shield or shielding layer may substantially prevent light leakage into the storage node, helping to reduce noise or other artifacts into the stored data (charge). Additionally, in some embodiments, the storage node may be separated from the photodiode by two or more gates, such as transistors. The two gates may electrically isolate the storage node from the photodiode, which may further reduce inadvertent or noise light transmission from reaching the storage node (e.g., in instances where the photodiode is receiving light, but not during integration, such as after the initial charge dump to the storage node).

Figure 26A:
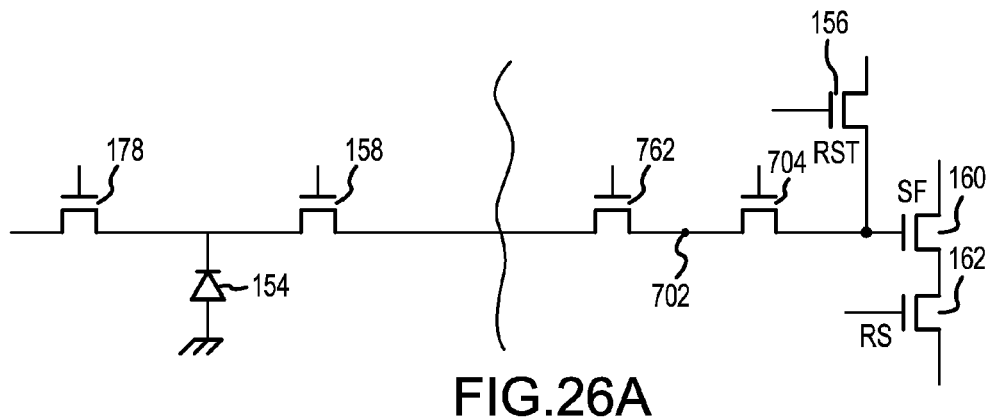
FIG. 26A is a simplified schematic view of a pixel circuitry including a storage node positioned on the transistor array chip.
Figure 26B:
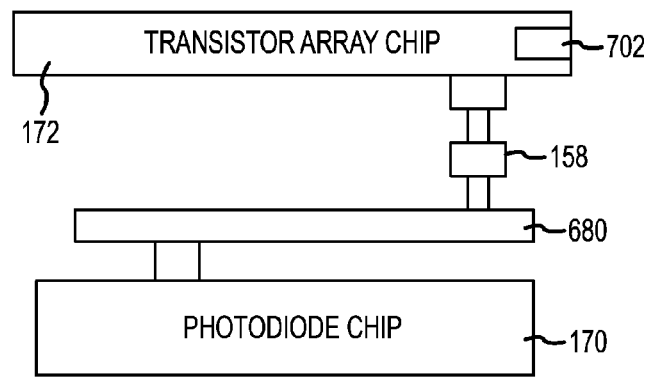
FIG. 26B is a diagram illustrating the photodiode chip stacked with the transistor array chip including a light shield.
Figure 26C:
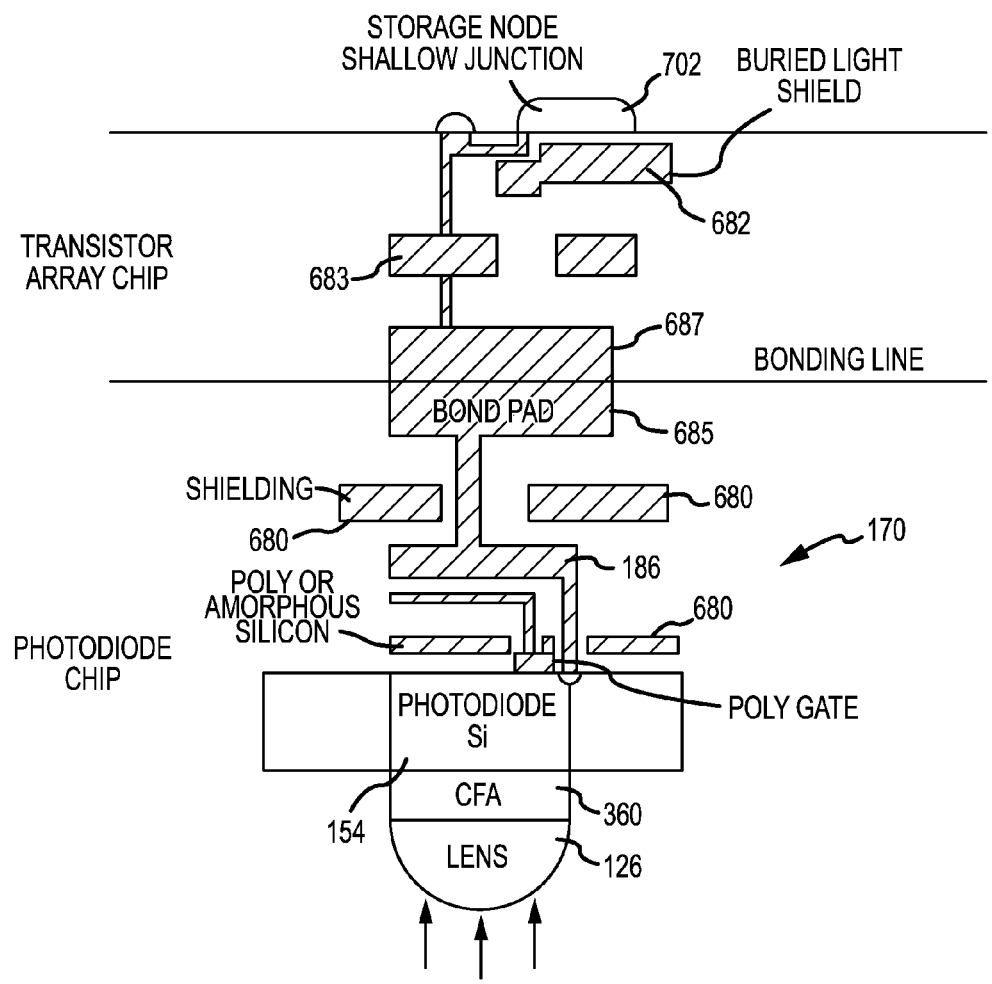
FIG. 26C is a diagram illustrating the photodiode chip stacked with the transistor array chip including a plurality of light shielding layers.

FIG. 26A is a simplified schematic view of a pixel circuitry including a storage node positioned on the transistor array chip. FIG. 26B is a block diagram view of the image sensor 130 illustrating the storage node on the transistor array chip. FIG. 26C is an enlarged cross-section view of the storage node. With reference to FIGS. 26A-26C, the photodiode chip 170 may include the photodiode 154, the anti-blooming gate 178, and the transfer gate 158. In instances where a global shutter is desired, the transistor array chip 172 may include a receiving transfer gate 762, a storage node 702, a storage node transfer gate 704, and the activating and reset circuitry (reset gate 156, SF 160, and row select 162). The storage node 702 receives the data or charge stored in the photodiode 154 when the transfer gate 158 and the receiving transfer gate 762 are open.

With reference to FIG. 26B, the storage node 702 may be optically separated from the photodiode chip 170 by a shield 680. The shield 680 may prevent light that enters into the photodiode chip 170 from contaminating or entering into the storage node 702. Specifically, the shield 680 may prevent photons, other than the charge stored within the photodiode 154, from entering into the storage node 702. FIG. 26C is a diagram illustrating the photodiode chip stacked with the transistor array chip. With reference to FIGS. 26B and 26C, the shield 680 may be one or more layers or sections of non-transparent material, such as metal or the like, and may be layered between the photodiode chip 1702 and the transistors array chip 172 (or just select areas of the transistor array chip 172). For example, the shield 680 may be staggered in multiple layers between the photodiode chip and the transistor chip. In some embodiments, the shield may form one or more portions of the dielectric layer discussed above with respect to FIGS. 19A-21E.

The shield 680 may also include a conductive material, such a metal, to assist in providing communication between the two chips 170, 172. For example, the shield 680 may form one or more of the metal layers of the vertical transfer gate 158 and/or inter-chip connection. Additionally, the shield 680 may include a single layer or may be include multiple segments distributed along a length of the image sensor 130 and a thickness of the inter-chip connection between the photodiode chip and the transistor array chip. At least one portion of the shield 680 may be positioned between the storage node 702 formed on the transistor array chip and the photodiode chip 170. This may substantially prevent light, such as light reflected internally within the photodiode chip that is not absorbed by the photodiode or other light noise, from entering in to the storage node 702.

In instances where the shield 680 is a metal material, the storage node 702 may be a photodiode without any transistor contacts received therein. These embodiments may help to reduce dark current in the storage node 702, which may be produced with metal contacts in silicon (e.g., the substrate of the transistor array 172). This is possible, as charge can enter into and be transferred out of the storage node 702 through the separated transfer gates 762, 704, which may reduce the dark current that could be created by the metallic elements of the shield in the silicon. The reduction in dark current is possible through eliminating a metal to silicon contact in the storage node (which can damage the silicon), as well as due to surface passivation (e.g., p+ implants for n-type storage nodes).

By blocking at least a portion of stray light from entering into the storage node 702, the shield 680 may help to reduce noise and other image artifacts from being introduced into an image during a global shutter operation. For example, during a global shutter operation, each of the pixels 136 in the image sensor 130 may integrate or collect light at substantially the same time. After integration, the vertical transfer gate 158 and the receiving transfer gate 762 may be activated to transfer the light from the photodiode 154 to the storage node 702. In this example, the charge may be transferred from the photodiode chip 170 to the transistor array chip 172 where it is stored in the storage node 702 until the select pixel row is ready to be ready out by the image processor. Because the storage node 702 is optically separated from the photodiode chip 170, photons that were not collected by the photodiode 154 during integration may be prevented from reaching the storage node 702.

In some embodiments, the shield 680 or portions of the shield may include a light absorptive or anti-reflective material and/or coating. For example, the shield 680 may be a metal material with a light absorptive coating layered on one or more surfaces. In other The absorptive coating may reduce light reflection within the photodiode chip 170, as well as absorb the reflective light. The absorptive material may further prevent light from becoming scattered within the photodiode chip 170. In these embodiments, cross-talk between pixels typically due to light reflecting from one photodiode and entering an adjacent photodiode, may be reduced. In some embodiments one or more portions of the shield may include a light absorptive material, whereas other portions of the shield may not include the light absorptive material.

With reference to FIG. 26C, in some embodiments, select portions of the metal interconnects, such as metal connection 186 and/or bond pads 685 of the vertical transfer gate 158 may include a light absorbing coating and/or anti-reflective coating that may further help to reduce light reflections within the photodiode and/or transistor array chip. Additionally, in some embodiments, one or more interconnects of the transistor array chip may include a light absorptive or anti-reflective coating. With reference to FIG. 26C, one or more bond pads 687 and/or metal connections 683 may include a light absorbing coating and/or anti-reflective coating. Additionally, the transistor array chip may also include one or more shields 682 that may further reduce light noise within the pixel chip stack. The shield 682 in the transistor array chip may be "buried" in the transistor array chip silicon to block light from being reflected in that chip.

Additionally, the two transfer gates (the vertical transfer gate 158 and the receiving transfer gate 762) control the charge into the storage node 702, the storage node 702 may be electrically isolated from the photodiode 154. The electrical isolation from the photodiode 154 may help to maintain the integrity of the charge stored in the storage node 702 from the integration time of the photodiode and prevent the storage node from receiving charge during non-integrating time periods (after integration but prior to read-out).

It should be noted that the positions of the shields and metal interconnects illustrated in FIGS. 26B and 26C are meant as illustrative only, and that many other embodiments are envisioned. By shielding light to the storage node, as well as absorbing light that may be internally reflected within the photodiode chip and/or transistor array chip the shield(s) may increase the shutter efficiency, as well as reduce noise in the captured signals. Additionally, although the embodiments of FIGS. 26B and 26C illustrate a combination of shielding structures, in some embodiments a single shield may be used. For example, a light shield may be buried on a top of the storage node of the pixel transistor chip and/or on the photodiodes. As another example, the metal interconnects and/or other elements within the chips may be coated with the anti-reflective and/or light absorbing material to reduce light reflection without the additional use of a shield. As yet another example, one or more light absorbing layers, such as amorphous silicon or polysilicon, may be positioned within the transistor array chip and/or photodiode chip, to filter (absorb) light. In one embodiment amorphous silicon may be positioned on top of the photodiode chip between the photodiode chip and the transistor array chip.

Increased Full Well Capacity

The full well capacity of photodiodes in image sensors generally determines the exposure time, and may also affect the signal to noise ratio and/or the dynamic range of the image sensor. In some embodiments, the full well capacity of the photodiodes in the image sensor may be dynamically adjusted to allow longer exposure times, reducing blooming artifacts in captured images, and to increase the dynamic range of the image sensor. In one embodiment, the image sensor may transfer charge from the photodiode to a storage node one or more times during integration (e.g., the exposure time frame). Transferring the charge during integration may allow the full well capacity of the photodiode to be increased beyond the hardware imposed well capacity. Additionally, because the full well capacity may be varied without changing the hardware of the image sensor, the full well capacity can be dynamically varied allowing the image sensor to adjust to different lighting conditions, image capturing settings (e.g., video or still photographs), as well as allow a user to adjust the exposure time as desired without increasing blooming artifacts.

Figure 27:
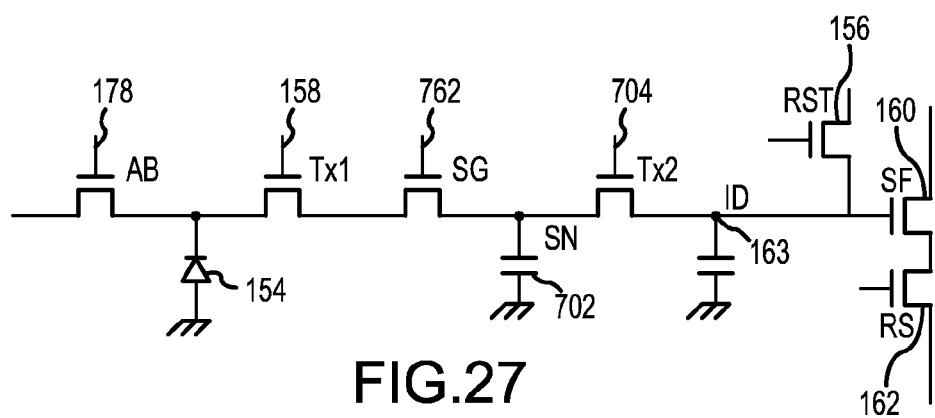
FIG. 27 illustrates an example schematic for a pixel of the image sensor having a dynamically adjustable full well capacity.

The embodiments described herein with respect to the adjustable full well capacity may be implemented using an image sensor having a vertical transfer gate or may be implemented in image sensors having a lateral vertical transfer gate. FIG. 27 illustrates an example schematic for a pixel of the image sensor 130 having a dynamically adjustable full well capacity. With reference to FIG. 27, the pixel may include one or more storage nodes 702 between the photodiode 154 and the floating diffusion node 163. The storage gate 762 and transfer gate 158 may be activated to transfer charge from the photodiode 154 to the storage node 702. The second transfer gate 704 may then be activated to transfer charge from the storage node 702 to the floating diffusion node 163. In some embodiments, the storage node 702 may be shielded from light by one or more shields 680 (e.g., as shown in FIGS. 26B and 26C), which will allow signals stored therein to be protected from internally reflected light and other sources of noise. Additionally, the storage node 702 may be electrically isolated from the photodiode 154 to further reduce noise in the signal.

It should be noted that the anti-blooming gate 178 may be omitted in certain embodiments, especially in rolling shutter implementations.

The storage node 702 may have an increased capacitance to accommodate multiple charge transfers from the photodiode 154. For example, the storage node 702 may be sufficiently large to accommodate double (or more) the capacity of the photodiode 154. This allows the storage node 702 to store charge from multiple charge transfers from the photodiode 154 as the integration time of the photodiode 154 is increased over the hardware implemented full well capacity.

Alternatively or additionally, the conversion gain for one or more pixels may be dynamically adjustable. Examples of adjustable conversion gains are illustrated in FIGS. 13, 14, and 15A and 15C and may be done using a pixel sharing implementation where one or more components of each pixel (e.g., floating diffusion nodes) may be shared between two or more pixels. For example, with reference to FIG. 13, each pixel 236a, 236b, 236c, 236d may be in selective communication with a plurality of floating diffusion nodes 288a, 288b, 228c, and 288d. Using a similar implementation, the storage node (not shown in the FIG. 13 implementation) may be placed into selective communication with the desired floating diffusion node, which may adjust the conversion gain for the pixel. For example, the first floating diffusion node 288a may be used in instances where there may be a single charge transfer during integration, the second floating diffusion node 288b may be used in instances where there may be two charge transfers during integration, the third floating diffusion node 288c may be used in instances where there may be third charge transfers during integration, and the fourth floating diffusion node 288d may be used in instances where there may be four charge transfers during integration. In this example, the node capacitance for each of the floating diffusion nodes may be increased from the first floating diffusion node to the fourth floating diffusion node. In other words, the fourth floating diffusion node 288d may have the highest capacitance, the third floating diffusion node 288c may have the second highest, the second floating diffusion node 288b may have the third highest, and the first floating diffusion node 288a may have the lowest. The variable capacitance allows the conversion gain to be adjusted to match the large charge accrued in the storage node from the multiple charge transfers.

Figure 15C:
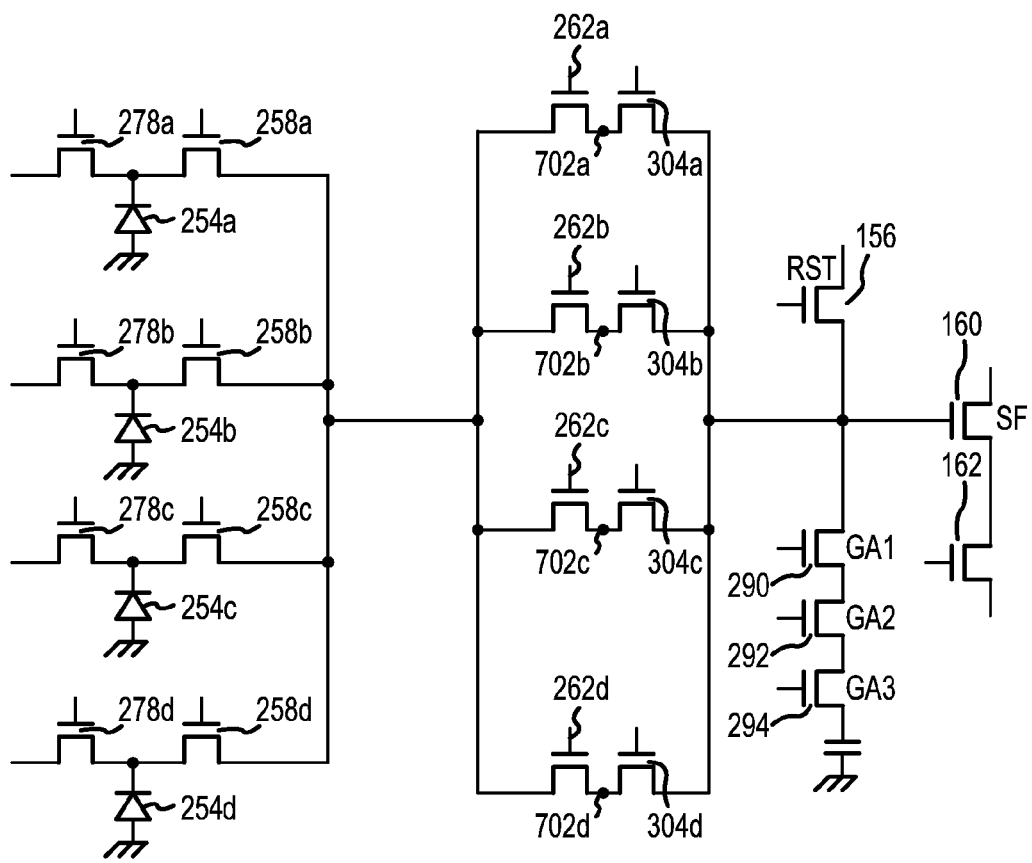
FIG. 15C illustrates another example of a shared pixel architecture including storage nodes for each pixel and an adjustable conversion gain.

With reference to FIG. 15C, in another example, each storage node 702a, 702b, 702c, and 702d may be in communication with a single floating diffusion node that may have an adjustable gain. For example, the floating diffusion node 163 may be coupled to one or more of the gain adjustment gates 290, 292, 294 to vary the conversion gain of the floating diffusion node. In these embodiments, the conversion gain of the floating diffusion may be dynamically adjusted to accommodate the additional charge stored in the storage nodes 702a, 702b, 702c, 702d from the one or more charge transfers from the photodiode 154 during integration.

Figure 28:
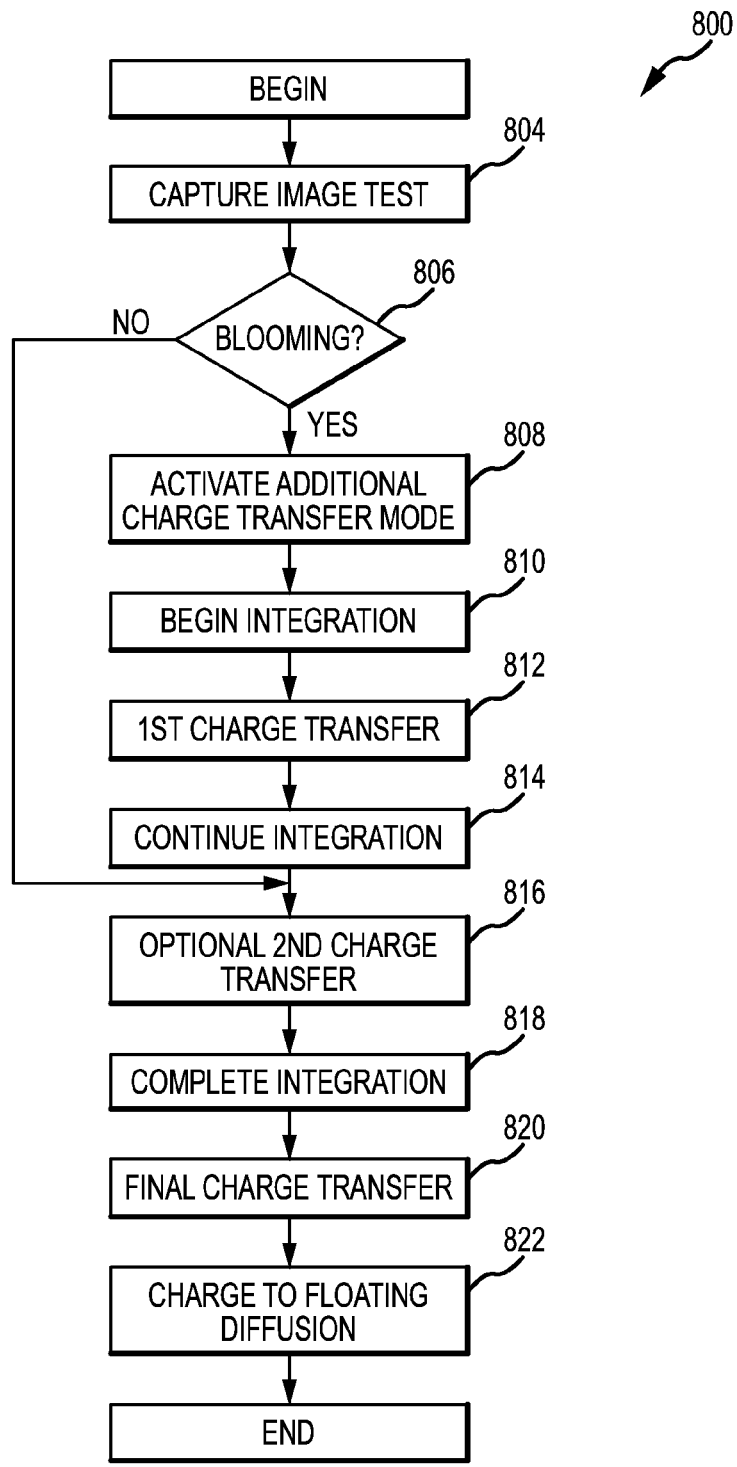
FIG. 28 is a flow chart illustrating a method for adjusting the full well capacity for one or more photodiodes of the image sensor.

A method of dynamically adjusting full well capacity of the photodiodes will now be discussed. FIG. 28 is a flow chart illustrating a method 800 for adjusting the full well capacity for one or more photodiodes of the image sensor. The method 800 may begin with operation 804 and the image sensor 130 may capture a test image. For example, the image sensor may capture an image of an object with a default or baseline full well capacity (e.g., a single charge transfer the end of integration). Once the test image has been captured, the method 800 may proceed to operation 806. In operation 806 the test image (or light signals from the photodiodes) may be evaluated by the processor 114 or by a user to determine if there are blooming artifacts (e.g., from a pixel exceeding its full well potential) in the image.

If the number of pixels that are blooming exceeds a predetermined threshold, the method 800 may proceed to operation 808 and the processor may vary the mode of the image sensor 130 to increase the full well potential of the select pixels and/or all of the pixels. For example, the transfer gates and storage gates for the select pixels (or all of the pixels in the pixel array) may be configured to be activated during the integration time of the photodiodes 154. Once the image sensor 130 mode has been activated, the method 300 may proceed to operation 810. In operation 810, the photodiodes 154 for the image sensor 130 may begin integration. In other words, the image sensor may begin exposure for the image.

While the photodiodes 154 are integrating, the method 800 may proceed to operation 812. In operation 812, the pixels that have been selected to have an extended full well capacity may dump their charge into the storage node 702. For example, with reference to FIG. 27, the transfer gate 158 and the storage gate 762 for each pixel may be activated to allow charge from the photodiode 154 to flow into the storage node 702. Once the charge from the photodiodes 154 has been transferred into the storage nodes 702, the transfer gate 158 and the storage gate 762 will be deactivated electrically isolating the storage node 702 from the photodiode 154.

After operation 812 and the first charge transfer has occurred, the method 800 may proceed to operation 814. In operation 814, the photodiodes 154 may continue to integrate. In other words, the exposure time for the image sensor 130 may continue, allowing the photodiodes to continue to collect light from the lens.

Depending on the desired full well capacity, during operation 814, the method 800 may proceed to operation 816. In operation 816 a second charge transfer may occur. As with the first charge transfer, the transfer gate 158 and the storage gate 762 may be activated to allow charge to flow from the photodiode 154 to the storage node 702. Once the second charge has been transferred, the method 800 may proceed to operation 818. In operation 818, the photodiode 154 may complete integration. For example, the predetermined exposure time may be reached.

After the exposure time has been reached, the method 800 may proceed to operation 820. In operation 820, the newly accumulated charge in the photodiode 154 may be transferred to the storage node 702 through the transfer gate and storage gate. The final charge transfer may transfer the charge in the photodiode from the reaming integration time.

Once the final charge transfer has taken place, the method 800 may proceed to operation 822. In operation 822, the second transfer gate 704 may be activated and the charge may transfer to the floating diffusion node 163. It should noted that in embodiments where the conversion gain is adjustable, the floating diffusion node or any gain adjustment gates for the floating diffusion node may be selected based on the number of charge transfers. For example, with reference to FIG. 15C, if two charge transfers have been completed during integration, the first and second gain adjustment gates 290, 292 may be activated so that capacitance of the floating diffusion node will be configured to handle the additional charge from the storage node. After the charge has been transferred to the floating diffusion node, the charge may be readout and the method 800 may terminate.

It should be noted that although the method 800 adjusts the full well capacity of the photodiodes based on one or more blooming pixels, the pixels may be adjusted for a variety of other reasons. For example, in some instances, a user may wish to have a longer exposure time for an image and depending on the amount of ambient light in the scene to be captured, additional well capacity may be desired. As another example, the image sensor may be configured to capture a video rather than a still image. In this example, the additional exposure time provided by the increased full well capacity may increase the maximum exposure time for the photodiodes at high light, which may allow for smoother videos. In other words, the photodiodes may not have to be read out multiple times during the length of the video, reducing the "choppiness" of the video as frames may more seamlessly flow together. As yet another example, in instances where the light in the captured scene may flicker (e.g., a bright light operating at 50 or 60 Hz), the longer exposure time may cover the entire lighting cycle, reducing waving artifacts that may occur in shorter exposure times.

In some embodiments, certain groups of pixels may transfer their charge multiple times throughout integration, whereas other groups of pixels may be transfer their charge only at the end of integration. For example, pixels having certain color filters (e.g., red, blue, green) may be set to have multiple charge transfers, especially in instances where a certain light wavelength may be dominate in a scene, which could cause pixels with those filters to bloom faster than other pixels.

CONCLUSION

The foregoing description has broad application. For example, while examples disclosed herein may focus on a vertical transfer gate, it should be appreciated that the concepts disclosed herein may equally apply to image sensors having a lateral transfer gate. As another example, although the structure of the vertical gate has been discussed with respect to a transfer gate, the vertical gate structure may be implemented for other gates, such as an anti-blooming gate. Similarly, although depth sensing system may be discussed with respect to image sensors, the devices and techniques disclosed herein are equally applicable to other types of sensors. Moreover, although row select gates are described with respect to the pixel architecture, the embodiments disclosed herein may be used in image sensor pixel architectures that do not include row select pixels, as well as other variations of pixel architecture. Accordingly, the discussion of any embodiment is meant only to be exemplary and is not intended to suggest that the scope of the disclosure, including the claims, is limited to these examples.

What is claimed is:

1. An image sensor for an electronic device, comprising:
   a photodiode chip comprising:
      at least one photodiode for receiving light;
      a transfer gate extending vertically from a top surface of the photodiode chip;
   a transistor array chip in communication with the photodiode chip and vertically stacked on the photodiode chip, the transistor array chip comprising:
      a floating diffusion node in communication with the at least one photodiode;

a reset gate in communication with the at least one photodiode;
a source follower gate in communication with the floating diffusion node; and
a row select gate in communication with the source follower gate and the floating diffusion node; and
a logic chip operably vertically stacked on the transistor array chip and in communication therewith; wherein
the transfer gate communicates data from the at least one photodiode to the transistor array chip and is connected to the transistor array chip, wherein the transfer gate comprises:
a semiconductor transfer channel;
an oxide layer surrounding an outer perimeter surface of the transfer channel;
a polysilicon layer at least partially surrounding an outer perimeter surface of the oxide layer; and
a metal layer in communication with the transfer channel, wherein the transfer channel extends vertically from the to surface of the photodiode chip and the metal layer communicatively connects the transfer gate to the transistor array chip; and
the logic chip selectively activates the vertical transfer gate, the reset gate, the source follower gate, and the row select gate.

2. The image sensor of claim 1, wherein the transfer gate extends from the top surface of the photodiode chip to a bottom surface of the transistor array chip.

3. The image sensor of claim 1, wherein the transfer channel is cylindrically shaped and is silicon.

4. The image sensor of claim 1, wherein the photodiode chip further comprises a storage transfer gate and a storage node.

5. The image sensor of claim 1, wherein the photodiode chip further comprises an anti-blooming gate.

6. The image sensor of claim 1, further comprising at least one through silicon via that extends through at least a portion of the transistor array chip and a portion of the logic chip.

7. The image sensor of claim 1, wherein the photodiode chip and the transistor array chip are vertically stacked such that a top surface of the photodiode chip faces a bottom surface of the transistor array chip.

8. The image sensor of claim 1, wherein the transfer gate includes a first contact and the transistor array chip includes a second contact, wherein the first contact of the transfer gate transfers data to the second contact of the transistor array chip.

9. A mobile electronic device, comprising:
a processor;
a display screen in communication with the processor;
a memory component in communication with the processor and the display screen; and
at least one image capture element in communication with the processor, the at least one image capture element comprising:
a lens; and
an image sensor in optical communication with the lens, the image sensor comprising a three-chip vertical stack including a control circuitry chip, a photodiode chip, and a logic chip, wherein
the photodiode chip includes one or more photodiodes; and
one or more transfer gates extending vertically between the photodiode chip and the control circuitry chip to couple the photodiode chip to the control circuitry chip, wherein at least one photodiode is in communication with a respective transfer gate and the transfer gate comprises:
a semiconductor transfer channel;
an oxide layer surrounding an outer perimeter surface of the transfer channel;
a polysilicon layer at least partially surrounding an outer perimeter surface of the oxide layer; and
a metal layer in communication with the transfer channel, wherein the transfer channel extends vertically from a top surface of the photodiode chip and the metal layer communicatively connects the transfer gate to the control circuitry chip.

10. The mobile electronic device of claim 9, wherein the transfer channel is cylindrically shaped and is silicon.

11. The mobile electronic device of claim 9, wherein the photodiode chip further comprises a storage transfer gate and a storage node.

12. The mobile electronic device of claim 9, wherein the at least one image capture element further comprises a first image capture element and a second image capture element.

13. An image sensor for an electronic device, comprising:
a photodiode chip defining a plurality of pixels, each pixel comprising:
a photodiode for receiving light;
a transfer gate extending vertically from a top surface of the photodiode chip;
a transistor array chip in communication with the photodiode chip and vertically stacked on the photodiode chip, the transistor array chip comprising:
a floating diffusion node in communication with the photodiode;
a reset gate in communication with the photodiode;
a source follower gate in communication with the floating diffusion node; and
a row select gate in communication with the source follower gate and the floating diffusion node; and
a logic chip operably vertically stacked on the transistor array chip and in communication therewith; wherein
the transfer gate communicates data from the photodiode to the transistor array chip and is connected to the transistor array chip, wherein the transfer gate comprises:
a semiconductor transfer channel;
an oxide layer surrounding an outer perimeter surface of the transfer channel;
a polysilicon layer at least partially surrounding an outer perimeter surface of the oxide layer; and
a metal layer in communication with the transfer channel, wherein the metal layer communicatively connects the transfer date to the transistor array chip; and
the logic chip selectively activates the vertical transfer gate, the reset gate, the source follower gate, and the row select gate.

14. The image sensor of claim 13, wherein the transfer gate extends from the top surface of the photodiode chip to a bottom surface of the transistor array chip.

* * * * *

UNITED STATES PATENT AND TRADEMARK OFFICE
CERTIFICATE OF CORRECTION

PATENT NO. : 8,773,562 B1
APPLICATION NO. : 13/756459
DATED : July 8, 2014
INVENTOR(S) : Xiaofeng Fan Page 1 of 1

It is certified that error appears in the above-identified patent and that said Letters Patent is hereby corrected as shown below:

In the Claims:

Claim 1, beginning at Column 40, line 58 - Column 41, line 25 should read:

1. An image sensor for an electronic device, comprising:
  a photodiode chip comprising:
  at least one photodiode for receiving light;
  a transfer gate extending vertically from a top surface of the photodiode chip;
  a transistor array chip in communication with the photodiode chip and vertically stacked on the photodiode chip, the transistor array chip comprising:
    a floating diffusion node in communication with the at least one photodiode;
    a reset gate in communication with the at least one photodiode;
    a source follower gate in communication with the floating diffusion node; and
    a row select gate in communication with the source follower gate and the floating diffusion node; and
    a logic chip operably vertically stacked on the transistor array chip and in communication therewith;
wherein the transfer gate communicates data from the at least one photodiode to the transistor array chip and is connected to the transistor array chip, wherein the transfer gate comprises:
  a semiconductor transfer channel;
  an oxide layer surrounding an outer perimeter surface of the transfer channel;
  a polysilicon layer at least partially surrounding an outer perimeter surface of the oxide layer; and
  a metal layer in communication with the transfer channel, wherein the transfer channel extends vertically from the "to" --top-- surface of the photodiode chip and the metal layer communicatively connects the transfer gate to the transistor array chip; and
  the logic chip selectively activates the vertical transfer gate, the reset gate, the source follower gate, and the row select gate.

Signed and Sealed this
Ninth Day of September, 2014

Michelle K. Lee
*Deputy Director of the United States Patent and Trademark Office*